United States Patent
Ishikawa et al.

(10) Patent No.: US 8,325,477 B2
(45) Date of Patent: Dec. 4, 2012

(54) VIBRATING DEVICE, JET FLOW GENERATING DEVICE, ELECTRONIC DEVICE, AND MANUFACTURING METHOD OF VIBRATING DEVICE

(75) Inventors: Hiroichi Ishikawa, Tokyo (JP);
Norikazu Nakayama, Saitama (JP);
Takuya Makino, Kanagawa (JP);
Tomoharu Mukasa, Saitama (JP);
Hiroyuki Ryoson, Kanagawa (JP)

(73) Assignee: Sony Corporation, Tokyo (JP)

( * ) Notice: Subject to any disclaimer, the term of this patent is extended or adjusted under 35 U.S.C. 154(b) by 747 days.

(21) Appl. No.: 11/911,179

(22) PCT Filed: Feb. 27, 2006

(86) PCT No.: PCT/JP2006/303612
§ 371 (c)(1),
(2), (4) Date: Dec. 5, 2008

(87) PCT Pub. No.: WO2006/114934
PCT Pub. Date: Nov. 2, 2006

(65) Prior Publication Data
US 2009/0086416 A1    Apr. 2, 2009

(30) Foreign Application Priority Data

Apr. 18, 2005 (JP) ................................. 2005-119809
Nov. 22, 2005 (JP) ................................. 2005-336603

(51) Int. Cl.
*G06F 1/20* (2006.01)

(52) U.S. Cl. ................. 361/679.48; 165/80.3; 417/410.1

(58) Field of Classification Search ............. 361/679.01, 361/679.46, 679.49, 694–697, 709; 165/80.3, 165/109.1, 121; 417/410.1
See application file for complete search history.

(56) References Cited

U.S. PATENT DOCUMENTS

| | | | |
|---|---|---|---|
| 6,252,769 B1 | 6/2001 | Tullstedt et al. | |
| 7,861,767 B2 * | 1/2011 | Mukasa | 165/80.3 |
| 2005/0121171 A1 * | 6/2005 | Mukasa et al. | 165/80.3 |

FOREIGN PATENT DOCUMENTS

| | | |
|---|---|---|
| JP | 58-191790 | 9/1983 |
| JP | 2-5997 | 1/1990 |

(Continued)

OTHER PUBLICATIONS

International Search Report dated Apr. 18, 2005.

(Continued)

*Primary Examiner* — Jinhee Lee
*Assistant Examiner* — Ingrid Wright
(74) *Attorney, Agent, or Firm* — SNR Denton US LLP

(57) ABSTRACT

Provided is a vibrating device which can generate efficient vibrations in a vibrating member and efficiently apply vibrations to a gas, a jet flow generating device in which the vibrating device has been implemented, and an electronic device in which the jet flow generating device has been implemented. A jet flow generating device 10 has a vibrating device 15 including a frame 4, and actuator 5 mounted on the frame 4, and a vibrating member 3 supported on the frame 4 by an elastic supporting member 6. The vibrating member 3 has a side plate 3b formed on the perimeter portion of a disc-shaped vibrating plate 3a, for example. Vibration of the vibrating member 3 applies vibrations to air within chambers 11a and 11b, whereby gas can alternatingly be blown from nozzles 2a and 2b.

19 Claims, 57 Drawing Sheets

| | FOREIGN PATENT DOCUMENTS | |
|---|---|---|
| JP | 03-116961 | 5/1991 |
| JP | 2000-223871 | 8/2000 |
| JP | 2000-254854 | 9/2000 |
| JP | 2002-134975 | 5/2002 |
| JP | 2002-257551 | 9/2002 |
| JP | 2002-532913 | 10/2002 |
| JP | 2003-009495 | 1/2003 |
| JP | 2004-328531 | 11/2004 |

OTHER PUBLICATIONS

Japanese Office Action issued on Aug. 16, 2006 in connection with counterpart JP Application No. 2005-336603.

Japanese Patent Office Action corresponding to Japanese Serial No. 2005-336603 dated Dec. 14, 2011.

* cited by examiner (B)

VIBRATING DEVICE, JET FLOW GENERATING DEVICE, ELECTRONIC DEVICE, AND MANUFACTURING METHOD OF VIBRATING DEVICE

TECHNICAL FIELD

The present invention relates to a vibrating device for causing vibrations in a jet flow of gas, a jet flow generating device in which the vibrating device is implemented, an electronic device in which the jet flow generating device is implemented, and a method for manufacturing the vibrating device.

BACKGROUND ART

There has been known a problem relating to increase in the amount of heat generated from heat sources in PCs (personal computers) such as ICs (Integrated Circuit), owing to the increase in performance of PCs. A known method for dissipating the heat involves bringing the IC in contact with radiating fins formed of a metal such as aluminum or the like, for example, so as to dissipate the heat from the IC by head conduction though the radiating fins. There is also a method known wherein a fan is used to forcibly displace warmed air within the PC housing and introduce the cooler ambient air, thereby dissipating heat. There is further a method known wherein both the radiating fins and fan are used together, whereby the area of contact between the heat source and the air is increased by way of the radiating fins, and the warmed air around the radiating fins is forcibly displaced by the fan.

However, with such forced convention of air with a fan, a thermal boundary layer occurs at the surface of the radiating fins on the downstream side, meaning there is a problem that heat cannot be efficiently conducted away from the radiating fins. One way to deal with this problem is to increase the airflow speed from the fan for example, so as to reduce the thickness of the thermal boundary layer. However, increasing the number of revolutions in order to increase the airflow speed leads to problems of noise from the fan bearings, noise due to wind roar, and so forth.

On the other hand, there is known a method wherein instead of a fan serving as a blower, a vibrating plate is used which cyclically performs reciprocal actions to disrupt the thermal boundary layer and efficiently release the heat from the radiating fins into the ambient atmosphere (e.g., see Patent Documents 1, 2, 3, 4). Of these, the devices in Patent Documents 3 and 4 in particular have a vibrating plate which generally divides a chamber into two spatially, an elastic member provided in the chamber so as to support the vibrating plate, and means for vibrating the vibrating plate. With such a device, when the vibrating plate is displaced upwards for example, the volume of the upper space in the chamber is reduced, so the pressure in the upper space rises. The upper space communicates with the ambient atmosphere via a vent, and accordingly a part of the air within the upper space is externally discharged. On the other hand, the volume of the lower space on the other side of the vibrating plate from the upper space increases, so the pressure in the lower space conversely drops. The lower space communicates with the ambient atmosphere via a vent, and accordingly a part of the air in the ambient atmosphere near the vent is drawn into the lower space due to the drop in pressure. Alternately, when the vibrating plate is displaced downwards for example, the volume of the upper space in the chamber increases, so the pressure in the upper space conversely drops. The upper space communicates with the ambient atmosphere via the vent, and accordingly a part of the air in the ambient atmosphere near the vent is drawn into the lower space due to the drop in pressure. The volume of the lower space on the other side of the vibrating plate from the upper space is reduced, so the pressure in the lower space rises. The lower space communicates with the ambient atmosphere via the vent, and accordingly a part of the air within the upper space is externally discharged. Driving of the vibrating plate is performed by electromagnetic driving, for example. Such reciprocal action of the vibrating plate cyclically repeats the action of the air within the chamber being discharged into the ambient atmosphere, and the action of air from the ambient atmosphere being sucked into the chamber. Blowing a pulsating flow of air inducted by such cyclical reciprocal actions of the vibrating plate on heat sources such as the radiating fins (heat sink) effectively disrupts the thermal boundary layer at the surface of the radiating fins, and consequently the radiating fins are effectively cooled.

Patent Document 1 Japanese Unexamined Patent Application Publication No. 2000-223871 (FIG. 2)
Patent Document 2 Japanese Unexamined Patent Application Publication No. 2000-114760 (FIG. 1)
Patent Document 3 Japanese Unexamined Patent Application Publication No. 2-213200 (FIGS. 1 and 3)
Patent Document 4 Japanese Unexamined Patent Application Publication No. 3-116961 (FIGS. 3 and 8)

DISCLOSURE OF INVENTION

However, in the event that the amount of heat generated from the heat source is great, a device with even higher cooling capabilities, i.e., capable of blowing greater amounts of gas. Particularly, the amount of heat generated by CPUs (Central Processing Unit) is increasing yearly, and CPUs need to be efficiently cooled. On the other hand, while the amount of gas blown by the device can be increased by increasing the amplitude of the vibrating plate, this not only generates flexing of the vibrating plate such that the gas cannot be effectively vibrated, but also can be the source of excessive noise.

In light of the above situation, it is an object of the present invention to provide a vibrating device wherein effective vibrations are generated in a vibrating member, whereby vibrations can be provided to gas in an effective manner, a jet flow generating device including the vibrating device, and an electronic device including the jet flow generating device.

It is another object of the present invention to provide a vibrating device, a jet flow generating device, and so forth, wherein reduction in thickness or reduction in size can be realized.

In order to achieve the above objects, a vibrating device according to the present invention is a vibrating device configured to vibrate gas included in a housing so as to discharge the gas via an opening included in the housing as a pulsating flow, comprising: a frame; a vibrating member including a vibrating plate having a face generally perpendicular to a vibrating direction, supported by the frame so as to be vibrated; and a driving unit configured to drive the vibrating member.

As for the driving method of the driving unit, electromagnetic operations, piezoelectric operations, or electrostatic operations, for example, can be used.

An example of the gas is air, but the gas is not restricted to this, and may be nitrogen, helium gas, argon gas, or other gasses.

With the present invention, the vibrating member includes a side plate provided on the vibrating plate. Accordingly, the rigidity of the vibrating member increases, and flexion of the vibrating plate can be controlled to efficiently apply vibrations to the gas. Also, the rigidity is achieved not be making the vibrating plate itself highly rigid by forming a side plate, thereby achieving overall high rigidity, and accordingly the weight of the vibrating member is not heavy.

The side plate may be provided generally perpendicular to the face of the vibrating plate as described later, but does not need to be perpendicular. The side plate just should be provided continuously or intermittently in contact with the vibrating plate, for example. That is to say, in an intermittent case, multiple side plates are provided. The side plate can be provided at the perimeter of the vibrating plate, or closer inwards therefrom.

With the present invention, the vibrating member includes a hole in the side plate. Accordingly, the weight of the vibrating member can be reduced while maintaining the rigidity of the vibrating member. Thus, reduction in electric power consumption can be achieved.

With the present invention, the vibrating member includes a rib member connected to between the vibrating plate and the side plate. Thus, the rigidity of the vibrating member can be increased.

With the present invention, the vibrating member includes a hole in the rib member. Accordingly, the weight of the vibrating member can be reduced while maintaining the rigidity of the vibrating member.

With the present invention, the vibrating member is made up of a resin, paper, or metal. Particularly, forming the vibrating member of paper realizes marked reduction in weight. Even if the weight is reduced, the vibrating member has the side plate and is rigid, so there is no problem.

With the present invention, the face is made up of a circle, an ellipse, a polygon, or an angle round shape, for example. An angle round shape is a shape of a region defined by straight lines and curves, an example being a polygon with rounded corners.

With the present invention, the side plate is installed upright at one side in the vibrating direction of the vibrating plate; and the driving unit includes an actuator configured to vibrate the vibrating member, which is disposed at the one side. Thus, the actuator is disposed so as to be surrounded by the vibrating plate, so the vibrating device can be reduced in thickness.

With the present invention, the vibrating plate is made up of a cone shape of which the diameter spreads gradually towards one side of the vibrating direction of the vibrating plate; and the driving unit includes an actuator configured to vibrate the vibrating member, which is disposed at the one side. Thus, the actuator is placed on the inner side of the cone shape, so the thickness of the vibrating device can be reduced. In this case, the vibrating including a side plate which is installed upright towards the opposite side of the one side contributes to reduction in thickness of the vibrating device as compared to being erected on the one side.

With the present invention, the frame supports the side plate in a slidable manner. Thus, the presence of the side plane enables the frame to be configured as if it were a cylinder, and the vibrating member a piston. Also, having the side plate in sliding contact with the frame suppresses sideways rocking of the vibrating member and so forth, thereby enabling stable vibrations. For example, surface finishing can be applied to the contact portions of the frame and side plate, so as to enable sliding.

With the present invention, the frame supports the side plate in a slidable manner using a gap provided between the frame and the side plate, or a lubricating agent. Thus, the vibrating member can vibrate smoothly.

With the present invention, the vibrating member comprises: an edge portion of the vibrating plate supported by the frame in a slidable manner; and a protruding portion protruding from the side plate, supported by the frame in a slidable manner. Thus, friction resistance can be reduced as compared with a case wherein the entire side plate is in contact with the frame, thereby reducing electric power consumption, and also suppressing noise.

With the present invention, the vibrating device further comprises: a first elastic supporting member configured to support the vibrating member, which is disposed between the frame and the side plate so as not to circulate the gas from one side of the vibrating direction of the vibrating plate to the opposite side thereof; and a second elastic supporting member configured to support the vibrating member, which is disposed between the frame and the side plate so as to be arrayed in a line with the first elastic supporting member generally in the vibrating direction. Having the side wall thus supported by first and second elastic supporting members thus arrayed in the direction of vibration prevents side rocking of the vibrating member and allows stable vibrations to be obtained. The second elastic supporting member may or may not have functions to prevent gas from flowing from one side of the vibration direction of the vibrating plate to the opposite side thereof.

Particularly, it is sufficient for the side plate to comprise: a first end portion to which the first elastic supporting member is connected; and a second end portion to which the second elastic supporting member is connected, which is provided at the opposite side of the first end portion in the vibrating direction. That is to say, if the distance between the first and second elastic supporting members is made to be as great as possible, more stable vibrations can be obtained.

With the present invention, the second elastic supporting member is made up of a plurality of plate springs. Or a plurality of wires. Configuring the second elastic supporting member with such relatively slender members enables resistance to the intended reciprocal action in the vibration direction to be reduced, while preventing side rocking of the vibrating member.

With the present invention, the first and second elastic supporting members are made up of the same material. The first and second elastic supporting members may be of not only the same material, but of approximately the same shape.

With the present invention, the vibrating device further comprises: a bellows-shaped first elastic supporting member configured to support the vibrating member, which is disposed between the frame and the vibrating member so as not to circulate the gas from one side of the vibrating direction of the vibrating plate to the opposite side thereof. The bellows-shaped elastic supporting member may have a plurality each of peak portions and trough portions.

With the present invention, the vibrating member includes a side plate to which the first elastic supporting member is connected, which is provided in the vibrating plate; and wherein the vibrating device further comprises a bellows-shaped second elastic supporting member configured to support the vibrating member, which is disposed between the frame and the vibrating member so as to be arrayed in a line with the first elastic supporting member in the vibrating direction, and also so as to become a generally symmetrical shape in the vibrating direction of the vibrating member. Particularly, in the event that the elastic supporting members are bellows-shaped, and the peak portions and peak portions of the elastic supporting members face one another, and the trough portions and the trough portions face one another, i.e., are not symmetrically shaped, the amplitude of both sides of the vibrating member as viewed from a neutral point differ, and efficient vibrations might not be obtained. That is to say, disposing the elastic supporting members in a symmetrical shape means that the amplitude of both sides of the vibrating member as viewed from a neutral point when the vibrating member is not vibrating is the same, whereby efficient vibrations can be obtained.

With the present invention, the first elastic supporting member comprises: one trough portion disposed at the vibrating member side; and one peak portion disposed at the frame side; and wherein the driving unit includes an actuator configured to vibrate the vibrating member, and a feeder line connected to the actuator so as to pass through the air near the first elastic supporting member. The first elastic supporting member has smaller amplitude at the frame side which is the outer side, and greater amplitude at the vibrating member side which is the inner side. Accordingly, placement of the trough portion at the vibrating member side with amplitude is great widens the space where the feeder line moves along with vibrations, i.e., degree of freedom of movement of the feeder line improves, and line breakage can be prevented.

With the present invention, the area of the face of the vibrating plate is not greater than 70% of the area of a portion surrounded by places where the first elastic supporting member is in contact with the frame, which is a portion within a face generally in parallel with the face of the vibrating plate. In the event that this exceeds 70%, resistance of vibrations of the vibrating member increases, and noise may increase. Preferably, 60% or lower is desirable.

With the present invention, the vibrating member is made up of the same material as the vibrating plate, and includes an elastic supporting portion configured to support the vibrating plate by being implemented in the frame, which is the circumference of the vibrating plate. Integrally molding the elastic supporting member with the vibrating member facilitates manufacturing of the vibrating member.

With the present invention, the driving unit comprises: a magnet; a bobbin including an air communication opening configured to circulate the gas, which is mounted on the vibrating member, and also is provided so as to surround the magnet; and a coil wound on the bobbin. That is to say, the driving unit has a voice coil. With the present invention, the volume of space between the bobbin and magnet changes by the bobbin moving. In the event that the bobbin has no air communication opening, the pressure change of the space within the bobbin becomes vibration resistance. However, according to the present invention, the gas within the inner space escapes to the outer side of the bobbin via the air communication opening, so efficient vibration can be realized.

With the present invention, the vibrating plate includes a hole portion generally at the center thereof, which penetrates in the vibrating direction; and wherein the driving unit includes a coil implemented in the hole portion, a plate-shaped yoke disposed around the hole portion so as to surround the coil, and at least two magnets provided so as to sandwich the yoke. According to such a configuration, a relatively large magnet can be used. Accordingly, the magnetic force can be increase, and larger vibrations can be obtained. Taking into consideration the effects thereof, the vibrating plate may have a hole portion penetrating in the vibration direction at approximately the center thereof, and the driving unit may include a coil mounted in said hole portion, a plate-shaped yoke disposed nearby the hole so as to be surrounded by the coil, and at least two magnets provided so as to sandwich the yoke.

With the present invention, the driving unit includes an actuator having a magnet of which residual magnetic flux density is 0.3 through 3.0 T. The reason while 0.3 T or greater is stated is to obtain a desire magnetic flux density even in cases wherein the vibrating device is reduced in size, and the magnet is also reduced in size, for example. Also, this is because 3.0 T or higher is expensive. For example, the magnet is a neodymium magnet.

With the present invention, the driving unit includes a terminal block mounted on the frame, an actuator employing electromagnetic drive which includes a coil, and a feeder line connected to between the terminal block and the coil. Due to the frame having a terminal block, line breakage is prevented, and also wiring is facilitated at the time of manufacturing the jet flow generating device in which to include the vibrating device.

With the present invention, the minimum bending radius of the feeder line is generally five times of the thickness of the feeder line. Thus, line breakage of the feeder line due to vibrations of the vibrating member can be prevented. In the event that this is smaller than five times, stress is concentrated at the bending portion, and line breakage readily occurs. "Minimum bending radius" is the bending radius of the portion of the feeder line where the bending radius is the smallest.

With the present invention, the feeder line is subjected to braiding. Thus, line breakage can be prevented. For such feeder lines, robot cables or the like, for example, are used.

With the present invention, the actuator is disposed at one side in the vibrating direction of the vibrating plate, and the feeder line extends at the opposite side of the one side of the vibrating plate. In the case of a feeder line having a bending radius as described above, wiring as with the present invention enables wiring with a gentle curve. Also, only chamber space is on the other side of the actuator, yielding the advantage that wiring is easy.

With the present invention, the vibrating member includes a side plate having a through hole; and the vibrating device further includes a first elastic supporting member configured to support the vibrating member, which is disposed between the frame and the side plate so as not to circulate the gas from one side of the vibrating direction of the vibrating plate to the opposite side thereof, and a second elastic supporting member configured to support the vibrating member, which is disposed between the frame and the side plate so as to be arrayed in a line with the first elastic supporting member generally in the vibrating direction; wherein the feeder line is disposed so as to be inserted into the through hole, and also so as to be passed through between the first and second elastic supporting members. Thus, reduction in thickness can be realized.

With the present invention, the thickness of the feeder line is not less than 0.4 mm. Thus, line breakage can be prevented. While there is no upper limit in the thickness of the feeder line from the perspective of preventing line breakage, this is a sensible range corresponding to the size of the vibrating device. For example, this is an upper limit of 3 mm or less, or 5 mm or less.

With the present invention, the cross section perpendicular to the longitudinal direction of the feeder line is a flat shape. Performing appropriate wiring taking into consideration the airflow within the chamber generated by the vibrating member, turbulence due to the presence of the feeder line can be prevented, and noise due to wind roar can be suppressed.

With the present invention, the driving unit includes a terminal block mounted on the frame, and an actuator employing electromagnetic drive, which includes a coil; wherein the vibrating member includes a side plate provided on the vibrating plate; and wherein the driving device further includes an elastic supporting member configured to support the vibrating member, which is made up of a conductive material capable of supplying power to the actuator, and is disposed between the frame and the side plate. Thus, manufacturing can be performed using as little feeder line as possible, doing away with the concern of line breakage.

With the present invention, the frame includes an air communication opening configured to circulate the gas. Thus, a suitable airflow due to vibrations of the vibrating member can be generated from the inner side to the outer side of the frame.

With the present invention, the vibrating member is a cylindrical shape including a first and second vibrating plates connected to both ends in the vibrating direction of the side plate; and the driving unit includes an actuator configured to vibrate the vibrating member in the inside of the cylindrical-shaped vibrating member. For example, with an arrangement wherein the actuator is attached to a portion where the vibrating device is fixed to the housing of the jet flow generating device to which it is mounted, the only thing outside the vibrating member is chamber space. Accordingly, gas within the housing on the outer side of the vibrating member can be smoothly and efficiently jettisoned to the outer side of the housing. Also, noise can be reduced in conjunction with this. Alternatively, the driving unit includes an actuator configured to vibrate the vibrating member; and the vibrating member includes a first vibrating plate connected to the actuator, and a second vibrating plate configured to vibrate in sync with the first vibrating plate due to change in pressure of the gas to be generated when the first vibrating plate vibrates by the actuator being driven, which is arrayed with the first vibrating plate generally in the vibrating direction.

With the present invention, the driving unit includes an actuator employing electromagnetic drive, which includes a coil; and at least part of the frame is made up of a magnetic substance configured to make up the magnetic circuit of the actuator. Accordingly, at least one part of the frame also serves to function as a magnetic circuit, whereby magnetic flux density can be increased.

With the present invention, the vibrating device further comprises an elastic supporting member configured to support the vibrating member; wherein the frame has a plate-shaped appearance within the face, on which the elastic supporting member is mounted. Providing such a thin frame realizes reduction in thickness of the vibrating device and jet flow generating device. "Plate-shaped appearance" includes a shape wherein the frame is of a flat plate shape, with holes, grooves, etc., being provided to the flat plate whereby the vibrating member is to be attached.

With the present invention, the housing is made up of a resin; and the frame is made up of a material of which the rigidity is higher than the housing. Thus, even in the event that the thickness of the frame is less than the thickness of the housing, necessary rigidity can be maintained. Particularly, in the event that the frame is formed of metal, sufficient rigidity can be maintained.

With the present invention, the vibrating device further comprises an elastic supporting member configured to support the vibrating member so as to be vibrated, which is implemented in the housing, and also is formed so as to cover the frame. The elastic supporting member and frame can be formed by integral molding. Integral molding not only reduces the manufacturing processes as a matter of course, but also markedly improves positional precision between the elastic supporting member and the frame, and accordingly the positional precision of the positional precision of the elastic supporting member and housing.

With the present invention, the vibrating device further comprises an elastic supporting member configured to support the vibrating member so as to be vibrated, which is mounted to the frame, and also is formed so as to cover the vibrating member. The vibrating member and the elastic supporting member can be formed by integral molding. Integral molding not only reduces the manufacturing processes as a matter of course, but also markedly improves positional precision between the elastic supporting member and the vibrating member. In this case, the elastic supporting member may be formed so as to cover the frame.

With the present invention, the driving unit includes an electric wire of which the cross section generally perpendicular to the longitudinal direction is a polygon, and an actuator employing electromagnetic drive, which includes a coil configured by the electric wire being wound. Thus, the density of the coil per unit cross-sectional area can be increased over a case of wire having a circular cross-section perpendicular to the longitudinal direction. That is to say, a greater number of winds can be made of the wire for the same volume. Accordingly, the height of winds (thickness of the entire coil) is reduced for the same number of winds, so reduced thickness of the coil can be achieved. A "polygon" is a shape having three or more angles.

With the present invention, the coil is configured by an even number of layers being wound. This is advantageous in the event that the winding start of the coil and the winding end are to be at the same side. That is to say, in this case, in the case of an odd number of layers, the thickness of one coil worth (thickness of one layer worth) is wasted, but with even layers, the waste of that space is done away with, contributing to reduced size and reduced thickness.

With the present invention, the driving unit includes a magnet implemented in the vibrating member, and a coil configured to vibrate the vibrating member in which the magnet is implemented by generating a magnetic field upon application of electricity. Accordingly, reduction in thickness of the vibrating device, and consequently the jet flow generating device, can be realized.

With the present invention, the coil is disposed outside the housing. Having the coil disposed outside the housing enables the amplitude of the vibrating member to be increased without interference between the vibrating member and the coil. Accordingly, the amount of gas discharged can be increased. Also, the resistance of airflow generated within the housing is reduced, and noise is suppressed. The coil may be mounted within the housing, or may not be mounted therein.

With the present invention, the driving unit includes a power source configured to apply power for rotating the vibrating member within the face, and a transformation mechanism configured to transform the movement of the vibrating member which rotates by the power source so as to vibrate the vibrating member in the vibrating direction. The power source includes a coil, and a magnet implemented in the vibrating member. In this case, as described above, the coil may be disposed outside of the housing. The transformation mechanism is made up of a rack mechanism or cam mechanism, but may be another mechanism.

With the present invention, the vibrating member is a bimorph-type piezoelectric actuator. Thus, a thin piezoelectric actuator can be realized.

With the present invention, the vibrating member includes an end portion within the face; and the driving unit includes a coil mounted on the end portion of the vibrating member, and a plurality of magnetic circuit configuration members configured to make up a magnetic circuit configured to apply driving force to the coil. If there is a magnetic circuit configuring member at the perimeter of the coil, reduction of thickness can be realized. For example, the magnetic circuit configuration member includes a first yoke including a first wall around which the coil is disposed, and a second wall facing the first wall, which is installed upright in the vibrating direction, a plate-shaped second yoke disposed between the first wall and the second wall so as to face both of the first and second walls, and a magnet magnetized in a direction from the first wall toward the second yoke, which is sandwiched between the first wall and the second yoke.

A vibrating device according to another perspective of the present invention is a vibrating device configured to vibrate gas included in a housing so as to discharge the gas via an opening included in the housing as a pulsating flow, comprising: a frame; a vibrating member including a vibrating plate having a face generally perpendicular to a vibrating direction, supported by the frame so as to be vibrated; and a driving unit including a magnet, a bobbin including an air communication opening configured to circulate the gas, which is mounted on the vibrating member, and also is provided so as to surround the magnet, and a coil wound on the bobbin.

According to the present invention, gas within the inner space can escape outwards from the bobbin via the air communication opening, so pressure change of the space within the bobbin does not become vibration resistance, and effective vibrations can be generated at the vibrating member.

A jet flow generating device according to the present invention comprises: a frame; a vibrating member including a vibrating plate having a face generally perpendicular to a vibrating direction, supported by the frame so as to be vibrated; a housing including an opening, configured to support the frame, and also in which gas is included; and a driving unit configured to discharge the gas via the opening as a pulsating flow by driving the vibrating member to apply vibration to the gas. For example, if the vibrating member includes a side plate provided on the vibrating plate, rigidity of the vibrating member increases, flexion of the vibrating plate is suppressed, and the gas can be effectively provided with vibrations.

With the present invention, the housing includes at least the two openings, and also includes at least two chambers therein, which are provided at one side in the vibrating direction of the vibrating plate, and at the opposite side thereof so as to each communicate with each of the openings. Accordingly, gas is alternately discharged from the openings, so the sounds of discharge from the openings are of inverse phase and weaken each other, so noise can be suppressed. In the event that the volume of the at least two chambers are the same, the symmetry of the device in the vibration direction increases, so reduction of noise can be further improved. However, the two chambers do not necessarily have to be the same.

With the jet flow generating device, in the event that there is no frame, the jet flow generating device comprises: a vibrating member including a vibrating plate having a face generally perpendicular to a vibrating direction; a housing including an opening, configured to support the vibrating member is as to be vibrated, and also in which gas is included; and a driving unit configured to discharge the gas via the opening as a pulsating flow by driving the vibrating member to apply vibration to the gas. That is to say, with the present invention, the frame itself is configured of the housing.

With the present invention, the driving unit includes an actuator employing electromagnetic drive, which includes a coil, and at least a part of the housing is formed of a magnetic substance for configuring a magnetic circuit of the actuator. Accordingly, at least a part of the housing can also function as a magnetic circuit, whereby the magnetic flux density can be improved.

With the present invention, the jet flow generating device further comprises a nozzle member including the conduit of the gas to be communicated to the opening, mounted on the housing. Thus, the nozzle member is mounted to the housing after the housing is manufactured, whereby manufacturing of the jet flow generating device is facilitated.

With the present invention, the driving unit includes an actuator employing electromagnetic drive, and a circuit board configured to generate an electric signal arranged to operate the actuator, which is attached to the housing. Accordingly, not only are intermediate electrical connecting means such as a terminal block rendered unnecessary, the structure is also simplified.

With the present invention, the housing includes a face having a different angle from the face, and the circuit board is attached to the face having a different angle. Accordingly, this contributes to reduction in thickness of the jet flow generating device.

With the present invention, the circuit board makes up part of the housing. Accordingly, this contributes to reduction in size of the jet flow generating device.

With the present invention, the housing includes first and second chambers which are separated by the vibrating member in the vibrating direction of the vibrating member within the housing, in which the gas is included, and a plate made up of a magnetic substance, which is disposed at least at one side of the first and second chambers. Thus, in a case wherein the driving unit is an electromagnetic motor for example, and the vibrating member is within the housing, magnetic field leakage can be suppressed by the metal plate thereof. In this case, one having high magnetic permeability is preferably used, in order to manifest the magnetic shielding effects. For example, by the plate being made up of metal, the housing can be made thinner since the strength thereof is greater than that of resin or the like.

With the present invention, the housing includes an opening for work, and a lid mounted on the opening for work. "Work" means testing, inspection, manufacturing work, and so forth, during the manufacturing process of the jet flow generating device. In this case, the housing is partially from of a material which transmits visible light, instead of a lid. Or, the lid may be formed of a material which transmits visible light.

With the present invention, the jet flow generating device further comprises a fixing mechanism configured to fix the jet flow generating device to an electronic device. This facilitates work of assembling the jet flow generating device into an electronic device by a worker.

With the present invention, the housing includes an outer face including a first face, a second face, a curved face configured to connect between the first face and the second face. Thus, waste of space can be eliminated in a case of the jet flow generating device being implemented in an electronic device.

With the present invention, the housing includes a plurality of the openings, a first opening having a first opening face of the openings, and a second opening having a second opening face of a different angle from the first opening face. Thus, jet flows are blown in different directions. For example, the positions of the first opening face and the second opening face can be designed so as to match the form of the electronic device. The first opening face and the second opening face may be disposed so as to be almost orthogonal to each other, or almost in parallel.

A jet flow generating device according to the another perspective of the present invention comprises: a plurality of vibrating members configured to be all vibrated generally in the same direction; a housing including a plurality of openings, and a plurality of chambers configured to each communicate to each of the openings, in which each of the vibrating members is disposed, which are disposed so as to be arrayed within a face generally perpendicular to the vibrating directions of the vibrating members, and each of which gas is included; a driving unit configured to discharge the gas via the each opening as a pulsating flow by driving the vibrating members to apply vibration to the gas.

With the present invention, vibrating members are provided for each of multiple chambers arrayed in planar fashion, and gas is discharged from each of openings communicating with the chambers, whereby not only can the jet flow generating device be reduced in thickness, but also the amount of gas discharged can be increased. Also, with an arrangement wherein the two vibrating members vibrate such that at the timing at which one vibrating member moves in one direction, the other moves in the opposite direction, there is moment generated at the device as a whole, but the vibrations of the two vibrating members are cancelled out. Accordingly, vibrations applied to the electronic device in which the jet flow generating device is implemented can be suppressed.

The "same direction" which is the direction of vibration in the present invention includes the meaning of both directions of the direction heading toward one side and the direction heading toward the other side. That is to say, this does not mean that the multiple vibrating members all have to vibrate upwards at the same timing, or have to vibrate downwards at the same timing. It is sufficient for the direction of the overall vibration of the vibrating members to be approximately the same, regardless of the vibrating timings.

With the present invention, the jet flow generating device further comprises: a nozzle member including a plurality of the gas conduits which communicate to the respective openings respectively, and forming the respective conduits integrally. Thus, sets are formed of one nozzle per one housing, thereby facilitating manufacturing.

With the present invention, the housing includes a hole into which a heat transport device is fitted, which is configured to transport heat based on the phase change of a working fluid using capillary action. Or, the housing includes a step, a groove, or a recessed portion with which the heat transport device is in contact. Accordingly, the position to which the heat transport device is to be attached to the jet flow generating device is readily discernible to a worker, facilitating manufacturing. Also, this contributes to reduction in size or reduction in thickness of the device obtained by combining the jet flow generating device and the heat transport device.

With the present invention, the driving unit includes an actuator employing electromagnetic drive, which includes a magnetic circuit configuration member making up a magnetic circuit; and the magnetic circuit configuration member is provided so as to protrude outside the housing in the vibrating direction from the housing. The size of the magnetic circuit configuration member is often large in comparison to other actuator parts, so other than the magnetic circuit configuration member is provided so as to protrude outside the housing. That is to say, this enables the housing to be made as small as possible, doing away with unnecessary space.

A jet flow generating device according to another perspective of the present invention comprises: a frame; a vibrating member including a vibrating plate having a face generally perpendicular to a vibrating direction, supported by the frame so as to be vibrated; and a housing including an opening, configured to support the frame, and also in which gas is included; and a driving unit configured to discharge the gas via the opening as a pulsating flow by driving the vibrating member to apply vibration to the gas, which includes a magnet, a bobbin including an air communication opening configured to circulate the gas, which is mounted on the vibrating member, and also is provided so as to surround the magnet, and a coil which is wound around the bobbin.

With the jet flow generating device according to the present invention, in the event that there is no frame, the jet flow generating device comprises: a vibrating member including a vibrating plate having a face generally perpendicular to a vibrating direction; a housing including an opening, configured to support the vibrating member so as to be vibrated, and also in which gas is included; and a driving unit configured to discharge the gas via the opening as a pulsating flow by driving the vibrating member to apply vibration to the gas, which includes a magnet, a bobbin including an air communication opening configured to circulate the gas, which is mounted on the vibrating member, and also is provided so as to surround the magnet, and a coil which is wound around the bobbin.

An electronic device according to the present invention comprises: a heat generating member; a jet flow generating device including a frame, a vibrating member including a vibrating plate having a face generally perpendicular to a vibrating direction, supported by the frame so as to be vibrated, a first housing including an opening, configured to support the frame, and also in which gas is included, a driving unit configured to discharge the gas toward the heat generating member via the opening as a pulsating flow by driving the vibrating member to apply vibration to the gas; and a second housing capable of holding the heat generating member and the jet flow generating device.

That the second housing is "capable of holding" the heat generating member and the jet flow generating device, does not necessarily mean that the heat generating member and the jet flow generating device have to be "stored"; this term includes permitting a part of the heat generating member or the like for example, to be exposed externally from the second housing.

Examples of heat generating members include electronic parts such as ICs or resistors, radiating fins (heat sink), etc., but are not restricted to these, and may be anything which generates heat.

With this electronic device, in the event that there is no frame, the electronic device comprises: a heat generating member; a vibrating member including a vibrating plate having a face generally perpendicular to a vibrating direction; a housing including an opening, configured to support the vibrating member so as to be vibrated, and also in which gas is included; and a driving unit configured to discharge the gas toward the heat generating member via the opening as a pulsating flow by driving the vibrating member to apply vibration to the gas.

As for the electronic device, examples of the electronic device include computers (in the case of a personal computer, this may be either a laptop or a desktop), PDAs (Personal Digital Assistance) electronic dictionaries, cameras, display devices, audio/visual equipment, projectors, cellular telephones, game devices, car navigation devices, robotic equipment, and other electric appliances and so forth. This holds true regarding the "electronic device" described below as well.

With the present invention, the electronic device further comprises a second housing for storing the heat generating member, wherein part of the second housing is made up of part of the first housing. Thus, reduction in size or reduction in thickness of the electronic device can be realized.

An electronic device according to another perspective of the present invention comprises: a first heat generating member; a first jet flow generator configured to discharge a first gas in a first direction towards the first heat generating member as a pulsating flow; a second heat generating member; and a second jet flow generator configured to discharge a second gas in a second direction, which differs from the first direction, towards the second heat generating member as a pulsating flow.

With the present invention, in the event that two or more heat generating members are disposed at distanced positions, the heat generating members can be efficiently cooled. Also, the first direction and the second direction are different, so following thermal discharge of the first and second heat generating members, gas including the heat can be vented in different directions.

The type of gas for the "first gas" and the "second gas" may be the same. However, these do not need to be the same, and may be different.

For example, the first direction and the second direction differ approximately 90 degrees. The first and the heat generating members may have the same configuration, and the first and the second jet flow generators may have the same configuration. "Configuration" here also includes the concept of shape and size. "Same configuration" means manufactured articles when articles substantially the same are manufactured, and does not mean that these are physically identical.

With the present invention, the length obtained by adding the length of the first heat generating member in the first direction, and the length of the first jet flow generator in the first direction is approximately equal to the length in the first direction of the second jet flow generator. In the event that the first direction and the second direction differ approximately 90 degrees, wasted space can be eliminated by such a configuration according to the present invention.

A manufacturing method according to the present invention is a manufacturing method of a vibrating device configured to vibrate gas included in a housing to discharge the gas via an opening included in the housing as a pulsating flow, comprising: a step arranged to dispose a frame to be attached to the housing in a predetermined position; and a step arranged to subject the frame disposed in a predetermined position, and an elastic supporting member configured to support a vibrating member configured to vibrate the gas to integral molding.

With the present invention, the frame and elastic supporting member are integrally molded, thereby reducing manufacturing processes, and also reducing costs. This also markedly improves positional precision between the elastic supporting member and frame, and consequently between the elastic supporting member and the housing.

The present invention further comprises a step arranged to the vibrating member and the elastic supporting member to integral molding. With the present invention as well, this reduces the manufacturing processes, reduces costs, and markedly improves positional precision between the vibrating member and elastic supporting member, and consequently between the elastic supporting member and the housing.

A manufacturing method of a vibrating device according to another perspective of the present invention is a manufacturing method of a vibrating device configured to vibrate gas included in a housing to discharge the gas via an opening included in the housing as a pulsating flow, the method comprising: a step arranged to dispose a vibrating member configured to vibrate the gas in a predetermined position; and a step arranged to subject the vibrating member disposed in a predetermined position, and an elastic supporting member configured to support the vibrating member to integral molding.

Thus, according to the present invention, efficient vibrations can be generated at the vibrating member, thereby effectively applying vibrations to the gas.

BRIEF DESCRIPTION OF THE DRAWINGS

FIG. 90 is a plane view of a part of the interior of an electronic device with multiple jet flow generating devices built in.

BEST MODE FOR CARRYING OUT THE INVENTION

The following is a description of embodiments of the present invention, with reference to the drawings.

Figure 1:
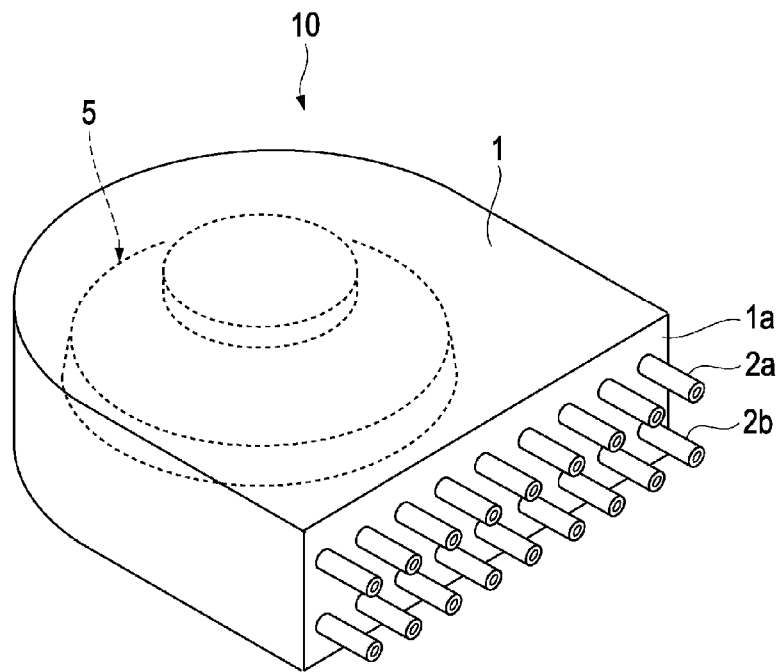
FIG. 1 is a perspective view illustrating a jet flow generating device according to an embodiment of the present invention.
Figure 2:
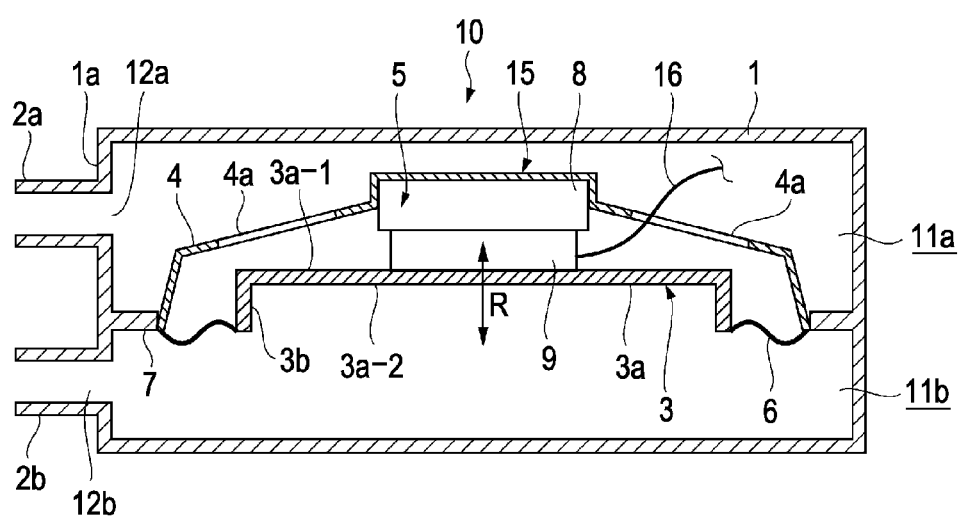
FIG. 2 is a cross-sectional view of the jet flow generating device shown in FIG. 1.

FIG. 1 is a perspective view illustrating a jet flow generating device according to an embodiment of the present invention, and FIG. 2 is a cross-sectional view of the jet flow generating device shown in FIG. 1.

A jet flow generating device 10 has a housing 1 of which the rear portion has a cylindrical shape, and a vibrating device disposed within the housing 1. Multiple nozzles 2a and 2b are each arrayed on a front face 1a of the housing 1. As shown in FIG. 2, the interior of the housing is divided into an upper chamber 11a and lower chamber 11b by a vibrating device 15, an attaching portion 7 whereby the vibrating device 15 is attached. Openings 12a and 12b are formed at positions corresponding to nozzles 2a and 2b, on the front face 1a of the housing 1 where the nozzles 2a and 2b are situated. Thus, the upper chamber 11a and the lower chamber 11b each communicate with the ambient atmosphere. The chambers 11a and 11b each have approximately the same volume. That is to say, the upper chamber 11a is thicker than the lower chamber 11b in the vertical direction (thickness direction) in FIG. 2, by an amount equivalent to that of the vibrating device 15 disposed in the upper portion. Accordingly, the amount of gas discharged alternatingly from the nozzles 2a and 2b can be made to be the same, improving quietness.

Figure 3:
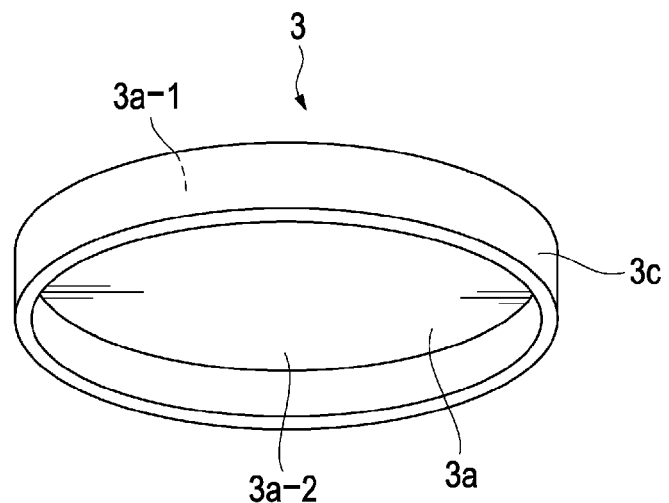
FIG. 3 is a perspective view illustrating a vibrating member according to an embodiment of the present invention.

The vibrating device 15 has a configuration similar to that of a speaker, for example. The vibrating device 15 includes a frame 4, an actuator 5 mounted to the frame 4, and a vibrating member 3 supported on the frame 4 by an elastic supporting member 6. FIG. 3 is a perspective view illustrating the vibrating member 3. The vibrating member 3 is configured having a side plate 3b formed on the perimeter of a disc-shaped vibrating plate 3a. Of a front face 3a-1 and rear face 3a-2 of the vibrating plate 3a, the side plate 3b is erected on the rear face 3a-2, for example. A vent port 4a for venting air in the housing 1 in and out of the frame 4 is formed in the frame 4.

The vibrating member 3 is formed of, for example, resin, paper, or metal. Particularly, forming the vibrating member 3 of paper realizes marked reduction in weight. Paper does not lend itself to forming arbitrary shapes as resin, but is advantageous regarding weight. Reduction in weight is not a problem for the vibrating member 3 since it has the side plate 3b and is highly rigid. In the event that the vibrating member 3 is formed of resin, arbitrary shapes are readily formed by molding. On the other hand, in the event that the vibrating member 3 is formed of metal, there are materials such as magnesium which are lightweight and can be formed by injection molding, and accordingly can be used depending on the case.

Figure 4:
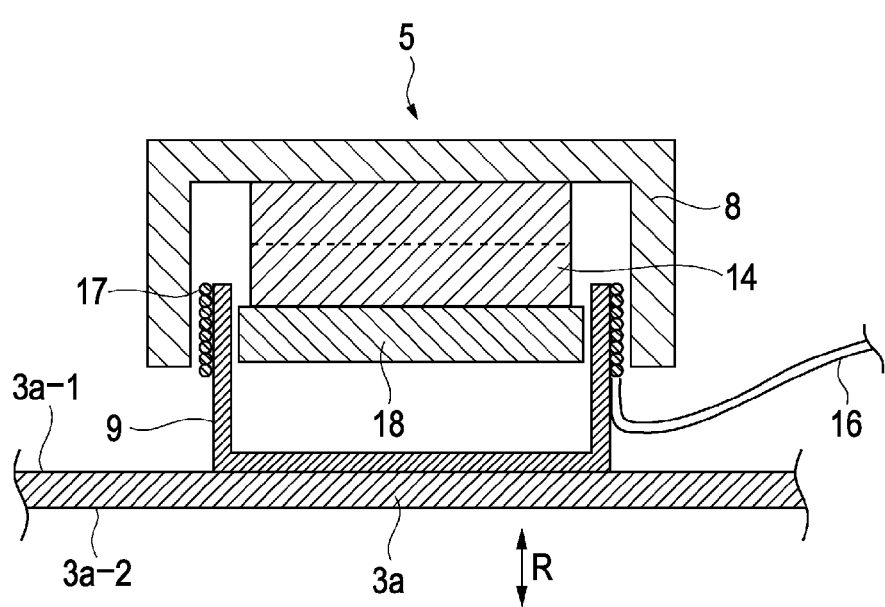
FIG. 4 is an enlarged cross-sectional view illustrating an actuator 5 according to an embodiment of the present invention.
Figure 5:
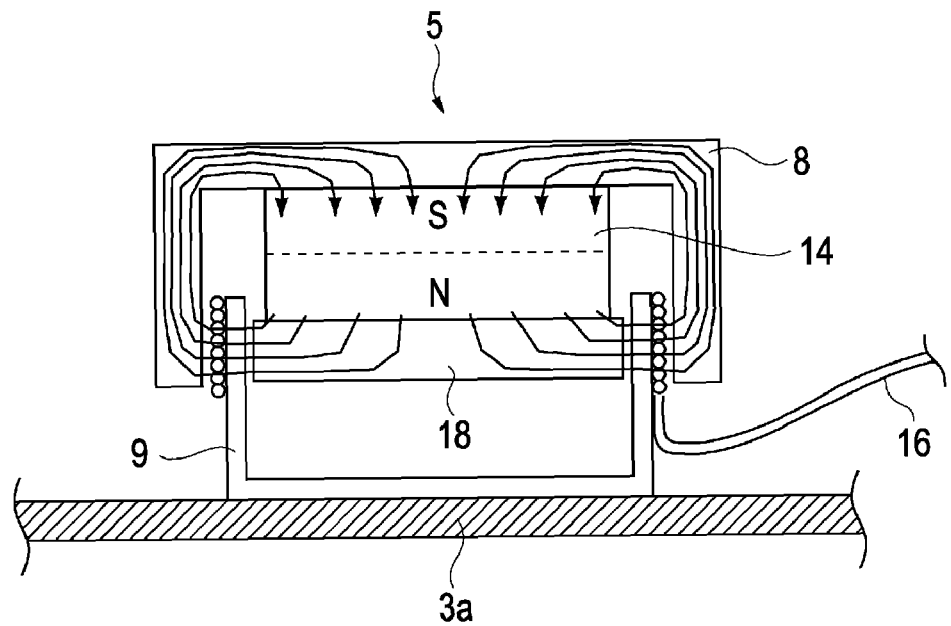
FIG. 5 is a diagram illustrating a state of a magnetic field generated by the actuator shown in FIG. 4.

FIG. 4 is an enlarged cross-sectional view illustrating the actuator 5. A magnet 14 which is magnetized in the vibrating direction R of the vibrating plate 3a is built in the inside of a cylindrical yoke 8, and the magnet 14 is attached with a disc-shaped yoke 18, for example. A magnetic field such as shown in FIG. 5 is generated by the magnet 14, and the yokes 8 and 18, thereby configuring a magnetic circuit. A coil bobbin 9 around which a coil 17 is wound is configured to enter or leave a space between the magnet 14 and the yoke 8. That is to say, the actuator 5 is made up of a voice coil motor. An electric signal is supplied to the actuator 5 from an unshown driving IC for example via a feeder line 16. The yoke 8 is fixed in the center of the inner side of the frame 4, and the coil bobbin 9 is fixed in the front face 3a-1 of the vibrating plate 3a. The plate-shaped yoke 18 is, as described above, has a disc shape, for example. However, the shape of the yoke 18 is not restricted to a circle, but may be an oval or rectangle. It is also thought that the shape similar to the face 3a-1 (or 3a-2) of the vibrating plate 3a is reasonable. According to such an actuator 5, the vibrating member 3 can be vibrated in the direction of arrow R.

The housing 1 is, for example, made up of a resin or rubber or metal. A resin and a rubber are readily fabricated with molding, which are suitable for mass production. Also, in the event that the housing 1 is made up of a resin or rubber, sound generated by driving the actuator 5, or air flow sound generated by vibrating the vibrating plate 3a, and so forth can be suppressed. In other words, in the event that the housing 1 is made up of a resin or rubber, the attenuation factor of such sound also increases, and accordingly, noise can be suppressed. Further, in this case, reduction in weight can be handled, and also reduction in costs is realized. In the event that the housing 1 is fabricated with injection molding of resin or the like, the housing 1 can be molded integrally with the nozzles 2a and 2b. In the event that the housing 1 is made up of a material of which the thermal conductivity is high, e.g., metal, the heat emitted from the actuator 5 is allowed to escape to the housing 1, and the heat can be radiated to the outside of the housing 1. Examples of this metal include aluminum and copper. In the event of taking thermal conductivity into consideration, the material is not restricted to metal, and rather may be carbon. As for the metal, magnesium by which injection molding can be performed or the like can be employed. In the event that the magnetic field leaked from the magnetic circuit of the actuator 5 affects upon another device of the device, the device which eliminates a leak magnetic field is required. One device thereof is to make up the housing 1 with a magnetic material, e.g., iron or the like. Thus, a leak magnetic field is reduced to a remarkable level. Further, with use under a high temperature, or a particular application, a housing made up of ceramics may be employed.

As described above, in the event that a high heat conduction material is employed for the housing 1 for heat dissipation, it is also desirable to employ a material of which the thermal conductivity is high for the frame 4. In this case as well, metal or carbon is employed for the frame 4. However, in the event that thermal conductivity is not taken into consideration very much, resin can be used. In the event of a resin, a cheap and lightweight frame can be fabricated with injection molding. A part of the frame 4 can be made up of a magnetic substance. Thus, the yoke of the actuator 5 can be made up of the magnetic substance thereof, and also flux density can be improved.

An elastic supporting member 6 is, for example, made up of a rubber or resin or the like. The elastic supporting member 6 makes up a bellows shape, and as viewed from the top face, which makes up a ring shape. The vibrating member 3 is principally supported by the actuator 5, but in order to prevent the lateral deflection which is deflection in the perpendicular direction as to the vibrating direction R of the vibrating member 3, the elastic supporting member 6 includes a function arranged to support the vibrating member 3. Also, the elastic supporting member 6, as described above, separates the chambers 11a and 11b, whereby gas can be prevented from communication between the chambers 11a and 11b when the vibrating member 3 is vibrated. The elastic supporting member 6 makes up a bellows shape, but the number of peak portions and the number of trough portions are preferably each one as shown in FIG. 2, which will be referred to as two folds hereafter. This is because in the event that only one trough portion or one peak portion, the height in the vertical direction in FIG. 2 becomes high, which is contrary to reduction in thickness, but in the event that there are multiple trough portions and multiple peak portions, complex movement other than the vibrating direction R is generated when the vibrating member 3 is vibrated, so there is a possibility that efficiency may be deteriorated.

Note that an arrangement has been made wherein the housing 1 is provided with the nozzles 2a and 2b, but an arrangement may be made wherein the housing 1 is simply provided with an opening instead of the nozzles.

Description will be made regarding the operations of the jet flow generating device 10 thus configured.

For example, upon AC voltage of a sine wave being applied to the actuator 5, the vibrating member 3 performs sinusoidal vibration. Thus, the capacity within the chambers 11a and 11b increases or decreases. Along with the capacity change of the chambers 11a and 11b, the pressure of each of the chambers 11a and 11b is changed, and according to this, an air flow is generated via each of the nozzles 12a and 12b as a pulsating flow. For example, upon the vibrating member 3 being displaced in the direction where the capacity of the chamber 11a increases, the pressure of the chamber 11a decreases, and the pressure of the chamber 11b increases. Thus, the air outside the housing 1 is flowed into the chamber 11a via the nozzle 12a, and the air within the chamber 11b is jetted outside via the nozzle 12b. Conversely, upon the vibrating member 3 being displaced in the direction where the capacity of the chamber 11a decreases, the pressure of the chamber 11a increases, and the pressure of the chamber 11b decreases. Thus, the air within the chamber 11a is jetted outside via the nozzle 12a, and the air outside the housing 1 is flowed into the chamber 11b via the nozzle 12b. When the air is jetted from the nozzles 12a and 12b, the atmospheric pressure around the nozzles 12a and 12b falls, and accordingly, the air around the nozzles 12a and 12b is involved in the air jetted from each nozzle. That is to say, this is a synthesis jet flow. Such a synthesis jet flow is sprayed on a heat-generating member or a high-fever part, whereby the heat-generating member or high-fever part thereof can be cooled.

On the other hand, when the air is jetted from the nozzles 12a and 12b, noise is generated from each of the nozzles 12a and 12b individually. However, each acoustic wave generated from each of the nozzles 12a and 12b is an acoustic wave of an opposite phase, so can be weakened mutually. Thus, noise is suppressed, and quietness can be realized.

According to the present embodiment, the vibrating member 3 includes the side plate 3b, so the rigidity of the overall of the vibrating member 3 improves, whereby the bending of the vibrating plate 3a can be suppressed, and vibration can be applied to gas effectively. Also, according to the present embodiment, high rigidity is not realized by thickening the vibrating plate 3a itself, but high rigidity of the overall of the vibrating member 3 is realized by forming the side plate 3b, and accordingly, the weight of the vibrating member 3 does not become heavy.

Figure 6:
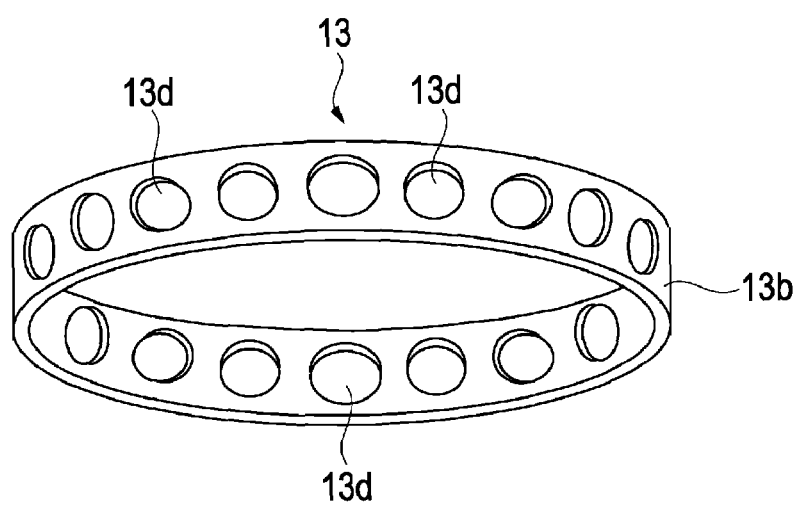
FIG. 6 is a perspective view illustrating a vibrating member according to another embodiment of the present invention.

FIG. 6 is a perspective view illustrating another embodiment of a vibrating member. With embodiments described below, description will be simplified or omitted regarding the same members, same functions, and so forth as those according to the embodiment shown in FIG. 1 through FIG. 4, and description will be made centered on different points. Also, as for the material of each member as well, each member can be fabricated basically with the above-mentioned material. A vibrating member 13, as with the state shown in FIG. 2, is built in the vibrating device 15. With the vibrating member 13, multiple holes 13d are provided in a side plate 13b. The number of the holes 13d is not necessarily greater than 1, but may be one. Thus, reduction in weight regarding the vibrating member 13 can be realized while maintaining the rigidity of the vibrating member 13, and also low-power consumption can be realized.

Figure 7:
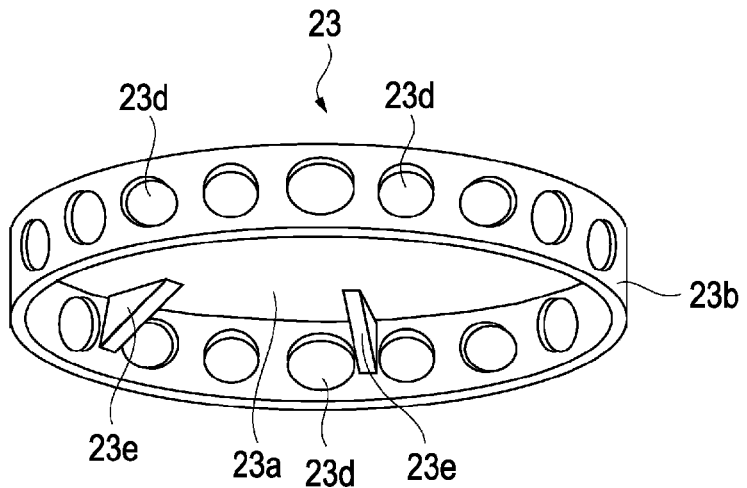
FIG. 7 is a perspective view illustrating a vibrating member according to yet another embodiment of the present invention.

FIG. 7 is a perspective view illustrating yet another embodiment of a vibrating member. With this vibrating member 23, as with the vibrating member 13 shown in FIG. 6, multiple holes 23d are provided in a side plate 23b. Further, ribs 23e are provided so as to connect a vibrating plate 23a and the side plate 23b. Thus, the rigidity of the vibrating member 23 can be further improved.

Figure 8:
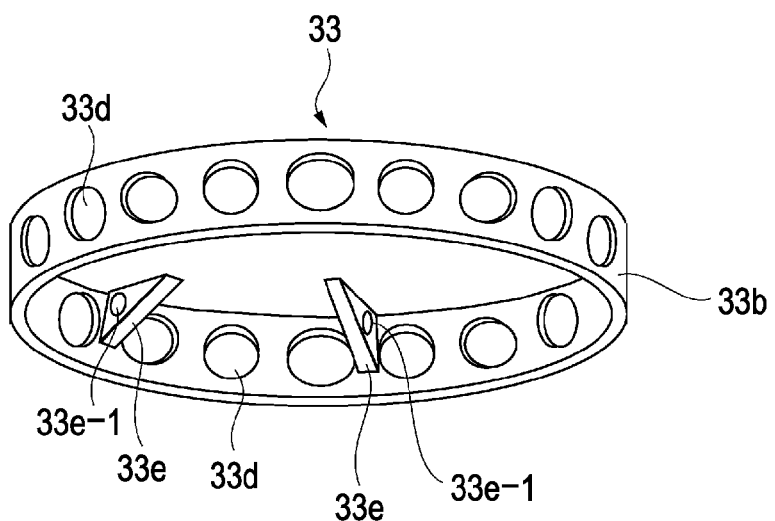
FIG. 8 is a perspective view illustrating a vibrating member according to yet another embodiment of the present invention.

As a vibrating member 33 according to yet another embodiment shown in FIG. 8, even if a rib 33e is provided with a hole 33e-1, reduction in weight can be realized. In the event that the vibrating member 13, 23, and 33 such as shown in FIG. 6 through FIG. 8 are, for example, made up of a resin, even with the shapes of these vibrating members 13, 23, and 33, the vibrating members 13, 23, and 33 can be fabricated by subjecting a resin to injection molding.

Figure 9A:
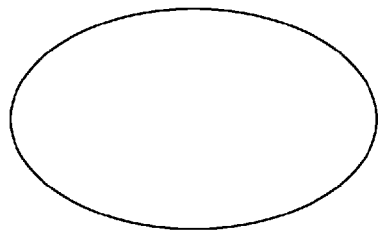
FIG. 9A is a plane view illustrating a vibrating plate according to yet another embodiment of the present invention.
Figure 9B:
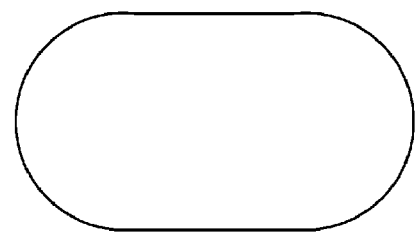
FIG. 9B is a plane view illustrating a vibrating plate according to yet another embodiment of the present invention.
Figure 9C:
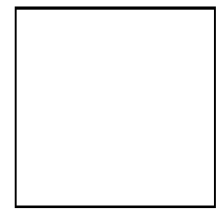
FIG. 9C is a plane view illustrating a vibrating plate according to yet another embodiment of the present invention.
Figure 9D:
FIG. 9D is a plane view illustrating a vibrating plate according to yet another embodiment of the present invention.
Figure 9E:
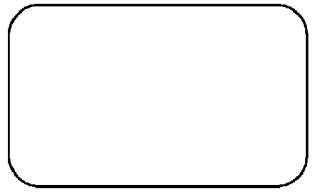
FIG. 9E is a plane view illustrating a vibrating plate according to yet another embodiment of the present invention.

FIG. 9A through FIG. 9B are plane views illustrating another embodiment of the shapes of the above-mentioned vibrating members 3 and 13, and the vibrating plate 3a of the other vibrating members. The shape may be an oval such as shown in FIG. 9A, or may be an ellipse such as shown in FIG. 9B. The shapes shown in FIG. 9C through FIG. 9E are each a square, a rectangle, and a rectangle of which each corner is a curved line. Thus, the plane shapes of the vibrating plate 3a and the like may be arbitrary shapes, but in the event of a circle, fabrication including metal mold and the like is readily performed. In the event that a vibrating device including a vibrating plate shown in FIG. 9C through 9E is implemented in the housing 1, the plane shape of the housing 1 is preferably a rectangle so as to match the shape of the vibrating plate. For example, an axial flow fan and so forth rotate to blow air, so the plane shape thereof is a circle. On the other hand, the vibrating plate of the jet flow generating device 10 is not necessarily a circle, and rather a flexible shape such as shown in FIG. 9A through 9E can be realized. Thus, the shape can be handled flexibly, whereby in the event that the jet flow generating device 10 is implemented in an electronic device such as a PC or the like for example, the flexibility regarding the placement and shape thereof can be improved.

Also, the top face or under face of the housing 1 of the jet flow generating device 10 can be made similar to the face of various types of shape of the vibrating plate shown in FIG. 7. Thus, an air flow which is the most appropriate to the shape of the vibrating plate, and is effective can be generated within the housing 1.

Figure 10:
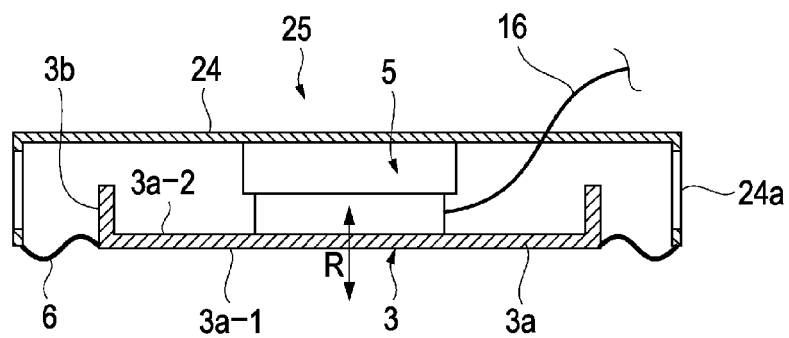
FIG. 10 is a cross-sectional view of a vibrating device according to another embodiment of the present invention.
Figure 11:
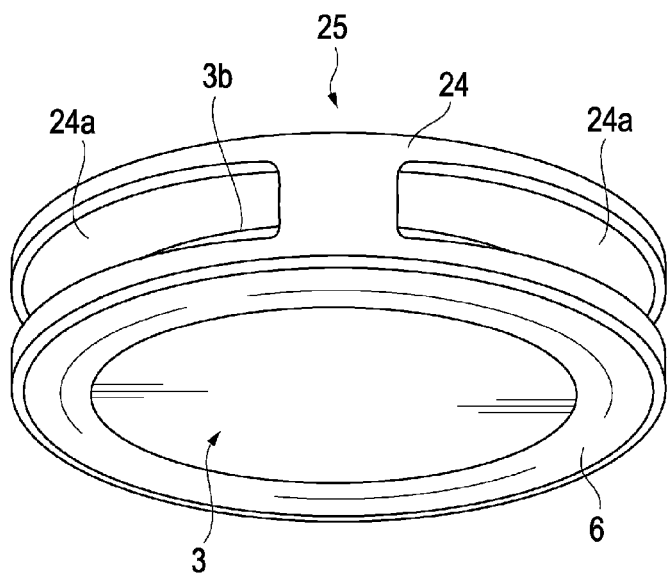
FIG. 11 is a perspective view of the vibrating device shown in FIG. 10.

FIG. 10 is a cross-sectional view illustrating another embodiment of a vibrating device. FIG. 11 is the perspective view thereof. With a vibrating device 25, the vibrating member 3 is attached to a cylindrical frame 24 via the elastic supporting member 6. With the frame 24, two air communication openings 24a which are long close to 180 degrees are provided, for example, at the side face thereof. With the vibrating member 3, the actuator 5 is disposed on a face 3a-2 which is a side where the side plate 3b is installed upright. In other words, the direction of the vibrating member 3 is the opposite direction of the state shown in FIG. 2 with the vibrating direction R. Thus, reduction in thickness regarding the overall of the vibrating device 25 can be realized.

Figure 12:
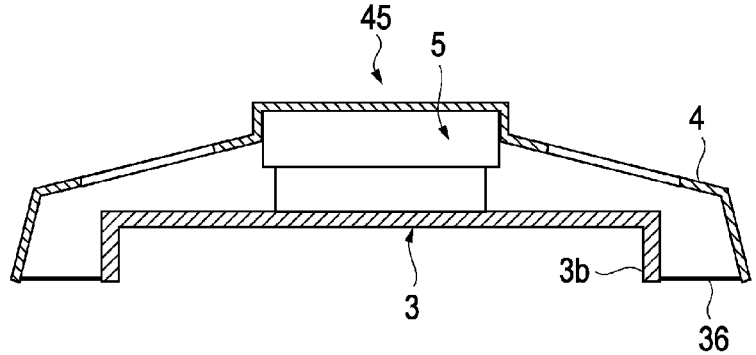
FIG. 12 is a cross-sectional view of a vibrating device according to yet another embodiment of the present invention.
Figure 13:
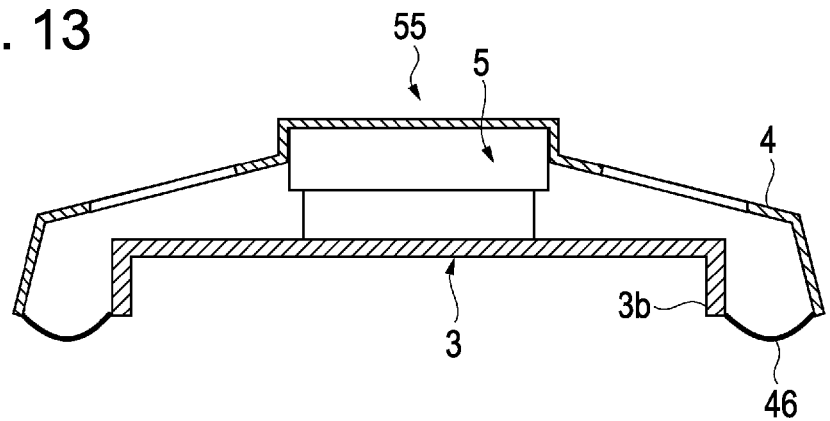
FIG. 13 is a cross-sectional view of a vibrating device according to yet another embodiment of the present invention.

FIG. 12 is a cross-sectional view illustrating a vibrating device according to yet another embodiment. The elastic supporting member 36 of this vibrating device 45 is not a bellows shape, of which the cross section is linear. An elastic supporting member 46 of a vibrating device 55 shown in FIG. 13 is made up of only one trough portion. With such elastic supporting members, the communication of air between the front face and the rear face side of the vibrating member 3 can be prevented.

Figure 14:
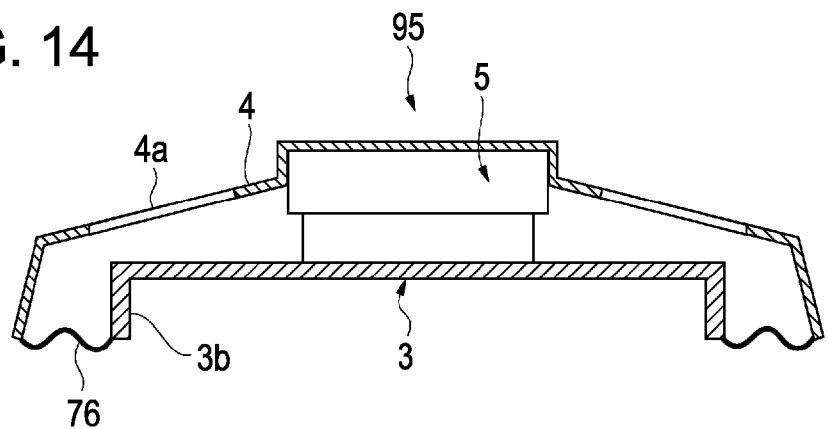
FIG. 14 is a cross-sectional view of a vibrating device according to yet another embodiment of the present invention.

FIG. 14 is a cross-sectional view illustrating a vibrating device according to yet another embodiment. The elastic supporting member 76 of this vibrating device 95 is made up of one peak portion and two trough portions. Thus, bellows having more than two folds may be employed.

Figure 15:
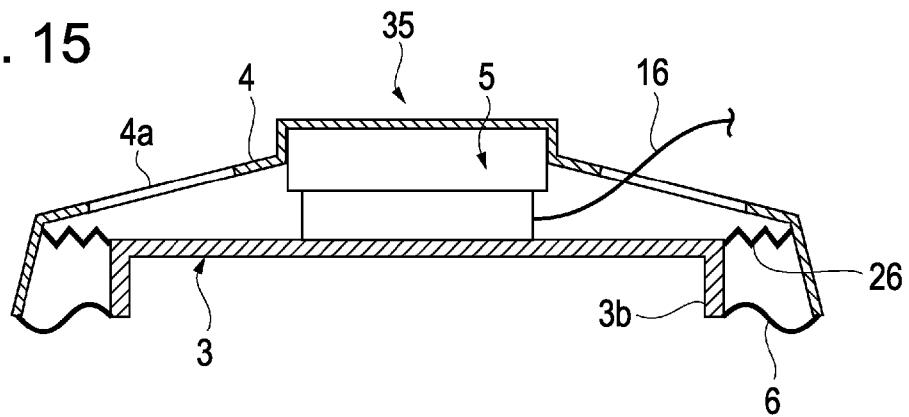
FIG. 15 is a cross-sectional view of a vibrating device according to yet another embodiment of the present invention.

FIG. 15 is a cross-sectional view illustrating a vibrating device according to yet another embodiment. A second elastic supporting member 26 (hereafter, referred to as a damper) is implemented between the side plate 3b and the frame 4 of this vibrating device 35 aside from a first elastic supporting member 6 (hereafter, referred to as an edge member). The damper 26 has, for example, a ring shape. The edge member 6 and the damper 26 are connected to both ends in the vibrating direction in the side plate 3b. Thus, the side plate 3b is supported with the two positions of the vibrating direction R, whereby stable vibration can be obtained by preventing the lateral deflection of the vibrating member 3.

Figure 16:
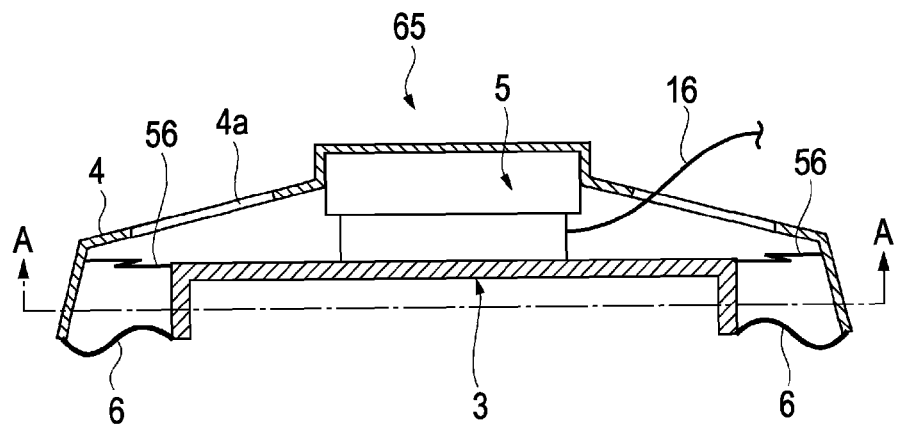
FIG. 16 is a cross-sectional view of a vibrating device according to yet another embodiment of the present invention.
Figure 17:
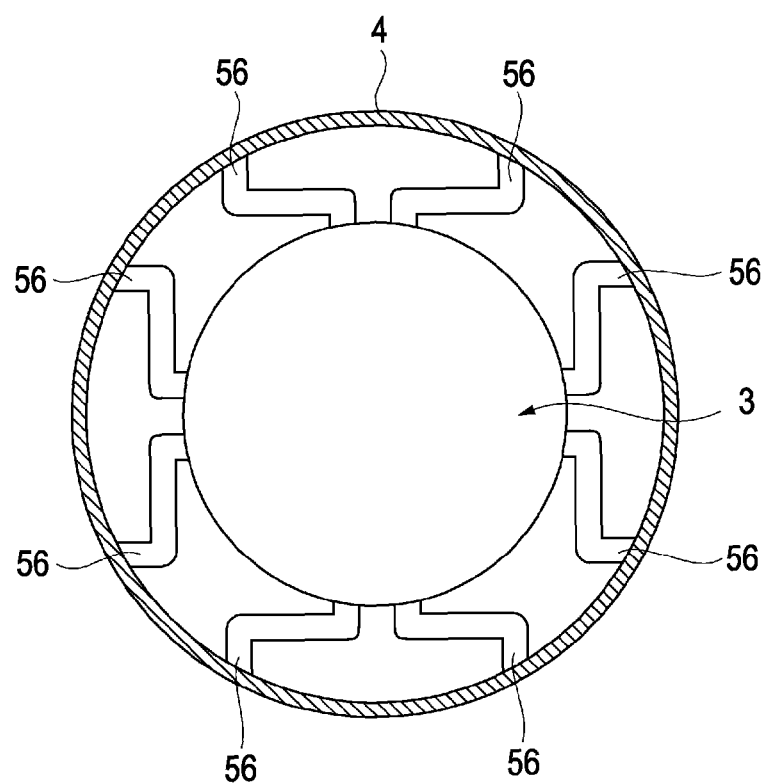
FIG. 17 is a cross-sectional view along line A-A in FIG. 16.
Figure 18:
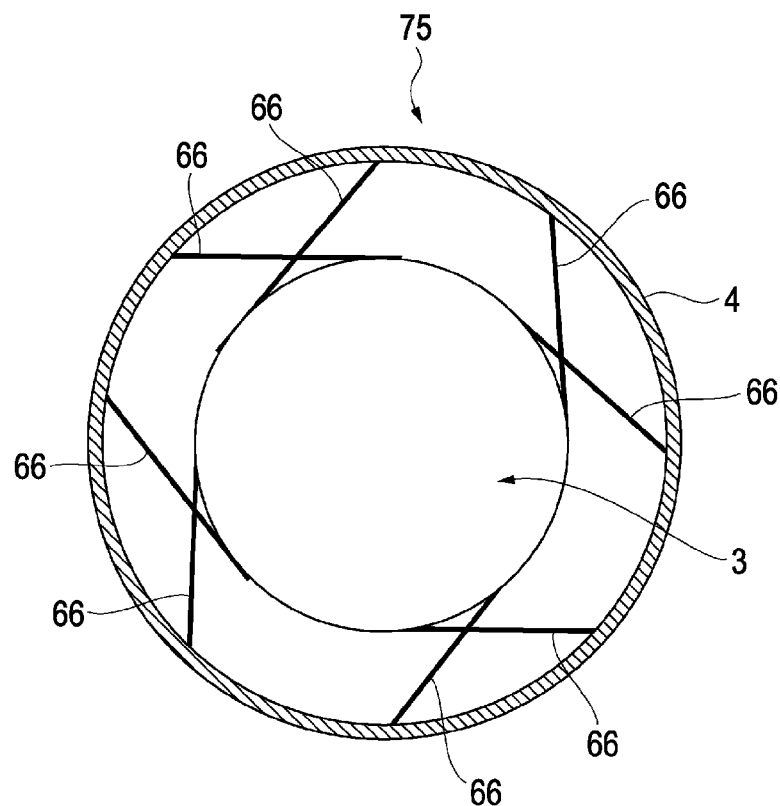
FIG. 18 is a cross-sectional view of a vibrating device according to yet another embodiment of the present invention.

FIG. 16 is a cross-sectional view illustrating a vibrating device according to yet another embodiment. FIG. 17 is a cross-sectional view along line A-A in FIG. 16. The damper 56 of this vibrating device 65 has, for example, a plate-spring shape. Also, as shown in FIG. 18, a damper 66 may have a wire shape. The dampers 56 and 66 are configured of such a relatively thin member, whereby the resistance of the original deflection in the vibrating direction can be reduced while preventing the lateral deflection of the vibrating member 3.

Figure 19:
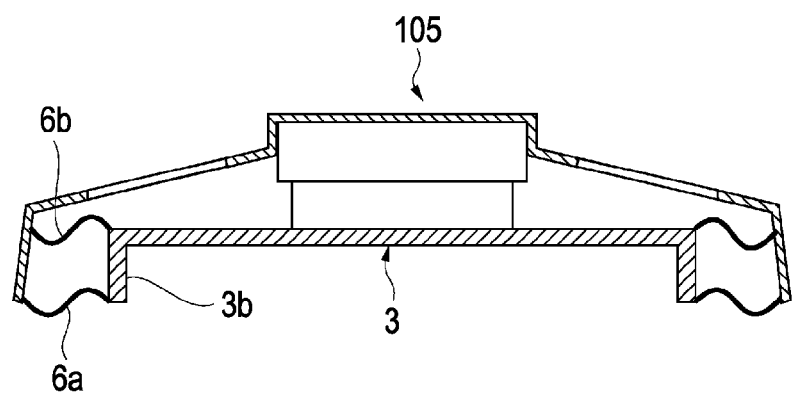
FIG. 19 is a cross-sectional view of a vibrating device according to yet another embodiment of the present invention.

The edge member 6a and damper 6b of the vibrating device 105 shown in FIG. 19 have the same shape, and also are made up of the same material. With such a configuration, the vibration of the vibrating member 3 can be stabilized. Also, the edge portion 6a and the damper 6b are the same, which are suitable for mass production, and also are reasonable in costs.

Figure 20:
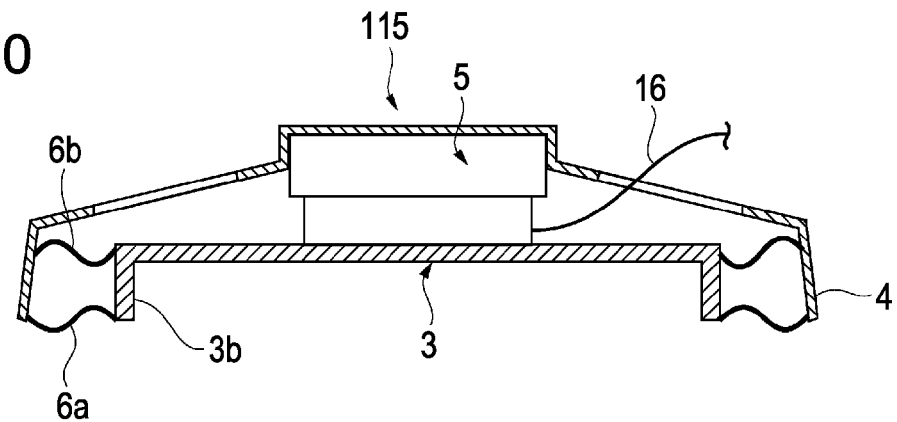
FIG. 20 is a cross-sectional view of a vibrating device according to yet another embodiment of the present invention.

The same articles are employed for the edge member 6a and the damper 6b of the vibrating device 115 shown in FIG. 20, which make up a symmetrical shape in the vibrating direction of the vibrating member 3. According to such a configuration, the amplitudes of both sides from the neutral position of the vibrating member 3 when the vibrating member 3 is not vibrated become the same, thereby obtaining effective vibration. Also, as shown in FIG. 20, in the event that a feeder line 16 is wired, a damper 6b serving as an elastic supporting member at the side close to the feeder line 16 is disposed such that the frame 4 side (outer side) becomes a peak portion, and the vibrating member 3 side (inner side) becomes a trough portion. Usually, with these edge member 6a and damper 6b, the amplitude of the vibrating member 3 side which is the inner side is greater than the amplitude of the frame 4 side which is the outer side. Accordingly, a trough portion is disposed at the vibrating member 3 side of which the amplitude is great, and accordingly, the space where the feeder line 16 moves due to vibration becomes wide, i.e., the flexibility of the movement of the feeder line 16 is improved, whereby line breakage can be prevented.

Figure 21:
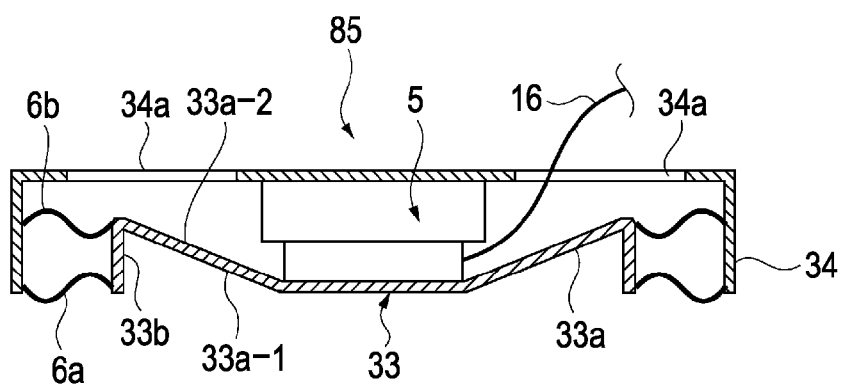
FIG. 21 is a cross-sectional view of a vibrating device according to yet another embodiment of the present invention.

FIG. 21 is a cross-sectional view illustrating a vibrating device according to yet another embodiment. This vibrating device 85 includes a cylindrical frame 34 as with FIG. 10. A vibrating plate 33a of a vibrating member 33 has a cone shape, and the actuator 5 is disposed on a face 33a-2 of the inner side of the cone-shaped vibrating plate 33a thereof. The side plate 33b of the vibrating member 33 is installed upright at a face 33a-1 side which is the opposite side of the face 33a-2. An edge portion 6a and a damper 6b are disposed between the side plate 33b and the frame 34 so as to make up a symmetrical shape. According to such a configuration, the vibrating device 85 can be extremely reduced in thickness.

Figure 22:
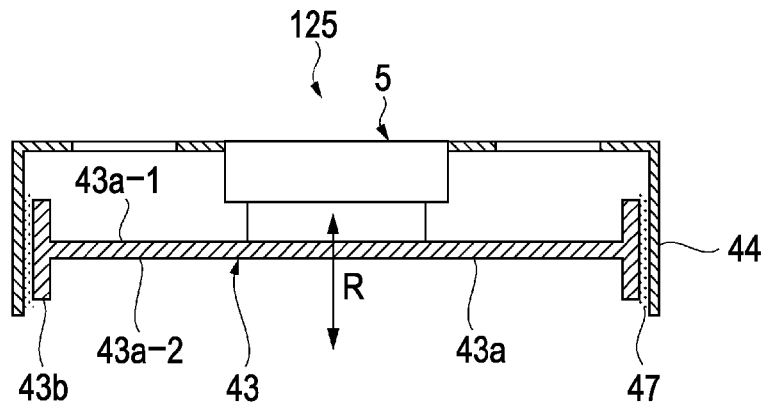
FIG. 22 is a cross-sectional view of a vibrating device according to yet another embodiment of the present invention.

FIG. 22 is a cross-sectional view illustrating a vibrating device according to yet another embodiment. This vibrating device 125 includes a vibrating member 43 which slides at the inner side of a cylindrical frame 44. The vibrating member 43 is configured so as to provide a side plate 43b which is installed upright at both sides of the vibrating direction R at the edge portion of a vibrating plate 43a. So to speak, the relation between the side plate 43b and the inner side of the frame 44 becomes the relation between a piston and a cylinder. With such a configuration, the vibrating member 43 can be vibrated in a stable manner while suppressing the lateral deflection and so forth of the vibrating member 43. In this case, in order to reduce frictional resistance as to the frame 44 of the side plate 43b, for example, it is preferred that a fluid 47 or the like such as lubricating oil is applied. Alternatively, at least one of the inner side of the frame 44, and the contact face of the side plate 43b may be subjected to surface treatment so as to reduce frictional resistance. Examples of this surface treatment include Teflon (registered trademark) processing.

Figure 23:
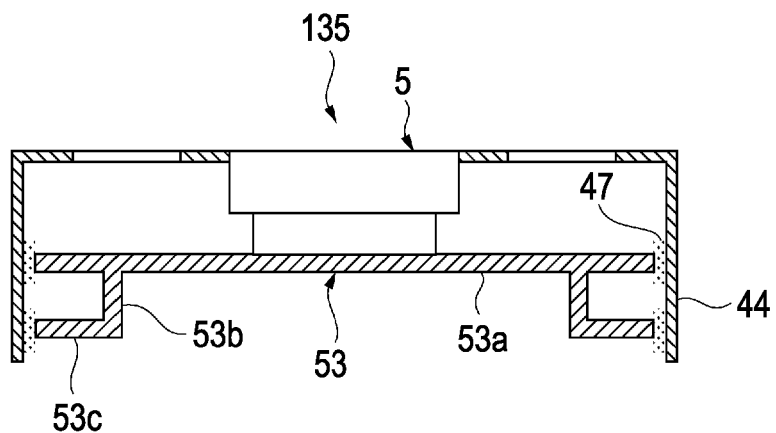
FIG. 23 is a cross-sectional view of a vibrating device according to yet another embodiment of the present invention.

The vibrating device 135 shown in FIG. 23 is a modification of the vibrating device 125 shown in FIG. 22. The edge portion of a vibrating plate 53a, and the edge portion of a protruding portion 53c such as a flange which protrudes in the diameter direction from a side plate 53b are in contact with the inner side of the frame 44. Thus, the contact area between a vibrating member 53 and the frame 44 can be reduced as small as possible, and accordingly, frictional resistance can be reduced.

With the vibrating device 125 shown in FIG. 22, the side plate 43b is not necessarily in contact with the frame 44, and accordingly, there may be simply provided a gap between both. This gap may be a gap which is sufficiently narrow so as to actually eliminate the communication of air between the front face 43a-1 side and the rear face 43a-2 side of the vibrating member 43. This can be applied to the vibrating device 135 shown in FIG. 23 as well.

Figure 24:
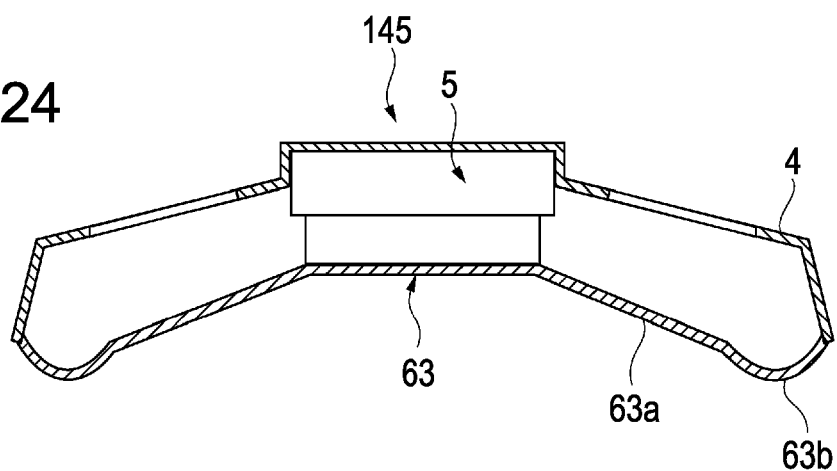
FIG. 24 is a cross-sectional view of a vibrating device according to yet another embodiment of the present invention.

FIG. 24 is a cross-sectional view illustrating a vibrating device according to yet another embodiment. With the vibrating member 63 of this vibrating device 145, an edge portion 63b is integrally provided at the edge portion of a cone-shaped vibrating plate 63a. For example, in the event that the vibrating member 63 is, for example, made up of a resin, the vibrating member 63 can be fabricated with injection molding, and also the number of parts can be reduced, which becomes advantageous in cost. Even in the event that the vibrating member 63 is, for example, made up of metal, the vibrating member 63 can be integrally molded with metal mold.

Figure 25:
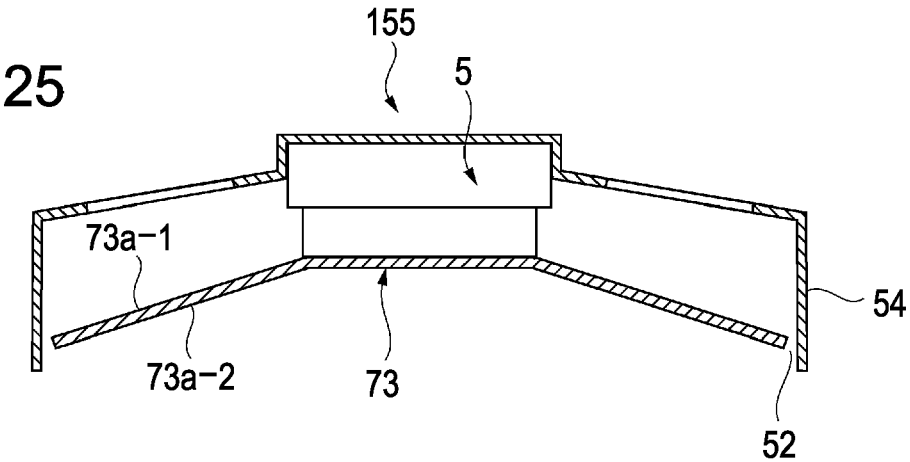
FIG. 25 is a cross-sectional view of a vibrating device according to yet another embodiment of the present invention.

FIG. 25 is a cross-sectional view illustrating a vibrating device according to yet another embodiment. The vibrating member 73 of this vibrating device 155 is made up of a cone-shaped vibrating plate. A gap 52 is provided between the edge portion of the vibrating member 73 and a frame 54. This gap 52 may be a gap which actually almost eliminates the communication of air between the front face 73a-1 side and the rear face 73a-2 side of the vibrating member 73.

Figure 26:
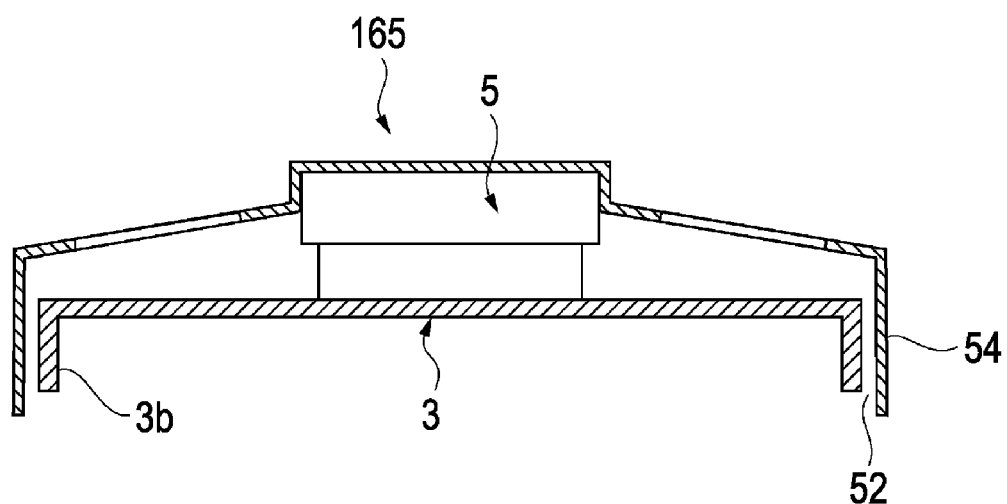
FIG. 26 is a cross-sectional view of a vibrating device according to yet another embodiment of the present invention.

FIG. 26 is a modification of the vibrating device 155 shown in FIG. 25. This vibrating device 165 includes the vibrating member 3 including the side plate 3b such as shown in FIG. 2 and the like, and gap 52 which is sufficiently narrow is provided between the side plate 3b and the frame 54.

Figure 27:
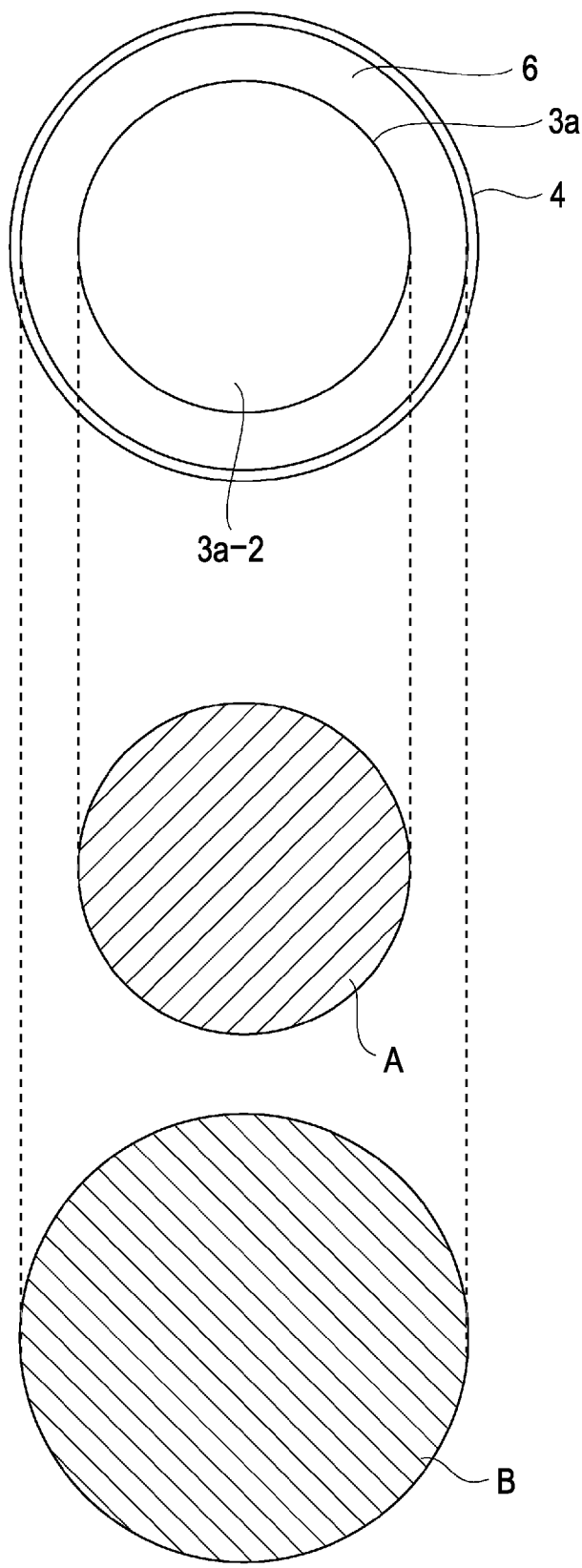
FIG. 27 is a plane view of the vibrating device shown in FIG. 2 from the opening end of the frame (lower side).

FIG. 27 is a plane view of each of the vibrating devices 15, 25, 35, and so forth which have been described so far as viewed from the opening end side (lower portion side) of the frame 4. For example, let us say that the area of the face 3a-1 or 3a-2 perpendicular in the vibrating direction of the vibrating plate 3a of the vibrating member 3 is an area A, and the area surrounded with the edge member 6 which is the portion within a face which is generally in parallel with the face 3a-1 or 3a-2 is an area B. In this case, it is preferable that the area B is equal to or smaller than 70% of the area A. In the event of exceeding 70%, the resistance of the vibration of the vibrating member becomes great, and also there is a possibility that noise becomes great. According to an experiment of the present inventors, upon exceeding 70%, noise began to become large enough to bother humans. Preferably, 60% or lower is desirable.

Figure 28:
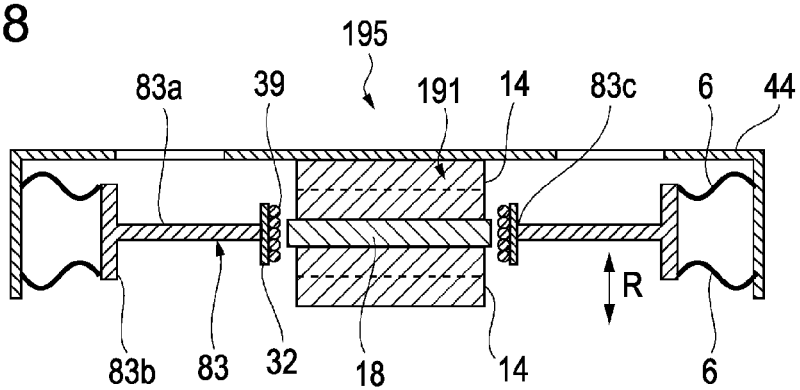
FIG. 28 is a cross-sectional view of a vibrating device according to yet another embodiment of the present invention.
Figure 29:
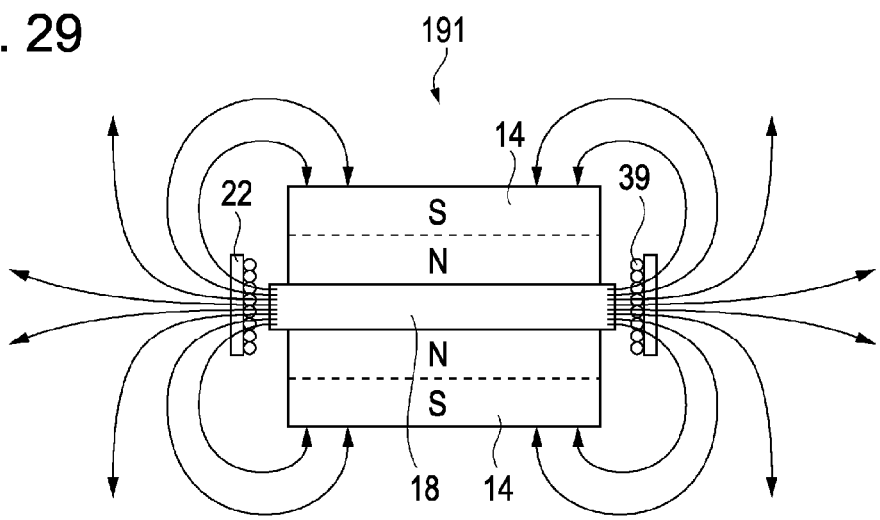
FIG. 29 illustrates a state of magnetic lines generated by a magnet and yoke of an actuator shown in FIG. 28.

FIG. 28 is a cross-sectional view illustrating a vibrating device according to yet another embodiment. A hole portion 83c is formed at the center of the vibrating member 83 of this vibrating device 195. An actuator 191 is made up of the two magnets 14, the plate-shaped yoke 18 sandwiched with the magnets 14, and the coil 39 wound around the cylindrical coil bobbin 32 implemented in the hole portion 83c. FIG. 29 illustrates the state of a magnetic force line generated at the magnet 14 and yoke 18 of the actuator 191. Employing such a release magnetic field makes the actuator 191 a symmetrical configuration as to a vibrating plate 83a with the vibrating direction R though efficiency is deteriorated as compared with the closed magnetic circuit described so far. With a symmetrical configuration, a sound level before and after the vibrating plate 83a can be made the same as much as possible, whereby canceling out of sound can be performed effectively with an opposite phase. Also, a symmetrical configuration is advantageous for reduction in thickness. Regarding whether the magnetic circuit is a closed system or open system may be selected by an application.

For example, the actuator 191 shown in FIG. 28 is advantageous in that the layout space of the actuator 5 can be reduced by the magnet 14 being disposed at the inner side of the voice coil (coil 39 and coil bobbin 32). This can be applied to the actuator 5 shown in FIG. 4 and so forth. However, with such an actuator 5 or 191, the magnet 14 is commonly designed small. When the magnet 14 is small, the magnetic flux density which crosses the voice coil becomes small. In order to increase the magnetic flux density at a voice coil even if the diameter of a magnet is small, it is necessary to employ a magnet of which the residual magnetic flux density is high. A magnet of which the residual magnetic flux density is equal to or greater than 0.3 T (tesla) is preferably employed. Further, in order to increase the magnetic flux density at the gap, a magnet having residual magnetic flux density which is equal to or greater than 1 T through 3 T is recommended. In the case of a magnet of which the residual magnetic flux density is not less than 1 T, the magnet has cooling capacity comparable as a rotation axial flow fan, and accordingly, the jet flow generating device which may be compared also in a size can be realized. For example, the residual magnetic flux density of a neodymium-iron is 1.1 T, so we can say that this is a magnet satisfying the above-mentioned request.

Figure 30:
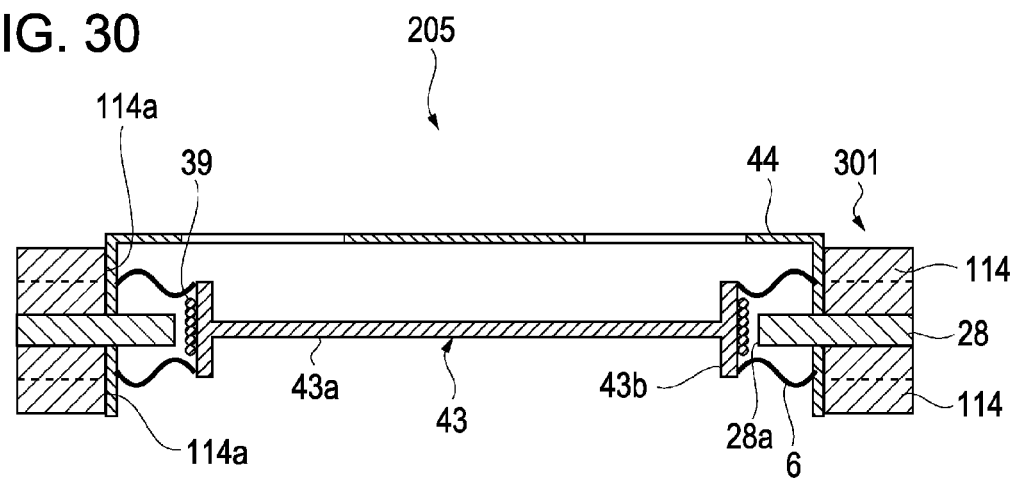
FIG. 30 is a cross-sectional view of a vibrating device according to yet another embodiment of the present invention.

FIG. 30 is a cross-sectional view illustrating a vibrating device according to yet another embodiment. The actuator 301 of this vibrating device 205 is configured such that a plate-shaped yoke 28 in which a hole 28a is formed is disposed so as to be sandwiched between two magnets 114 wherein the frame 44 is fitly attached to a hole 114a at the center. The diameter of the hole 28a of the yoke 28 is formed smaller than the diameter of the magnet 114. A vibrating member 43 is disposed around the hole 28a of the yoke 28, the coil 39 is wound around the outer circumferential face of the side plate 43b of the vibrating member 43. According to such a configuration, a comparatively great magnet can be employed as the magnet 114. Therefore, magnetic force can be increased, and consequently vibration can be increased. Also, a symmetrical configuration can be applied to the vibrating plate 43a. Also, this can be contributed to reduction in thickness.

Figure 31:
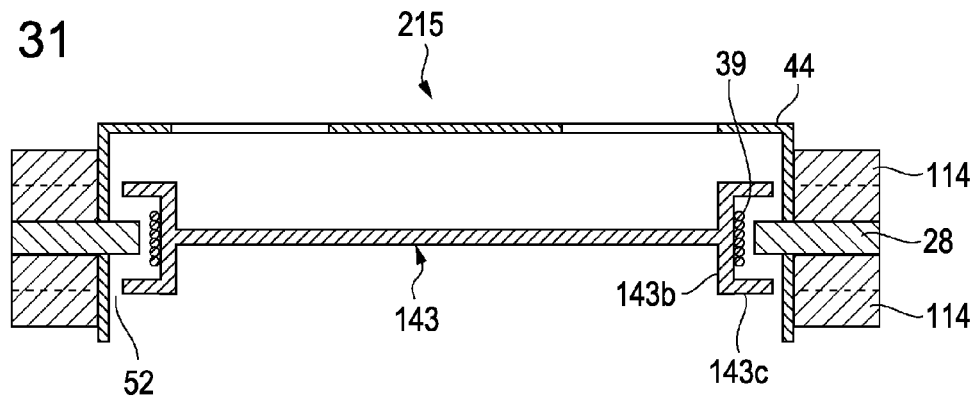
FIG. 31 is a cross-sectional view of a vibrating device according to yet another embodiment of the present invention.

FIG. 31 is a cross-sectional view illustrating a modification of the vibrating device 205 shown in FIG. 30. The vibrating member 143 of this vibrating device 215 includes a flange-shaped protruding portion 143c as with the vibrating member 53 shown in FIG. 23. The edge portion of this protruding portion 143c is slidably connected to the inner side of the frame 44. Also, the gap 52 is provided, or a lubricant is applied to the gap 52. Even with such a configuration, the same advantages as the vibrating devices shown in FIG. 23 and FIG. 31 can be obtained.

Figure 32:
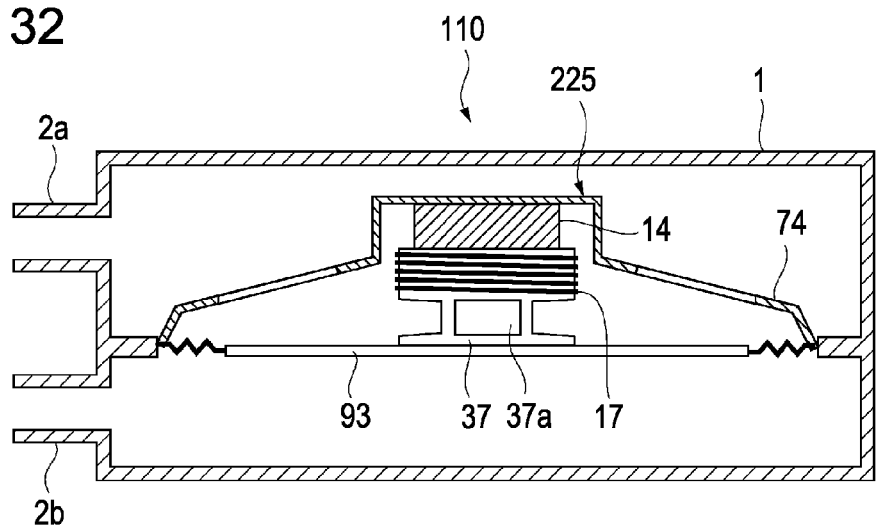
FIG. 32 is a cross-sectional view of a jet flow generating device having a vibrating device according to yet another embodiment of the present invention.

FIG. 32 is a cross-sectional view illustrating a jet flow generating device including a vibrating device 225 according to yet another embodiment. With this vibrating device 225, the cylindrical coil bobbin 37 around which the coil 17 is wound is provided with multiple air communication openings 37a configured to communicate air between the inner side and outer side of the coil bobbin 37 thereof. The volume of the space between the coil bobbin 37 and the magnet 14 (the space at the inner side of the coil bobbin 37) is changed by the coil bobbin 37 moving. In the event that the coil bobbin 37 has no air communication opening 37a, change in atmospheric pressure of the inner space of the coil bobbin 37 becomes the vibration resistance of a vibrating member 93. Also, in the even that there is no air communication opening 37a, air escapes by passing through the narrow gap between the magnet 14 and the coil bobbin 38, so at this time there is a possibility that sound is generated. However, with a configuration such as shown in FIG. 32, the air present in the inner space of the coil bobbin 37 can escape to the outside of the coil bobbin 37 via the air communication openings 37a, whereby the vibrating member can be vibrated effectively. Also, noise can be reduced. The number of the air communication openings 37a may be one. The shapes of the air communication openings 37a may be a circle such as shown in FIG. 33, or a slot shape.

Figure 33:
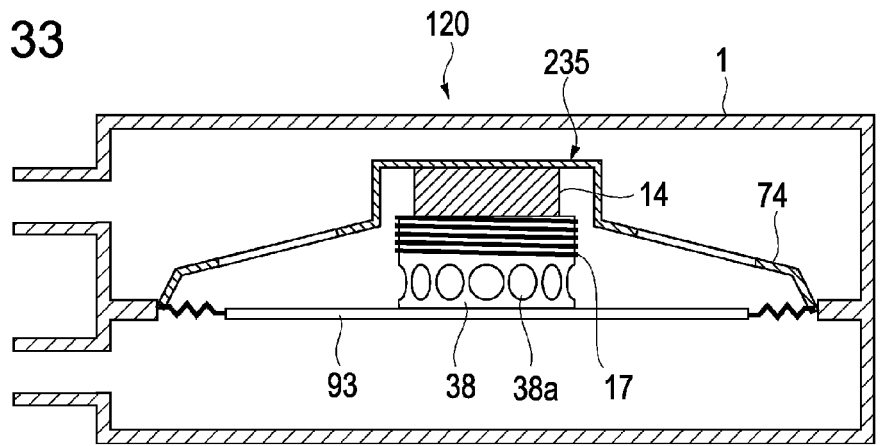
FIG. 33 is a cross-sectional diagram illustrating a modification of the jet flow generating device shown in FIG. 32.

Note that in FIG. 32 and FIG. 33, the vibrating member 93 is made up of a plate-shaped vibrating plate, but it is needless to say that like the above-mentioned embodiments, a configuration wherein a side plate is provided may be employed.

Figure 34:
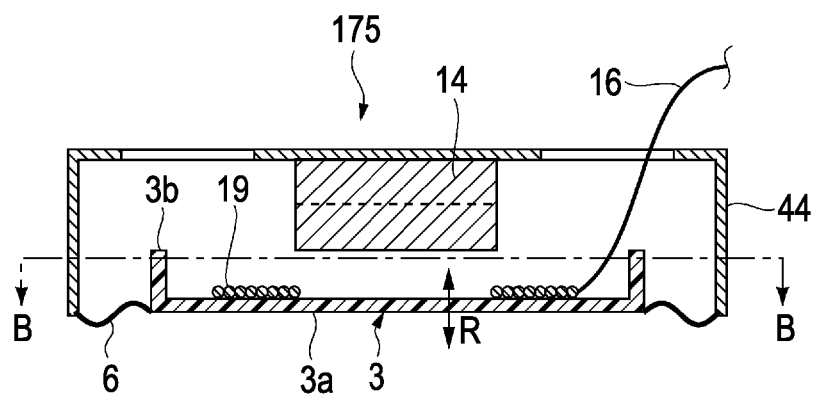
FIG. 34 is a cross-sectional view of a vibrating device according to yet another embodiment of the present invention.
Figure 35:
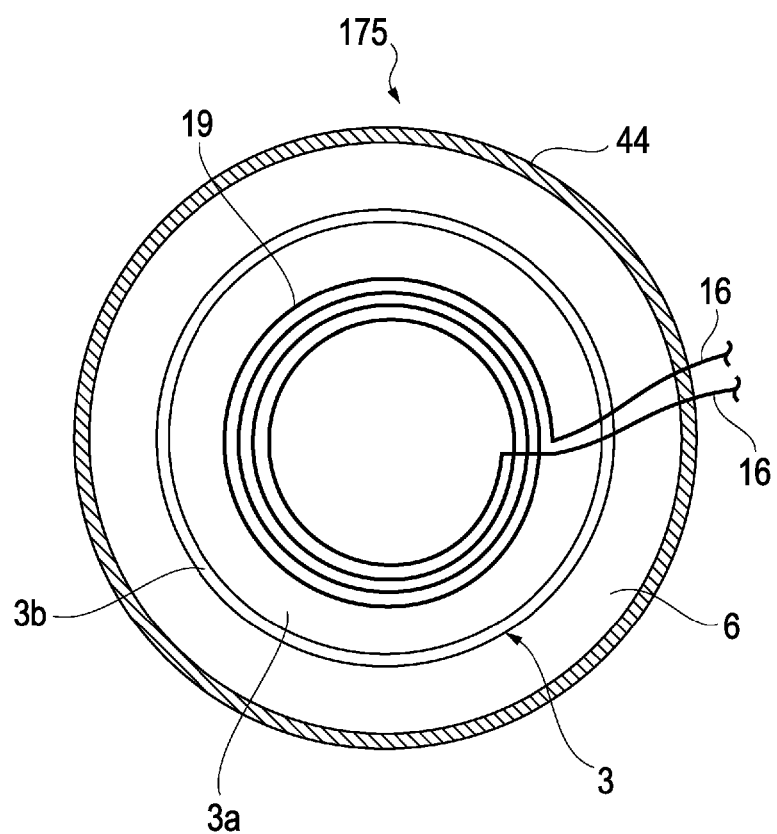
FIG. 35 is a cross-sectional view along line B-B in FIG. 34.

FIG. 34 is a cross-sectional view illustrating a vibrating device according to yet another embodiment. FIG. 35 is a cross-sectional view along line B-B in FIG. 34. The actuator of this vibrating device 175 is made up of the magnet 14 attached to generally the center at the inner side of the cylindrical frame 44, and the plane coil 19 disposed on the vibrating plate 3a of the vibrating member 3 so as to face the magnet 14. The coil 19 is connected with the feeder line 16. The vibrating member 3 is preferably an insulating material such as a resin, rubber, paper, or the like. Alternatively, in the event that the vibrating member 3 is made up of a conductive material, for example, an unshown insulating sheet may be adhered to between the vibrating plate 3a and the coil 19. For example, AC voltage is applied to the coil 19, which causes the magnet 14 to generate a release magnetic field, whereby the vibrating member 3 is vibrated in the vibrating direction R. With the present embodiment, a release magnetic field is employed, which deteriorates magnetic flux density, but is advantageous for reduction in thickness, and formation of a symmetrical shape.

Figure 36:
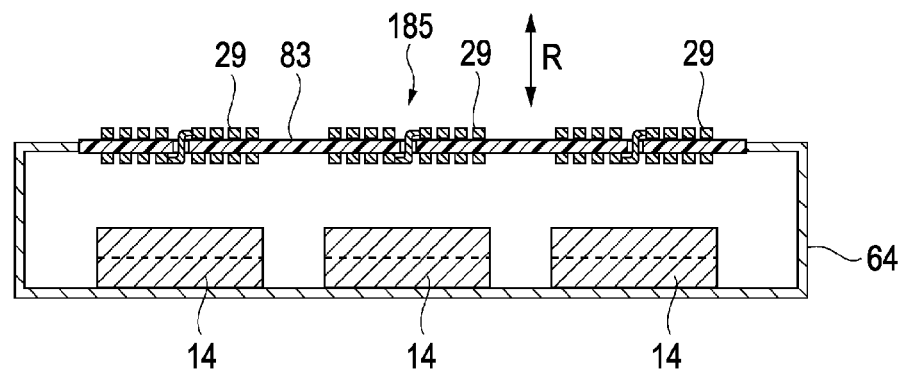
FIG. 36 is a cross-sectional view of a vibrating device according to yet another embodiment of the present invention.
Figure 37:
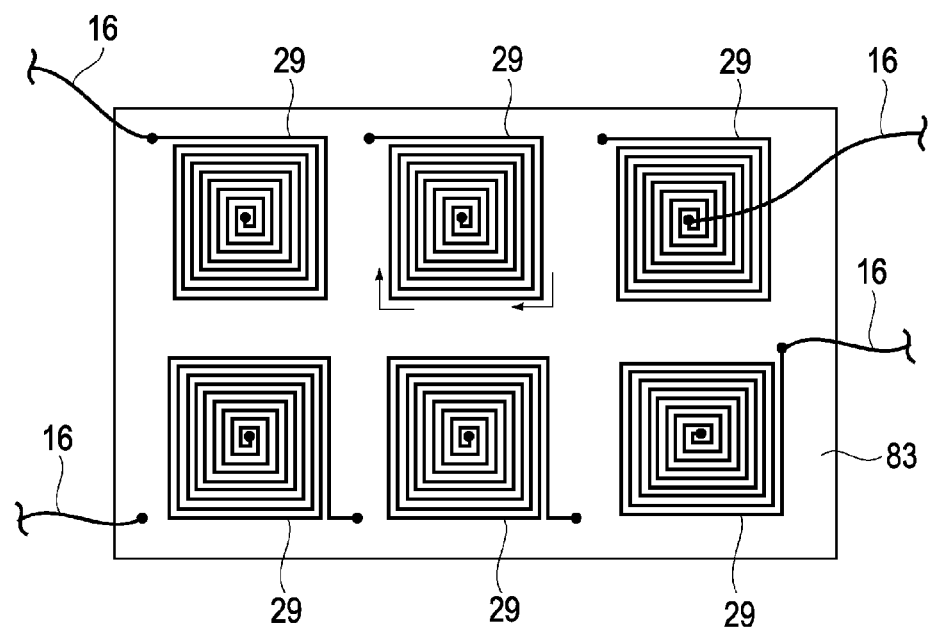
FIG. 37 is a plane view of a vibrating member shown in FIG. 36.

FIG. 36 is a cross-sectional view illustrating a vibrating device according to yet another embodiment. FIG. 37 is a plane view illustrating the vibrating member thereof. The actuator of this vibrating device 185 includes the multiple magnets 14 arrayed within a frame 64, and multiple plane coils 29 each disposed on a plate-shaped vibrating member 83 so as to face each magnet 14. In this example, the six coils 29 and the six magnets 14 are provided. Even with such an actuator, the vibrating member 83 can be vibrated in the vibrating direction R with a release magnetic field in the same way as described above. According to such a configuration, the number of the coils 29 and the number of the magnets 14 are selected as appropriate, whereby the size of the vibrating member 83 can be set to a desired size within a face generally perpendicular to the vibrating direction R.

Figure 38:
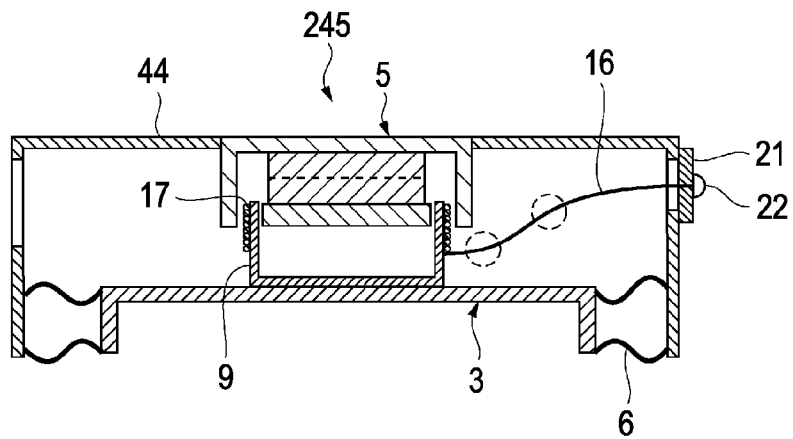
FIG. 38 is a cross-sectional view of a vibrating device (a vibrating device to which a bent feeder line has been wired) according to yet another embodiment of the present invention.
Figure 41A:
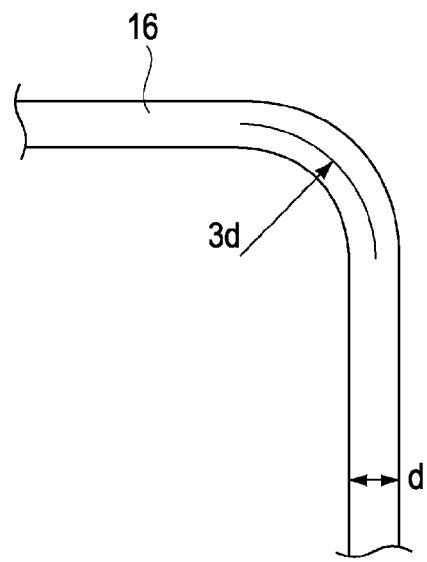
FIG. 41A is an enlarged diagram illustrating a bent portion of the feeder line.
Figure 41B:
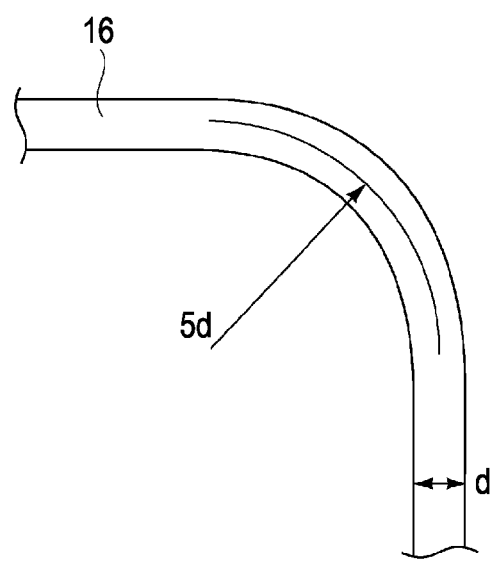
FIG. 41B is an enlarged diagram illustrating a bent portion of the feeder line.

FIG. 38 is a cross-sectional view illustrating a vibrating device according to yet another embodiment. The feeder line 16 connected to the actuator 5 of this vibrating device 245, for example, such as a portion surrounded with a dashed line in the drawing, is bent gently. Thus, the feeder line is bent gently, whereby possibility of line breakage can be made small, for example, as compared with the rapid bending of the feeder line shown in the dashed line in FIG. 39. For example, as shown in FIG. 41A, in the event that the minimum bending diameter of the feeder line 16 is about three times of thickness d thereof, stress concentrates on the bending portion thereof and line breakage readily occurs. However, line breakage decreases by setting the minimum bending diameter of the feeder line to five times or more of the thickness d such as shown in FIG. 41B.

The feeder line 16 is vibrated, and accordingly needs to be able to resist line breakage over the life of the vibrating device 245 and so forth. With the jet flow generating device, the life of tens of thousands of hours is required, and the total vibration frequency becomes billions of times. Therefore, it is desirable to fix the feeder line with a portion where the coil bobbin 9 side is attached, and a portion where the frame 44 side is attached. Accordingly, with the vibrating device 245, a terminal block 21 where a terminal 22 is provided is fixed to the frame 44, and the feeder line 16 is connected and fixed to this terminal block 21. Thus, line breakage is prevented, and also wiring at the time of manufacturing of a jet flow generating device in which the vibrating device 245 is implemented is facilitated.

Figure 40:
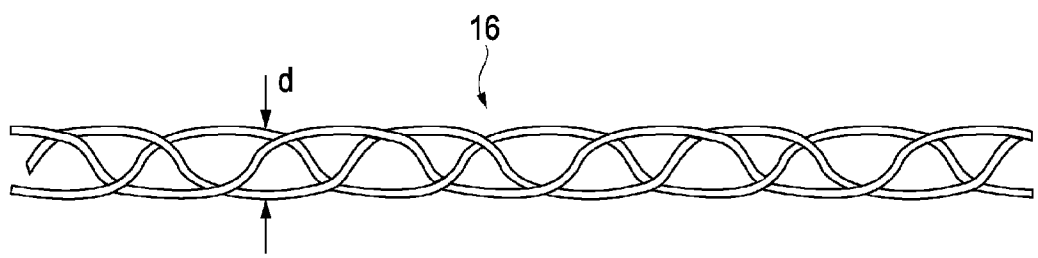
FIG. 40 is an enlarged view illustrating a feeder line which has been braided.

Also, in order to prevent the line breakage of the feeder line 16, for example as shown in FIG. 40, a lead wire or the like wherein the feeder line 16 is subjected to braiding can be employed. Also, a robot cable wherein thin conductive wires are covered with an insulating film, and bundled, is resistant to bending, and suitable as a feeder line.

In the event that a feeder line such as shown in FIG. 40 is employed, the thickness d thereof is preferably 0.4 mm or thicker. With common speakers, a speaker of which the amplitude is 5 mm or so is a so-called woofer. With a prototype made by the present inventors, a 0.3-mm lead wire for tweeters has been used, and the life thereof has been extremely short, but upon a 0.4-mm lead wire having been employed instead of the 0.3-mm lead wire, the life thereof was extended markedly. Although 14,000 hours have elapsed in a continuous test, the 0.4-mm lead wire has not yet broken.

The feeder line 16 has a particular configuration as described above. Accordingly, with wiring from a portion which sends electric power to the vibrating device, and wiring from the portion which sends power to the jet flow generating device, it is rational to employ another usual conductive wire other than the feeder line 16 having the above-mentioned configuration. Therefore, providing the terminal block 21 is very advantageous. The attachment position of the terminal block 21 may be the frame 44 of the vibrating device 245 such as shown in FIG. 38. Alternatively, such as later-described FIG. 42 and so forth, the terminal block 21 may be attached to the housing 131 of the jet flow generating device 130.

Figure 42:
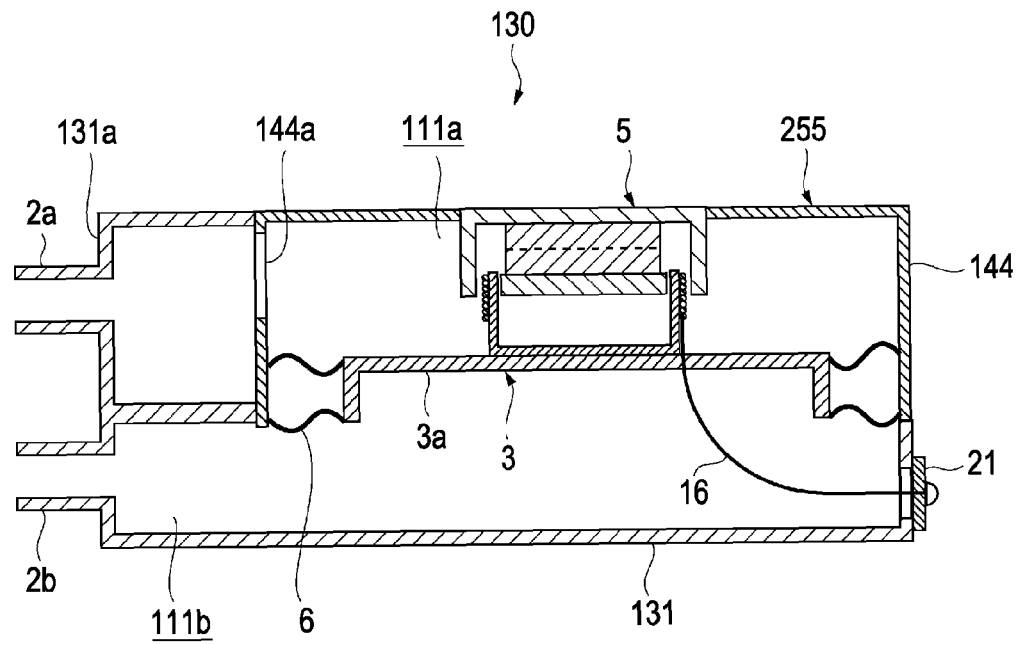
FIG. 42 is a cross-sectional view of a jet flow generating device according to another embodiment of the present invention.

FIG. 42 is a cross-sectional view illustrating a jet flow generating device according to yet another embodiment. Part of the frame 144 of the vibrating device 255 implemented in this jet flow generating device 130 also serves as the function of the housing 131 of the jet flow generating device 130. That is to say, part of the housing 131 is notched, and the vibrating device 255 is attached to the notched portion thereof. An air communication opening 144a is formed at the side face of the frame 144 around the front face 131a of the housing 131. Thus, part of the housing 131 is configured of the frame 144, whereby the jet flow generating device 130 can be reduced in thickness and size.

In this case, if the housing 131 and the frame 144 are made up of a material of which the thermal conductivity is excellent, these are advantageous for radiation such as the actuator 5 and so forth. Examples of a material having high thermal conductivity include metal such as copper, aluminum, or the like, and a carbon resin or the like.

Further, the feeder line 16 of this jet flow generating device 130 extends at the opposite side of the side where the actuator 5 is provided as to the vibrating plate 3a. Also, only the space due to the chamber 111b formed in the housing 131 is provided on the space at the opposite side of the actuator 5, which facilitates wiring, and also as described above, the bending radius of the feeder line 16 can be increased.

Note that the vibrating device 25 having a cylindrical frame shown in the above-mentioned FIG. 10, FIG. 21, FIG. 22, FIG. 23, and so forth as well, as shown in FIG. 42, can be implemented in the jet flow generating device so as to also serve as the function of the housing 131 of the jet flow generating device.

Also, with the jet flow generating device 130, the terminal block 21 is preferably attached to the side face of the housing 131. When the attachment portion is not the side face but the top face or under face, in the event that the jet flow generating device 130 is implemented in an unshown electronic device, for convenience of the wiring of a conductive wire from the portion which supplies power to the terminal block 21, there is the need to provide space around the top face or under face thereof, which causes a restriction at the time of implementation. Also, this is contrary to reduction in thickness. Accordingly, the side face is better than the top face and the under face. However, of course, even if such space is provided, there is no problem depending on the design at the electronic device side in some cases.

Figure 43:
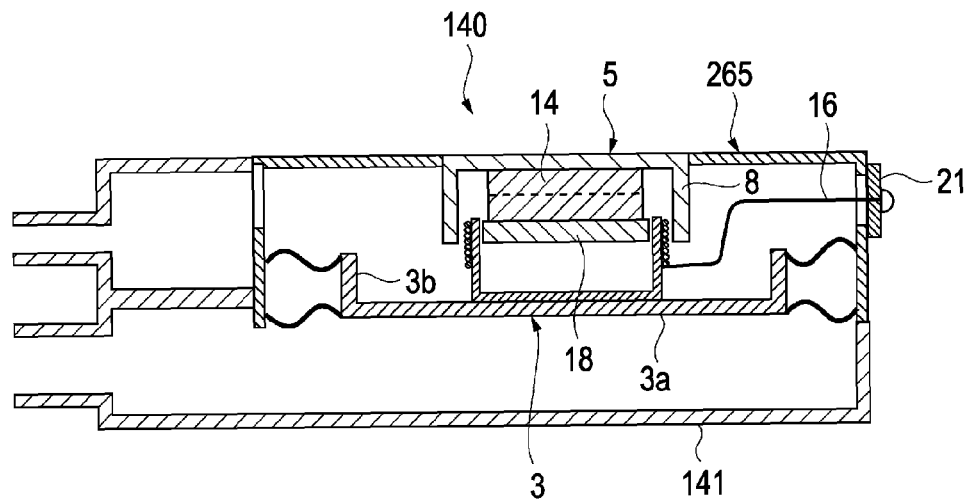
FIG. 43 is a cross-sectional view of a jet flow generating device according to yet another embodiment.

With the jet flow generating device 130 shown in FIG. 42, the actuator 5 side is not so complicated a shape, either. However, for example, in order to realize reduction in thickness regarding the jet flow generating device, as with the vibrating device 265 shown in FIG. 43, the actuator 5 needs to be disposed at the side where the side plate 3b of the vibrating member 3 is installed upright. In this case, the configuration of the side where the actuator 5 is disposed becomes complex, the feeder line 16 is wired to the terminal block 21 while avoiding the yoke 8 and the side plate 3b, and consequently, the bending radius thereof becomes small. Particularly, with a configuration such as the jet flow generating device 140 shown in FIG. 43, in order to increase the efficiency of the magnetic circuit of the actuator 5, the magnetic flux density of the voice coil portion needs to be increased. Therefore, the magnet 14 needs to be increased in size, but in this case, the interval between the yoke 8 and the side plate 3b is reduced, and accordingly, the space where the feeder line 16 passes through becomes narrow. That is to say, providing the feeder line 16 at the actuator 5 side is disadvantageous for improving the efficiency of the actuator 5.

Figure 44:
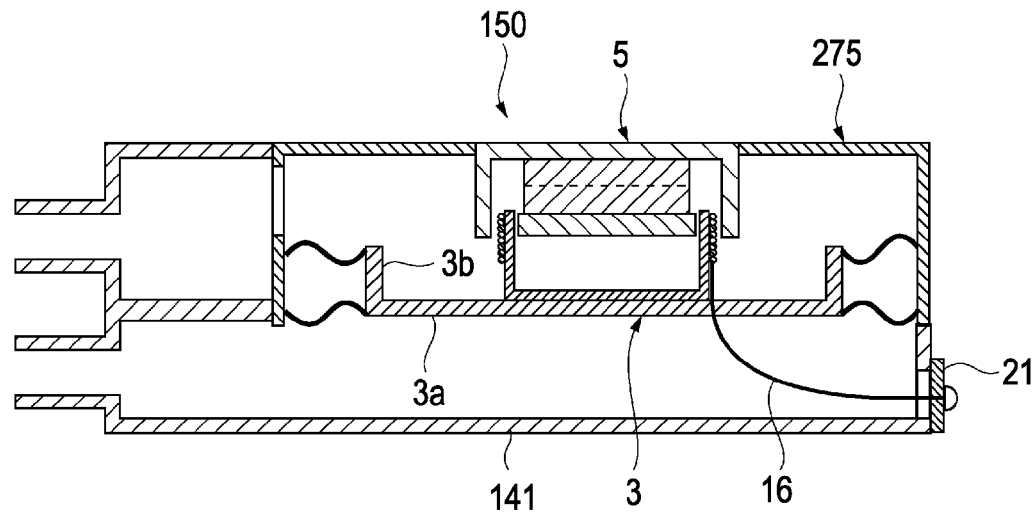
FIG. 44 is a cross-sectional view of a jet flow generating device according to yet another embodiment.

Consequently, as shown in FIG. 44, the feeder line 16 is extracted to the opposite side of the side where the vibrating plate 3a of the vibrating member 3 and the actuator 5 are disposed, and wired, whereby the above-mentioned problem can be eliminated. In this case, the terminal block 21 is also disposed at the lower side than the vibrating plate 3a.

Figure 45:
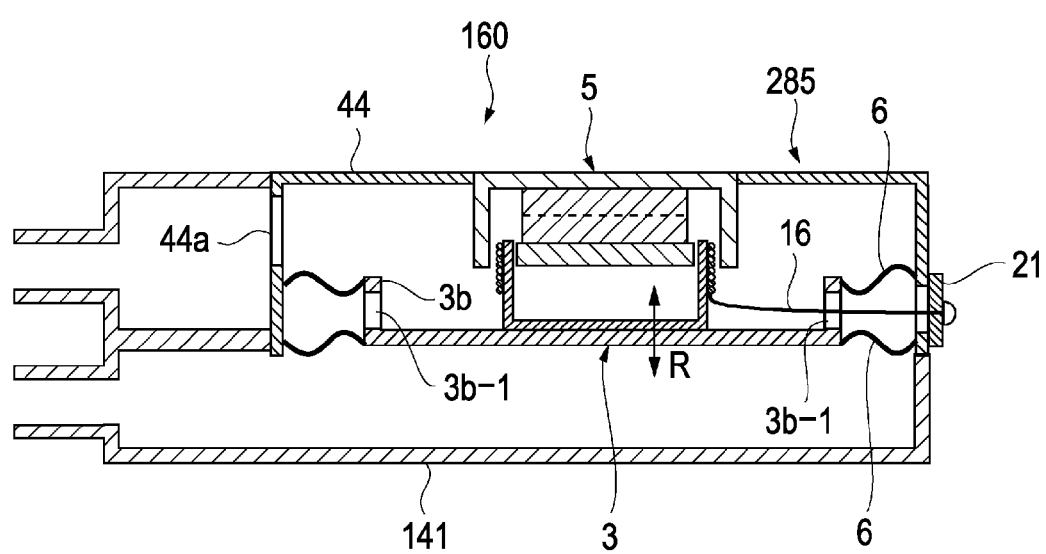
FIG. 45 is a cross-sectional view of a jet flow generating device according to yet another embodiment.

FIG. 45 is a cross-sectional view illustrating a jet flow generating device according to yet another embodiment. With this jet flow generating device 160, a hole 3b-1 through which the feeder line 16 passes is provided in the side plate 3b of the vibrating member 3. The feeder line 16 passes through between the two elastic supporting members 6, and is connected to the terminal block 21. According to such a configuration, it is avoidable to wire the feeder line 16 in the inside of a complicated configuration such as described above, thereby facilitating manufacturing. The number of the holes 3b-1 is not restricted to one, multiple holes 3b-1 may be provided, and also the shape of the hole 3b-1 may be a slot shape. Thus, at the time of manufacturing the vibrating device 285, the restriction of the attachment angle direction of the vibrating member 3 (the rotation angle direction of the vibrating member 3 itself at the face generally perpendicular to the vibrating direction R of the vibrating member 3) can be eased or eliminated. This is because in the event of the single hole 3b-1, the vibrating member 3 needs to be disposed so as to cause the hole 3b-1 thereof to face the terminal block 21.

Figure 46:
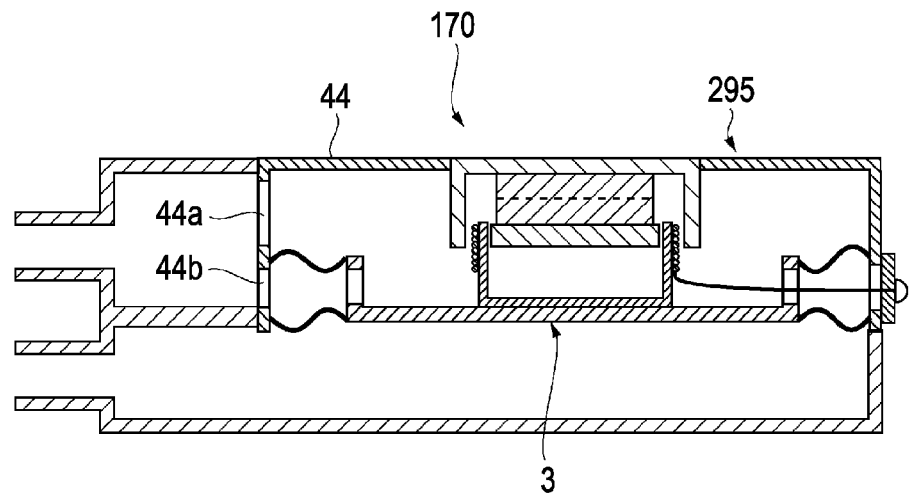
FIG. 46 is a cross-sectional view of a jet flow generating device according to yet another embodiment.

FIG. 46 is a modification of the jet flow generating device 160 shown in FIG. 45. With the frame 44 of the vibrating device 295 of this jet flow generating device 170, another air communication opening 44a which differs from the air communication opening 44a is opened. According to this air communication opening 44b, when the vibrating member 3 is vibrated, the air within the frame 44 escapes via the air communication openings 44a and 44b, the flow of air becomes smoother. Also, thus, noise is reduced. In other words, the air resistance when an air flow is generated is reduced within the frame 44 as less as possible, and accordingly, the opening area of the air communication holes formed in the frame 44 is preferably great as much as possible. With experimentation by the present inventors, it has been confirmed that in the case of the air communication opening 44b being provided, noise level decreased by 3 dB or so as compared with the case of no air communication opening 44b being provided.

Figure 47:
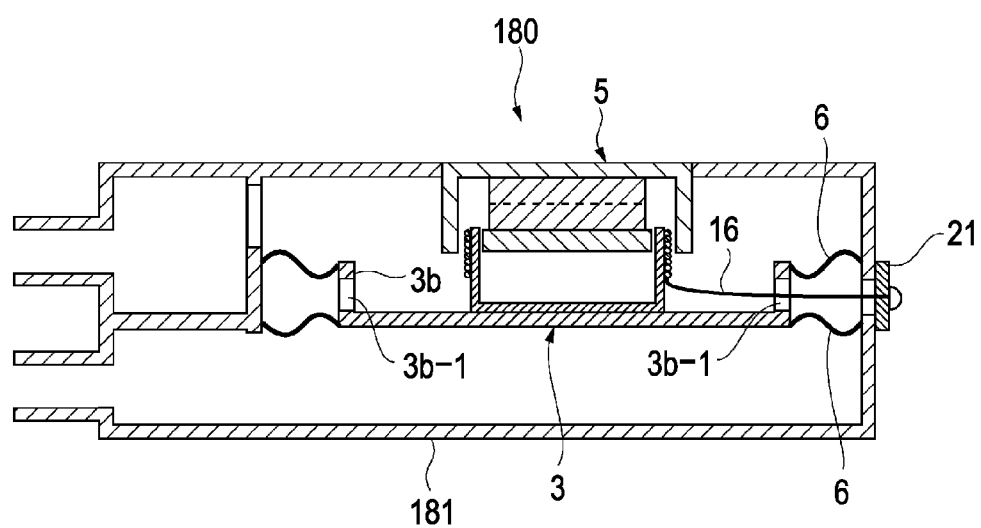
FIG. 47 is a cross-sectional view of a jet flow generating device according to yet another embodiment.

FIG. 47 is a cross-sectional view illustrating a jet flow generating device according to yet another embodiment. The features of this jet flow generating device 180 are in that there is no frame of a vibrating device such as described so far. That is to say, the frame thereof is integrated with the housing 181 of the jet flow generating device 180. According to such a configuration, further reduction in thickness regarding the jet flow generating device 180 can be realized, the number of parts can also be reduced, and also the integral molding of the housing facilitates manufacturing, which is advantageous for mass production.

Figure 48:
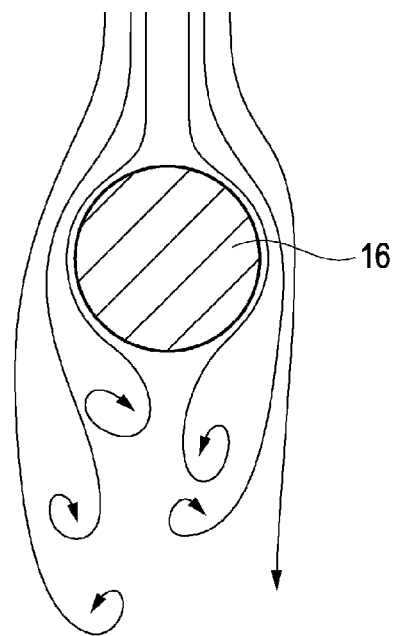
FIG. 48 is a diagram illustrating an airflow in a case wherein the cross-sectional shape of the feeder line is a circle.
Figure 49:
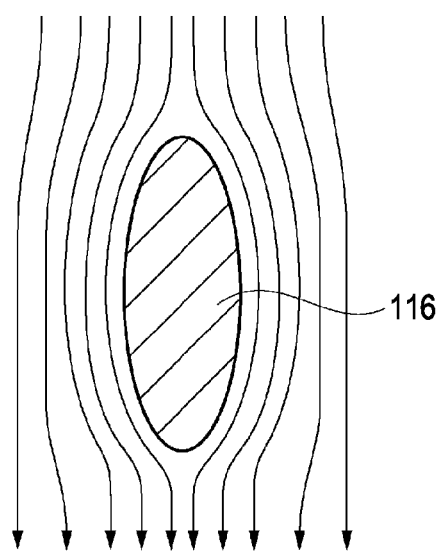
FIG. 49 is a diagram illustrating an airflow in a case wherein the cross-sectional shape of the feeder line is a flattened.

The cross-sectional shape of the feeder line 16 such as described above can be made circular such as shown in FIG. 48, but when the vibrating member 3 is vibrated, there is a possibility that turbulence may occur in the backside of the feeder line 16 as shown in the drawing. However, as shown in FIG. 49, an air flow can be smoothly controlled if the cross-sectional shape is made into a flat shape. In the case of FIG. 49, it is necessary to take the direction of the cross-sectional shape of the feeder line 16 into consideration at the time of wiring so as to generate an air flow in the direction such as shown in FIG. 49.

Note that an arrangement may be made wherein electric power is supplied with the vibrating member 3 and the elastic supporting member 6 as conductive materials without providing a feeder line such as described above.

Figure 50:
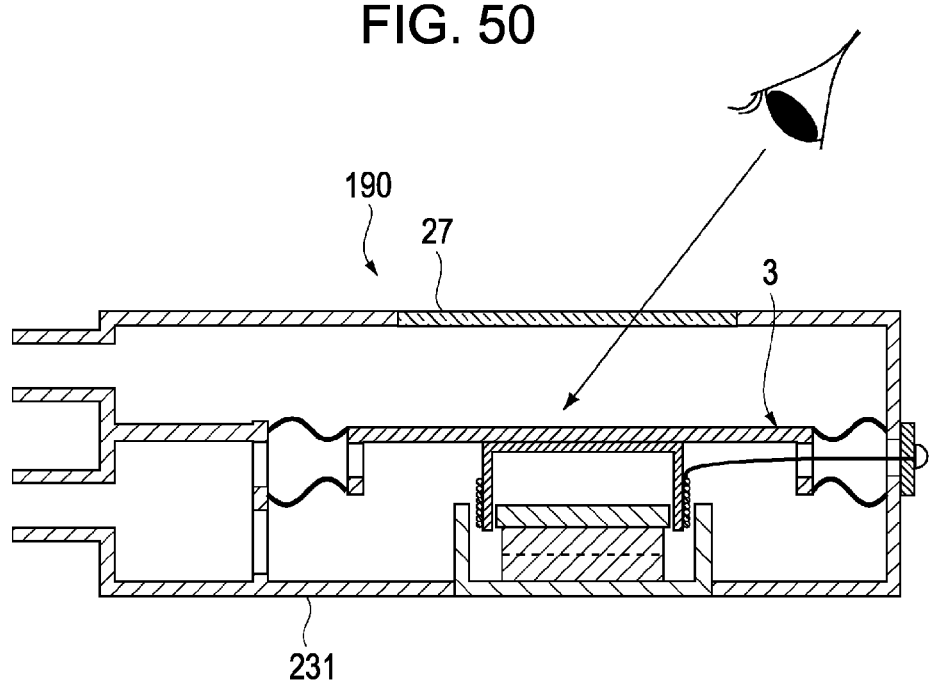
FIG. 50 is a cross-sectional view of a jet flow generating device according to yet another embodiment.

FIG. 50 is a cross-sectional view illustrating a jet flow generating device according to yet another embodiment. With this jet flow generating device 190, a transparent peephole (lid) 27 is provided on the under face of the housing 181 of the jet flow generating device 180 shown in FIG. 47 and others. The peephole 27 is made up of a resin or glass or the like. According to such a configuration, a manufacturer who manufactures the jet flow generating device 190 can view the interior of the housing 231, which facilitates the determination at the time of a defect. The transparency of the peephole 27 may be transparency which visible light penetrates, and the transmittance of the visible light in this case may be not less than 80%, but of course may be lower than that.

Figure 51:
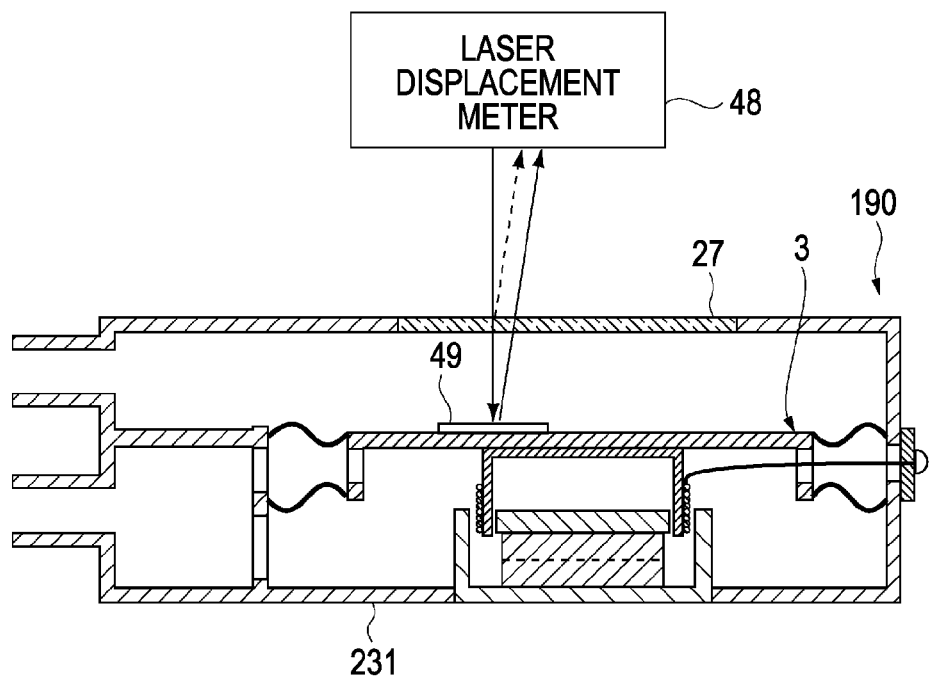
FIG. 51 is a cross-sectional view of a jet flow generating device according to yet another embodiment.

Additionally, as shown in FIG. 51, the amplitude, frequency, vibration waveform, and so forth of the vibrating member 3 can be observed using a laser displacement meter 48 or the like, which is particularly convenient at the time of debugging. Also, in the event that an unshown antireflection film or the like is stuck on both faces of the peephole 27, unnecessary reflection such as an arrow shown in a dashed line is reduced, and consequently, a measurement error at the laser displacement meter 48 becomes small. At the time of such measurement, it is convenient to stick a member 49, which promotes the reflection of light, on the vibrating member 3. Note that the peephole 27 may be omitted, or an arrangement may be made wherein a peephole is simply formed on the housing 231.

Figure 52:
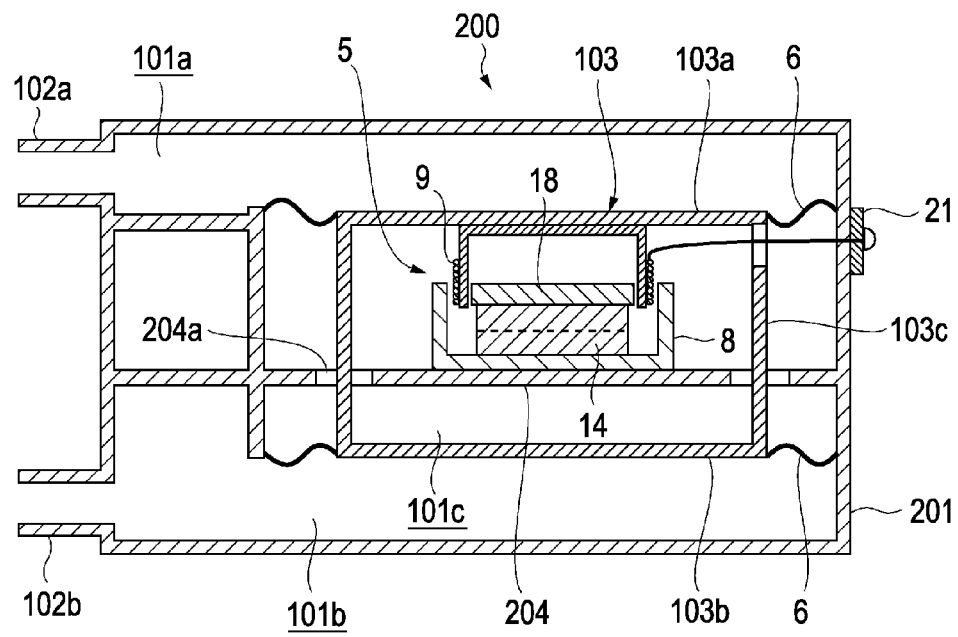
FIG. 52 is a cross-sectional view of a jet flow generating device according to yet another embodiment.

FIG. 52 is a cross-sectional view illustrating a jet flow generating device according to yet another embodiment. The vibrating member 103 of this jet flow generating device 200 is a cylindrical shape, and the actuator 5 is disposed therein. The top plate 103*a* and under plate 103*b* of the vibrating member 103 each have the functions of a vibrating plate, and a side plate 103*c* is provided. The actuator 5 is mounted on a partition plate 204 which is disposed within a housing 201, and is fixed to the housing 201. Specifically, the yokes 8 and 18 in which the magnet 14 has been built in are fixed to the partition plate 204 thereof, and the coil bobbin 9 is fixed to the inner face of the vibrating member 103. The partition plate 204 is provided with an annular opening 204*a* configured to allow the side plate 103*c* of the vibrating member 103 to pass through the annular opening 204*a*. Space serving as a chamber 101*a* and space serving as a chamber 101*b* are only located outside the vibrating member 103. Space 101*c* of the inside of the vibrating member 103, and the chamber 101*a* and chamber 101*b* are isolated. Accordingly, the gas within the housing 201 outside the vibrating member 103 can be jetted outside the housing 201 smoothly effectively via nozzles 102*a* and 102*b*.

Also, noise can also be reduced as a result of an air flow becoming smooth. Actually, for example, with a configuration such as shown in FIG. 47, there is difference between a noise level output from a nozzle at the side where the actuator 5 is provided and a noise level output from a nozzle at the side where the actuator 5 is not provided. With a trial manufacture by the present inventors, noise at the side where the actuator is not provided has been smaller than noise at the side where the actuator is provided by 10 dB or so at the peak of noise spectrum. With the jet flow generating device 200, the actuator 5 is not provided in the chambers 101*a* and 101*b* which communicate the nozzles 102*a* and 102*b* respectively, and accordingly, noise is suppressed.

Figure 53:
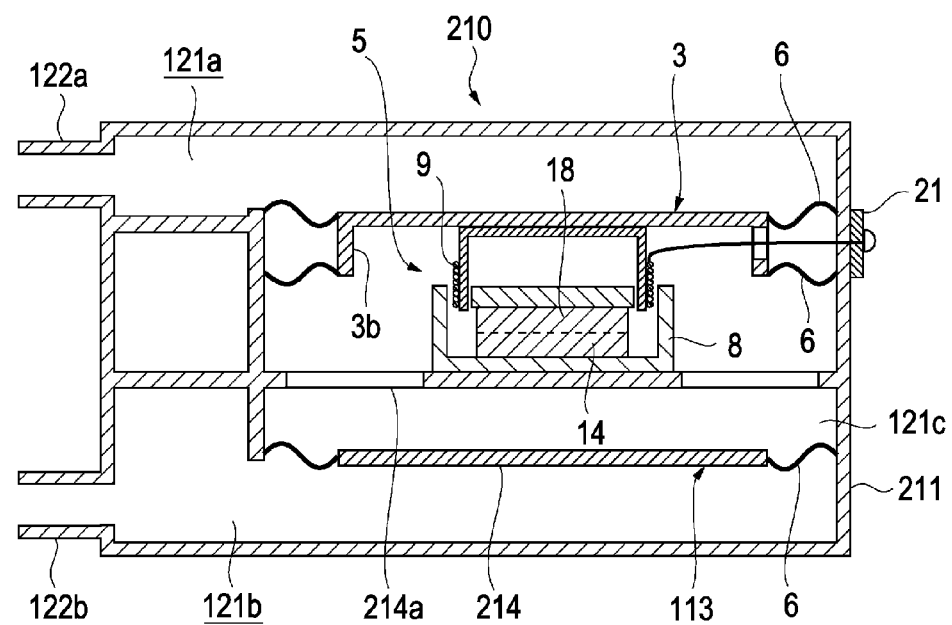
FIG. 53 is a cross-sectional view of a jet flow generating device according to yet another embodiment.

FIG. 53 is a cross-sectional view illustrating a jet flow generating device according to yet another embodiment. This jet flow generating device 210 includes the vibrating member 3 having the side plate 3*b*, and a vibrating plate 113. A partition plate 214 fixed to a housing 211 is provided with an annular opening 214*a*. The opening 214*a* is not necessarily annular, and may be divided into multiple openings. The actuator 5 is installed on the partition plate 214, as with the device shown in FIG. 52. Chambers 121*a*, 121*b*, and 121*c* are mutually isolated. With this jet flow generating device 210, the vibrating plate 113 is vibrated in sync with the vibrating member 3 due to change in the air pressure within the chamber 121*c* by the vibrating member 3 being vibrated. Thus, with the chambers 121*a* and 121*b*, pressure is alternately increased and decreased, and air is alternately jetted via the nozzles 122*a* and 122*b*. According to the present embodiment as well, the same advantages as the jet flow generating device 200 shown in FIG. 52 can be obtained.

Figure 54:
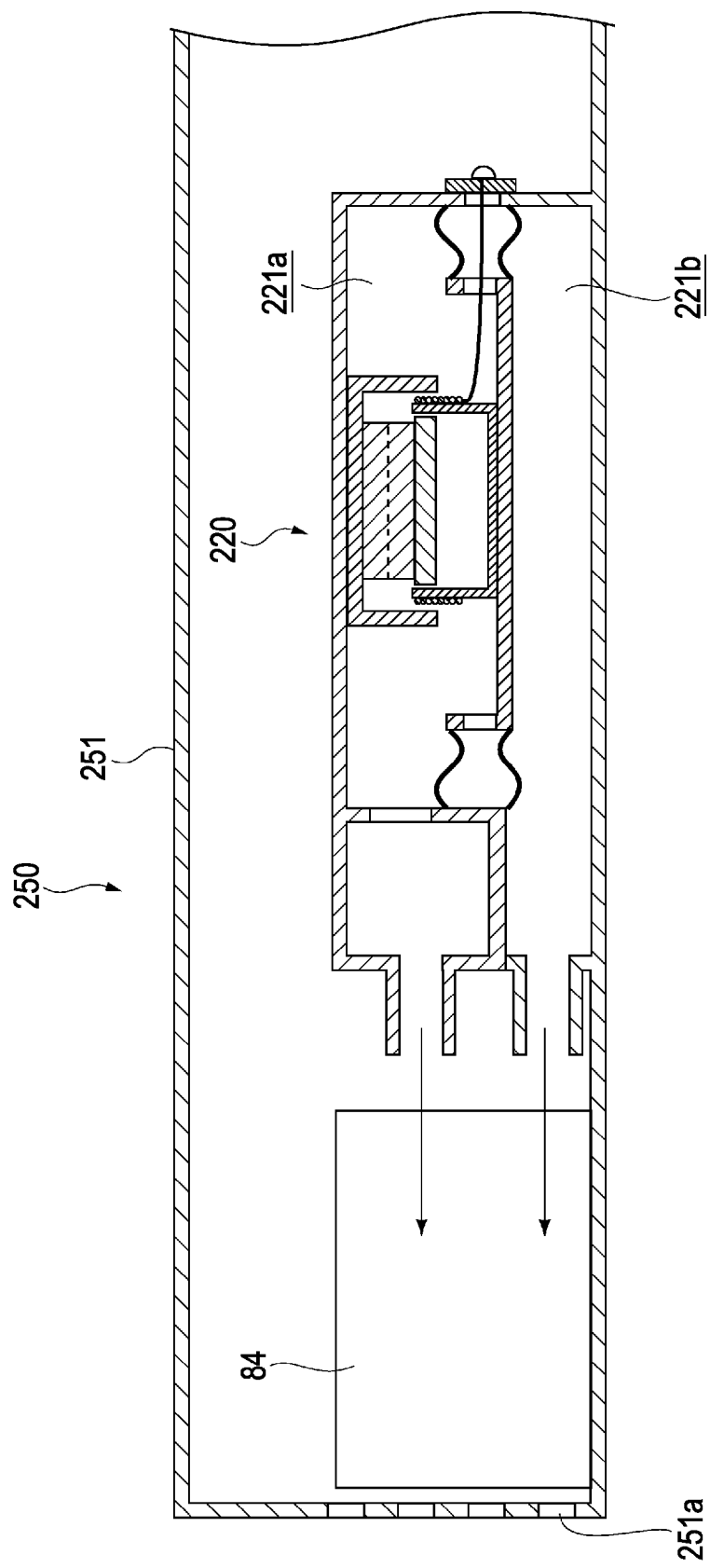
FIG. 54 is a cross-sectional view illustrating a part of an electronic device according to an embodiment of the present invention.

FIG. 54 is a cross-sectional view illustrating part of an electronic device according to one embodiment. An electronic device 250 is, for example, a PC. In this example, part of the housing of a jet flow generating device 220 is integrated with the housing 251 of the electronic device 250. Specifically, the housing making up a chamber 221*b* at the lower portion side of the jet flow generating device 220 is integrated with the housing 251. According to such a configuration, as compared with a case wherein the jet flow generating device 180 shown in FIG. 47 is implemented in a similar electronic device, the electronic device 250 can be reduced in thickness equivalent to the worth of thickness of the housing 181 of the jet flow generating device 180. The jet flow generating device 220 jets air toward a heat sink 84, and heat is discharged from air communication openings 251*a* which are opened in the housing 251.

Note that in the event that the above-mentioned jet flow generating devices and vibrating devices are each implemented in an electronic device, such as shown in FIG. 54, the housing of the electronic device and the housing of the jet flow generating device are not necessarily integrated.

Figure 55:
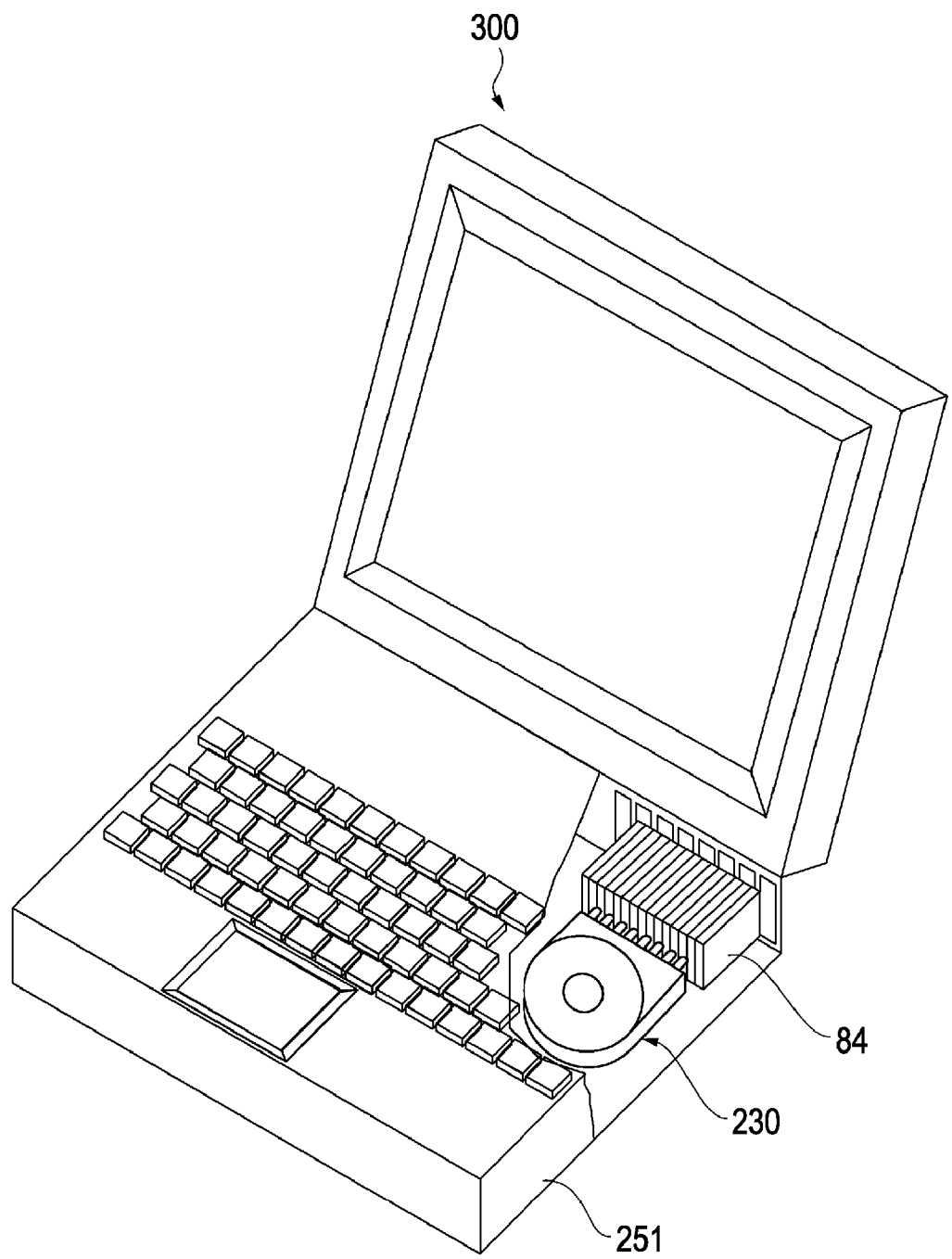
FIG. 55 is a partial-cutaway perspective view of the jet flow generating device implemented in a laptop PC.

FIG. 55 is a partial-cutaway perspective view of the jet flow generating device 10 shown in FIG. 1 implemented in a laptop PC, for example. Thus, a heat sink 84, and a jet flow generating device 230 configured to jet air toward the heat sink 84, are implemented in a PC 300.

Figure 56:
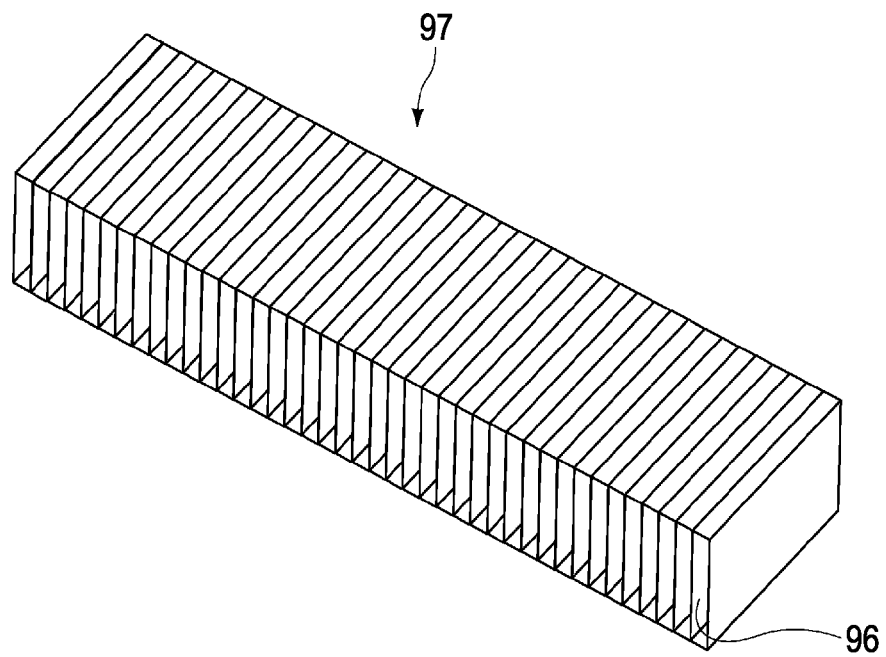
FIG. 56 is a perspective diagram illustrating a heat sink, upon which air from the jet flow generating device is blown.
Figure 57:
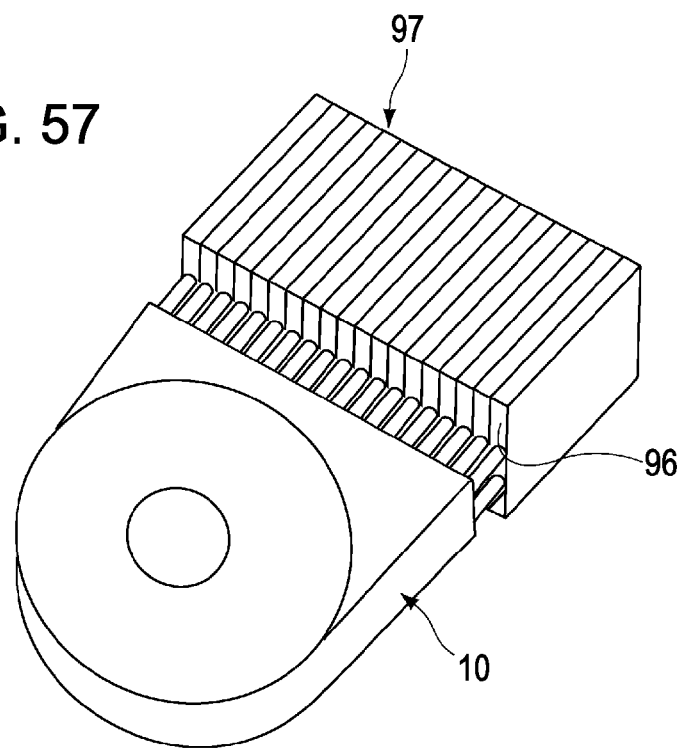
FIG. 57 is a perspective diagram illustrating a combination of a jet flow generating device and a heat sink.

FIG. 56 is a perspective view illustrating a heat sink, upon which air from the jet flow generating device 10 or the like is blown. This heat sink 97 is provided with multiple air communication holes 96. The heat sink 97 is cooled by unshown air from the jet flow generating device passing through the communication holes 96. FIG. 57 illustrates a combination of a jet flow generating device 10 and the heat sink 97, for example.

Figure 58:
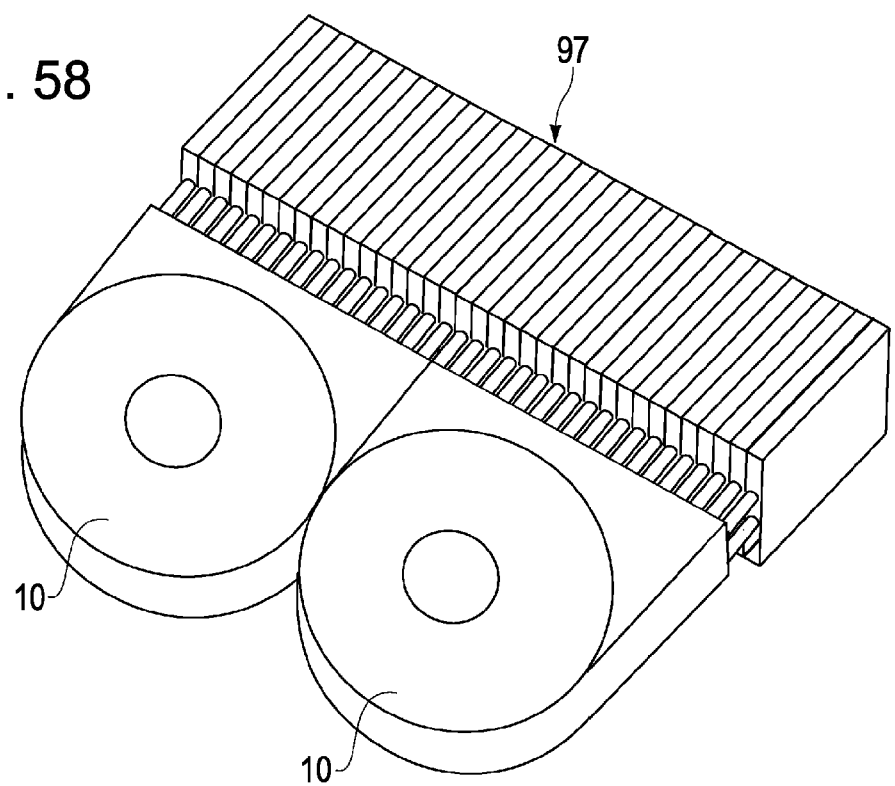
FIG. 58 is a perspective diagram illustrating another form of a combination of a jet flow generating device and a heat sink.

FIG. 58 is a perspective view illustrating another embodiment of a combination of jet flow generating devices and a heat sink. With this example, the two jet flow generating devices 10 shown in FIG. 57 are combined, which blow air toward the heat sink 97. The size, etc., of the heat sink 97, are determined in accordance with the heat amount to be radiated, but the size of the jet flow generating device can be also determined thus arbitrarily in accordance with the size of the heat sink 97. Though the size of the jet flow generating device itself can be increased, as shown in FIG. 58, even with the jet flow generating device of which the size (width) differs from the size of the heat sink 97, such a heat sink 97 can be handled by arraying the two jet flow generating devices horizontally in parallel as shown in FIG. 58. The movement of the two vibrating plates is turned into an opposite phase from the state shown in FIG. 58 by further adding the jet flow generating device, whereby mechanical vibration can be attenuated.

Figure 59:
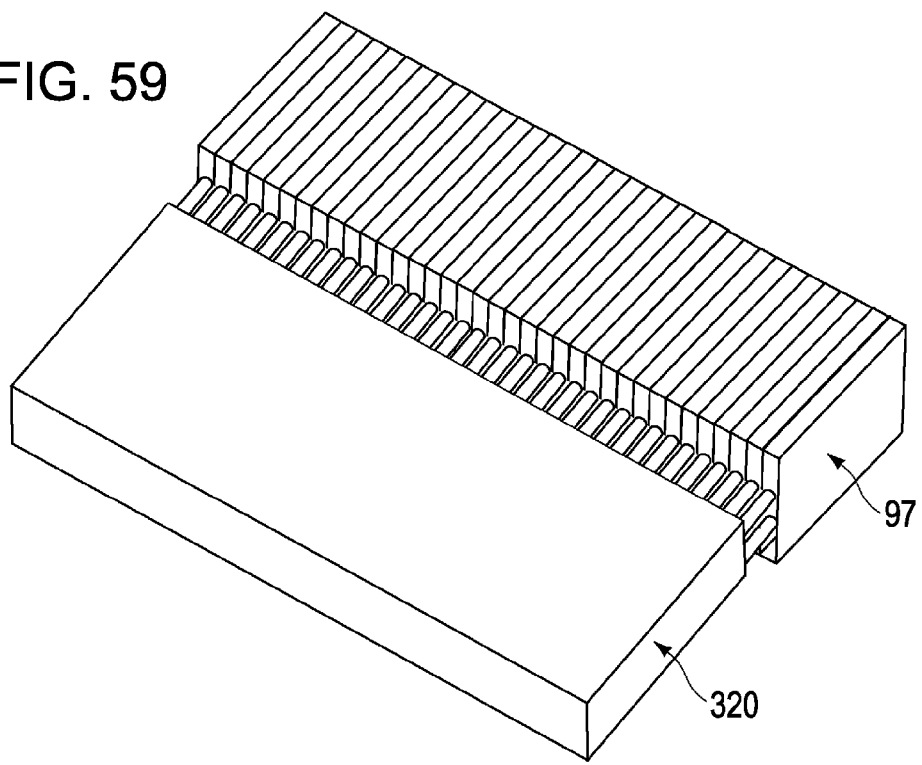
FIG. 59 is a perspective diagram illustrating yet another form of a jet flow generating device and a heat sink.

FIG. 59 is a perspective view illustrating another embodiment of a heat sink and a jet flow generating device. The housing of this jet flow generating device 320 is a rectangle. Thus, the shape of the jet flow generating device 320 is not necessarily restricted to a round shape, which differs from an axial flow fan, and rather an arbitrarily shape can be employed to some extent. This contributes to the effective use of space of the device.

Figure 60:
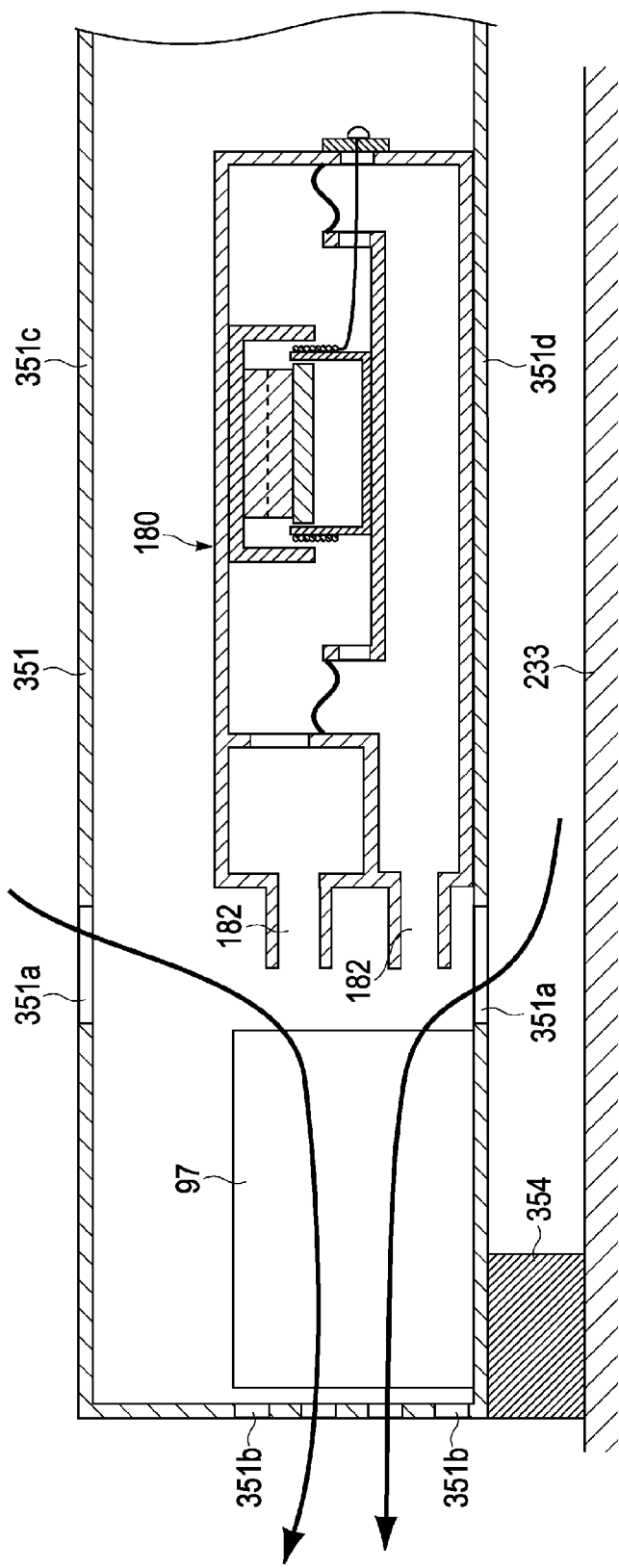
FIG. 60 is a diagram illustrating the airflow when the jet flow generating device is installed in the housing of an electronic device.

FIG. 60 is a diagram illustrating an air flow when a jet flow generating device 180 is implemented in a housing 351 of the electronic device. The housing 351 is provided air inlets 351*a* at each of the upper portion 351*c* and bottom 351*d* thereof. The rear face side of the heat sink 97 is provided with multiple air outlets 351*b*. The air inlets 351*a* are disposed around nozzle openings 182 of the jet flow generating device 280. Thus, a synthesis jet flow is readily generated when the jet flow generating device 180 operates, whereby the amount of air to be blown as to the heat sink 97 can be increased. The bottom 351*d* is provided with a spacer 354 configured to readily introduce open air from the air inlets 351*a* by providing a gap between the bottom 351*d* and the ground 233. The spacer 354 is molded integrally with the same material as the housing 351.

Figure 61:
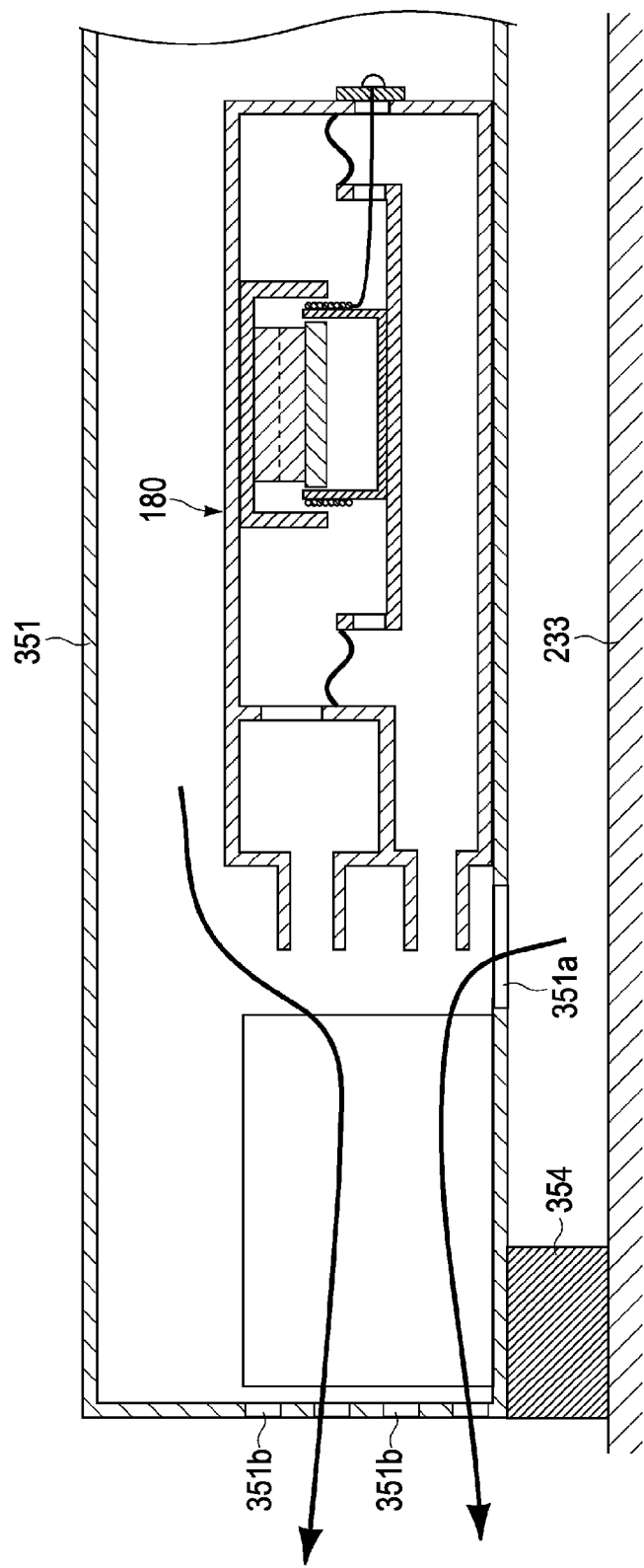
FIG. 61 is a diagram illustrating another form of the airflow.

In the event that the electronic device is the laptop PC, an operator is frequently situated near the front of the PC. Accordingly, in this case, it is not desirable for a hot wind to blow in the forward direction. Therefore, it is desirable for the air outlets 351*b* to be provided on the rear face or side face. When the jet flow generating device operates, air flows in from the air inlets 351*a* to generate the above-mentioned synthesis jet flow, the synthesis jet flow formed by the jet flow generating device 180 passes through the heat sink 97, and is discharged from the air outlets 351*b*. As shown in FIG. 61, the air inlets 351*a* of the housing 351 of the electronic device may be provided only at the bottom 351*d* side.

Figure 62:
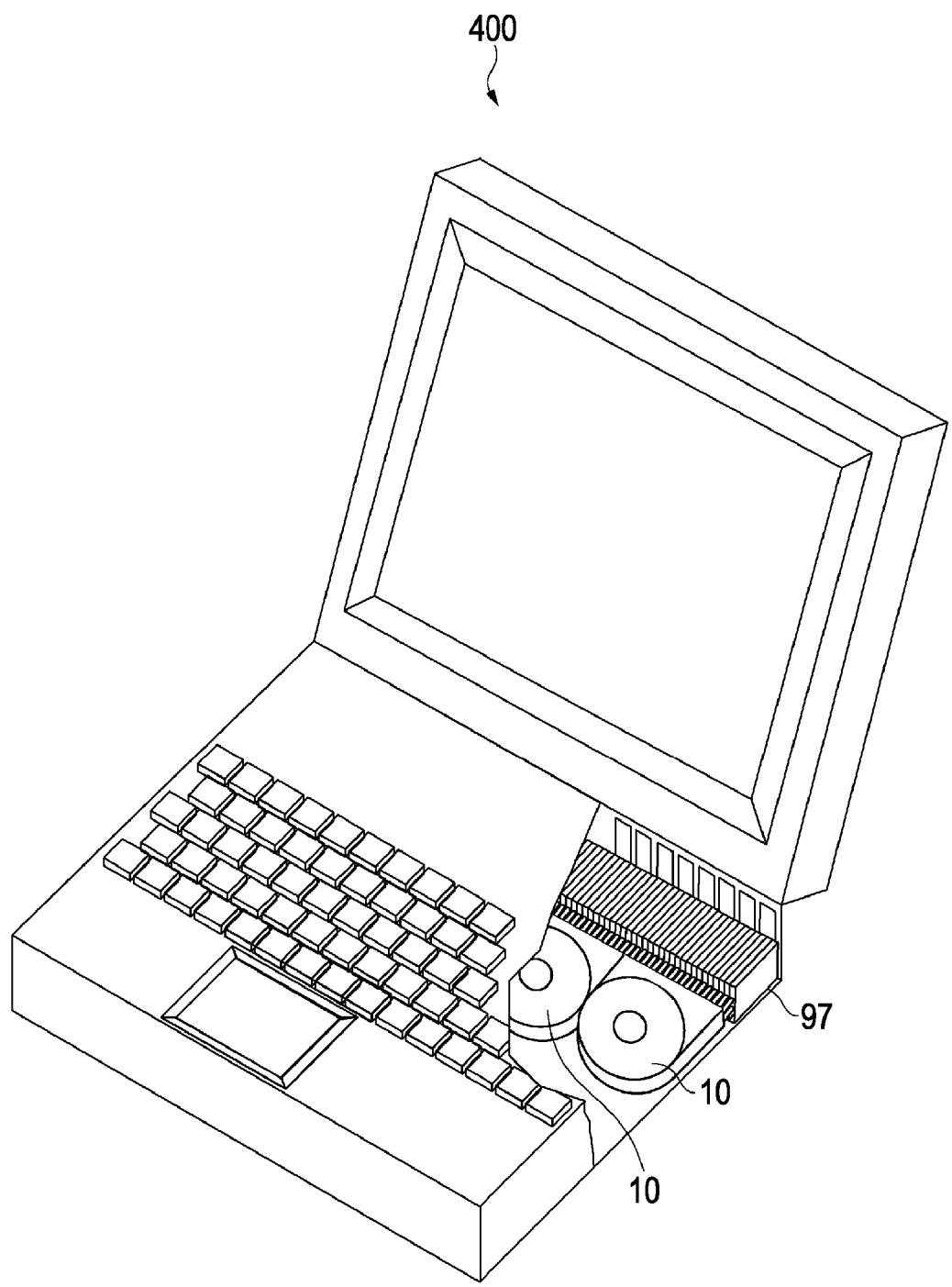
FIG. 62 is a partial-cutaway perspective view of a PC, wherein the two-stage jet flow generating device and heat sink implemented in a PC.
Figure 63:
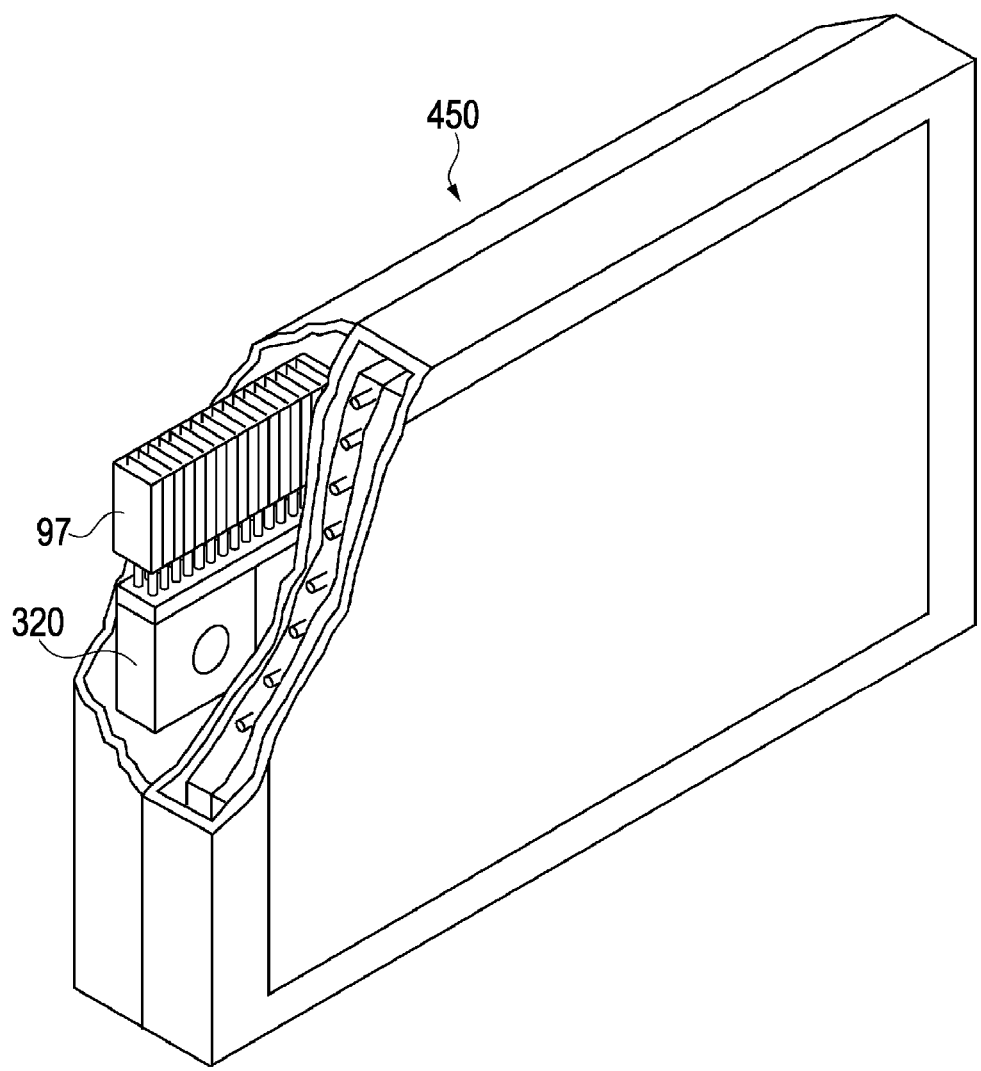
FIG. 63 is a partial cutaway perspective view of a display device having a form wherein the jet flow generating device has been implemented in a display device.
Figure 64:
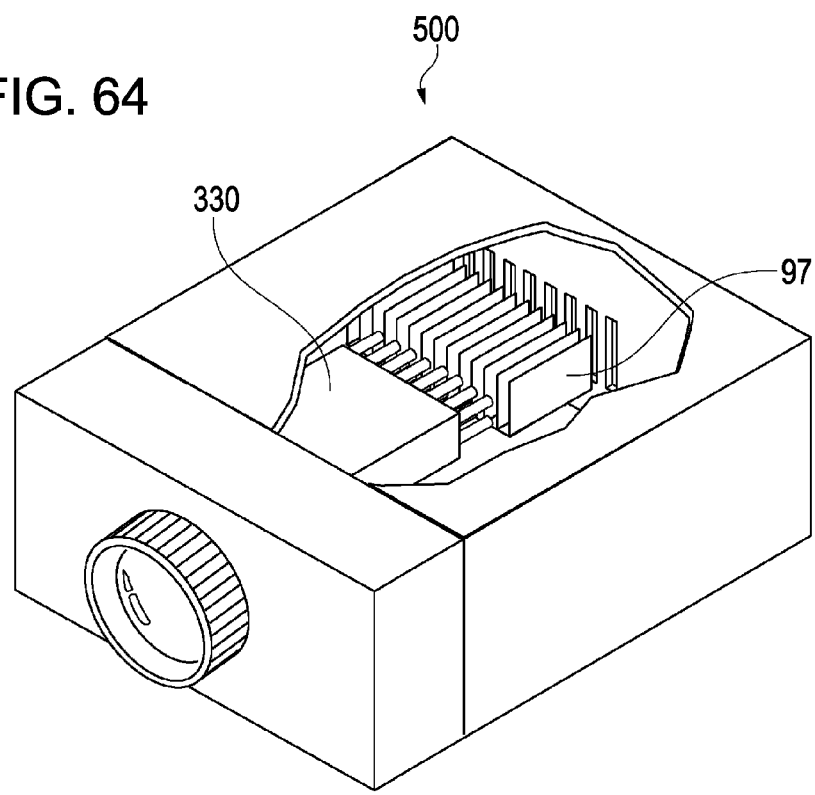
FIG. 64 is a partial cutaway perspective view of a projector having a form wherein the jet flow generating device has been implemented in a projector.

FIG. 62 illustrates an embodiment wherein the tandem-type jet flow generating devices and the heat sink 97, shown in FIG. 58 are implemented in a PC 400. FIG. 63 illustrates an embodiment wherein a jet flow generating device 320 is implemented in a display device 450 as an electronic device. In this case, air outlets are provided in the upward direction. In the event of being implemented in the display device, ventilation backward, upward, or toward the side face is preferable. FIG. 64 illustrates an embodiment wherein a jet flow generating device 330 is implemented in a projector 500 as an electronic device.

Figure 65:
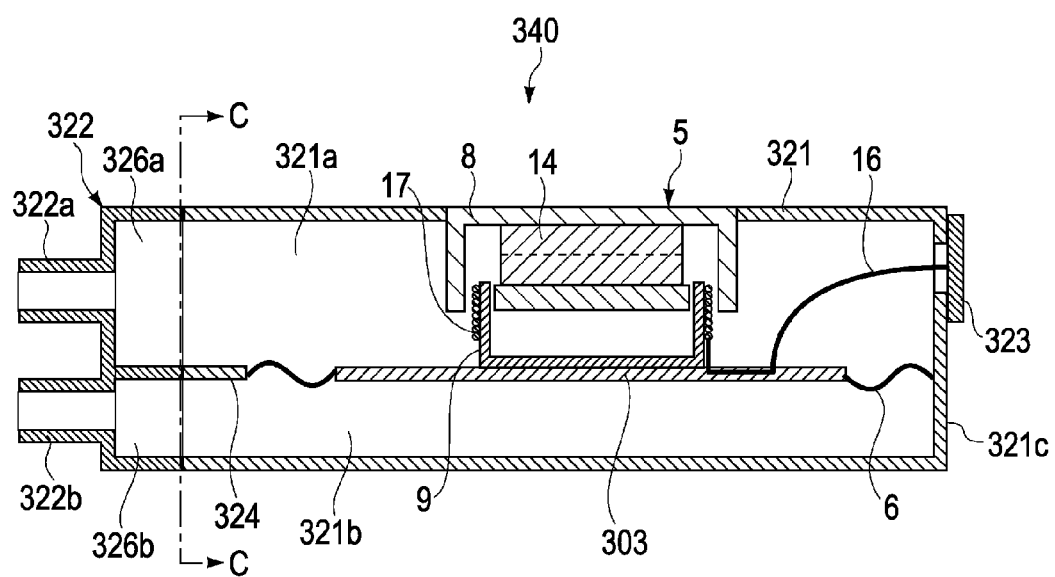
FIG. 65 is a cross-sectional view of a jet flow generating device according to yet another form.
Figure 66:
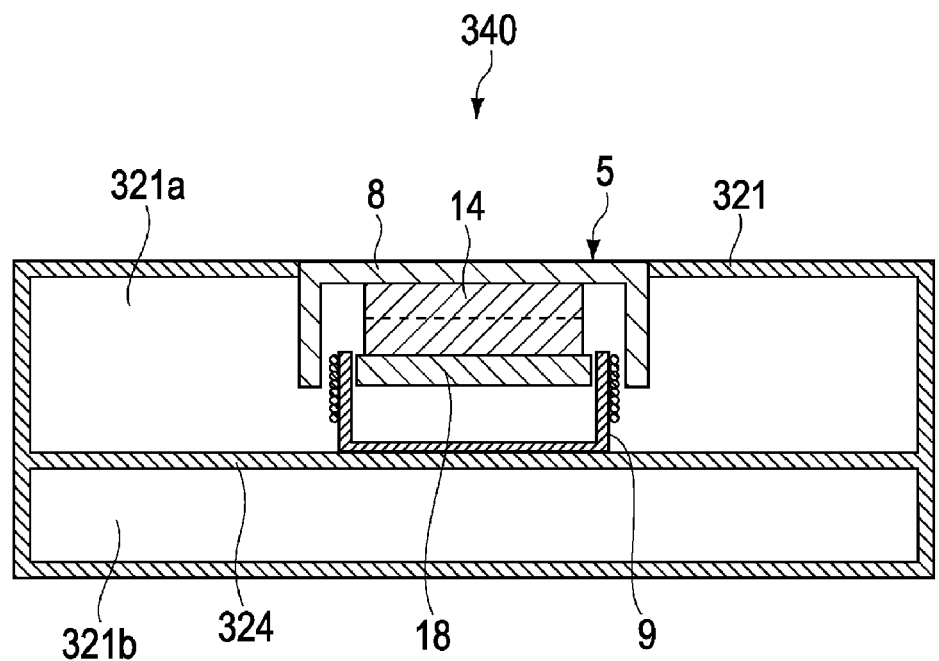
FIG. 66 is a cross-sectional view along line C-C in FIG. 65.

FIG. 65 is a cross-sectional view illustrating a jet flow generating device according to another embodiment. FIG. 66 is a cross-sectional view along line C-C in FIG. 65.

With a jet flow generating device 340, a nozzle member 322 and a housing 321 are made up of different parts. For example, the housing 321 and the nozzle member 322 are manufactured separately, and the nozzle member 322 is implemented in the housing 321, whereby the jet flow generating device 340 can be readily assembled. Also, each of the housing 321 and the nozzle member 322 can be manufactured with an integral molding. The nozzle member 322 includes multiple nozzles 322*a* and multiple nozzles 322*b*. That is to say, the nozzle member 322 includes multiple gas conduits therein. The front of the housing 321, i.e., an opening is formed at the side where the nozzle member 322 is disposed, of the housing 321, a chamber 321*a* communicates with a region 326*a* of the inside of the nozzle member 322, and a chamber 321*b* communicates with a region 326*b*. The nozzle member 322 is made up of a resin, but may be metal.

As shown in FIG. 66, at the front face side (the left side in the drawing) the chamber 321*a* and the chamber 321*b* are divided by a partition member 324 where an elastic supporting member 6 is implemented. A feeder wire 16 is connected to a circuit board 323 attached at the rear face side of the housing 321. The circuit board 323, on which ICs configured to generate a driving signal arranged to vibrate a vibrating member (vibrating plate) 303, and so forth are mounted, supplies the generated signal to an actuator 5. Thus, the circuit board 323 is implemented in the jet flow generating device 340, whereby intermediate electrical connection means such as the above-mentioned terminal block can be eliminated, and also the configuration can be simplified.

Figure 67:
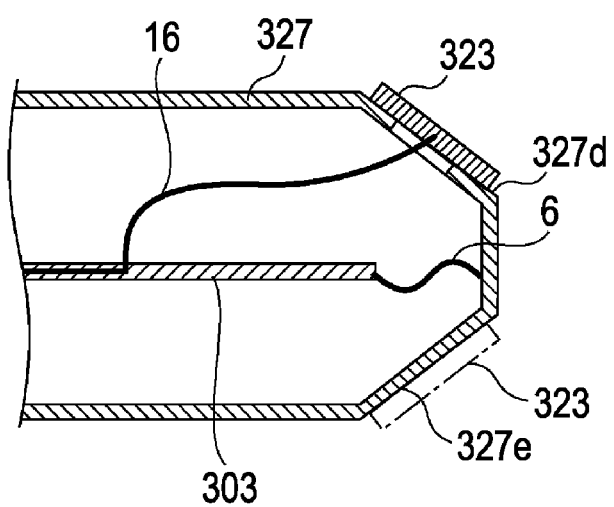
FIG. 67 is a diagram illustrating a form wherein an inclined face is formed on the outer face of a housing, and a circuit board is attached to the inclined face.

Also, the circuit board 323 is attached to the side face 321*c* of which the angle differs from the face generally perpendicular to the vibrating direction of the vibrating plate 303, e.g., the side face 321*c* of the housing 321, whereby the thickness of the jet flow generating device 340 can be reduced. In the event of this embodiment, the side face 321*c* differs generally 90 degrees as compared with the face generally perpendicular to the vibrating direction of the vibrating plate 303. Thus, from the meaning of making the thickness of the jet flow generating device 340 thin, as shown in FIG. 67, an arrangement can be conceived wherein a slope 327*d* (or 327*e*) is formed on the outer surface of a housing 327, and the circuit board 323 is attached to the slope 327*d* (or 327*e*) thereof.

Further, the circuit board 323 is disposed at the opposite side of the side where the nozzle member 322 is implemented, whereby, with the manufacturing process of the jet flow generating device 340 for example, the wiring of the feeder line 16 and so forth can be readily performed.

Figure 39:
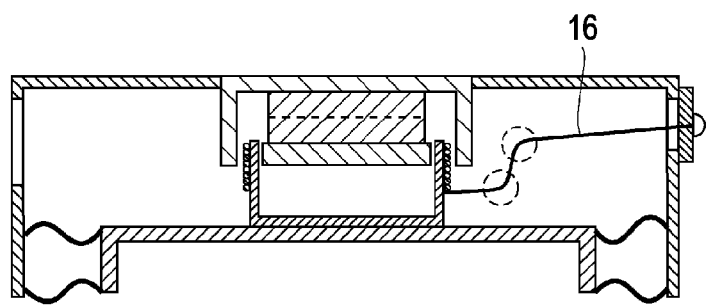
FIG. 39 is a cross-sectional diagram illustrating a vibrating device to which a feeder line with a small bending radius has been wired.

Note that instead of all of the terminal blocks 21 described with reference to FIG. 38, FIG. 39, FIG. 42, and the like, or the drawings subsequent thereto, the circuit board 323 may be attached thereto.

Figure 68:
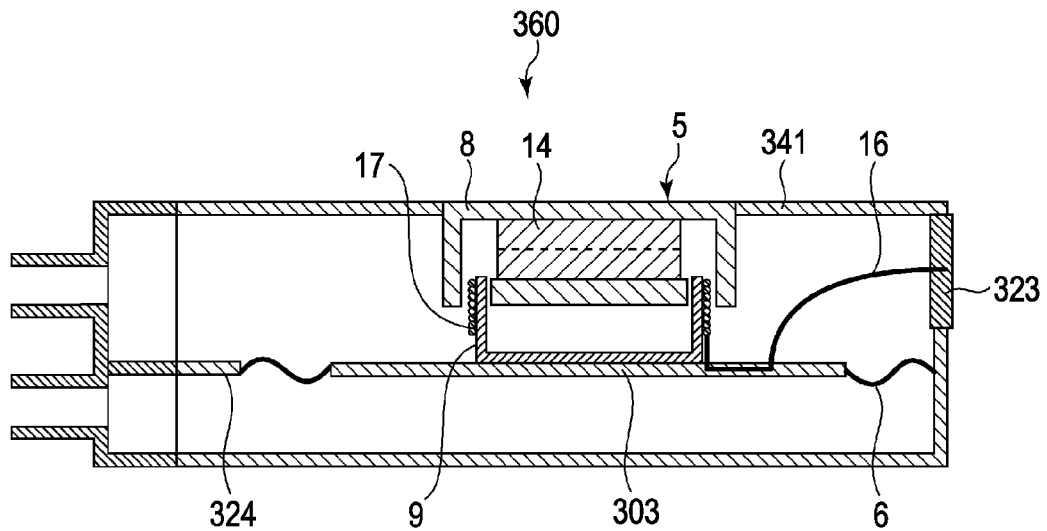
FIG. 68 is a cross-sectional view of a jet flow generating device according to yet another form.

FIG. 68 is a cross-sectional view illustrating a jet flow generating device according to yet another embodiment. A circuit board 323 of a jet flow generating device 360 according to this embodiment makes up part of a housing 341. That is to say, the housing 341 is provided with an opening, and the circuit board 323 is inserted in the opening thereof so as to close the opening thereof. According to such an embodiment, the horizontal width of the jet flow generating device 360 in FIG. 68 can be reduced, thereby contributing to reduction in size.

Figure 69:
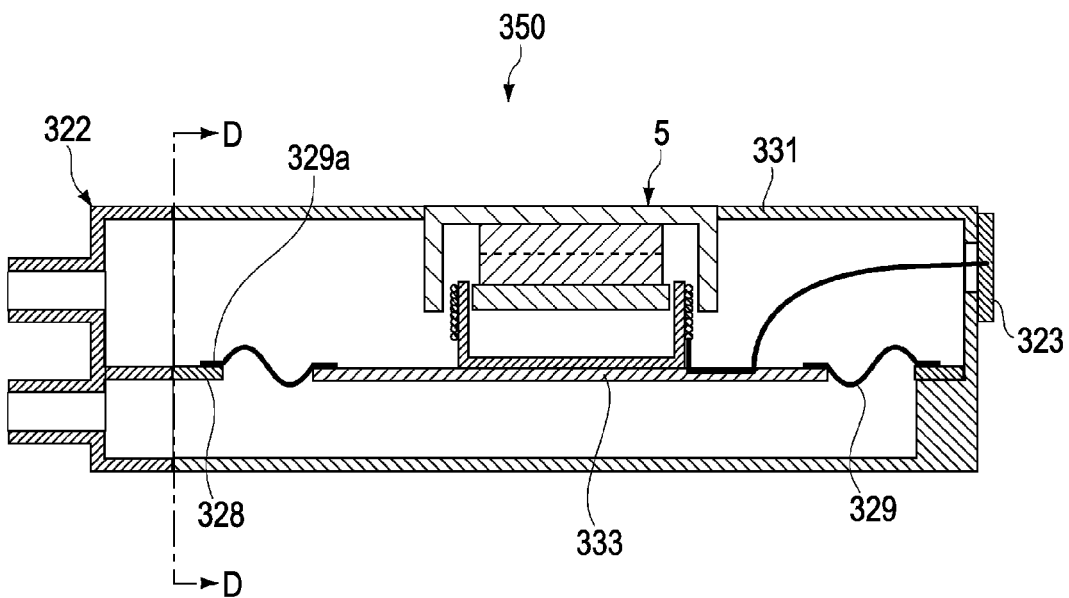
FIG. 69 is a cross-sectional view of a jet flow generating device according to yet another form.
Figure 70:
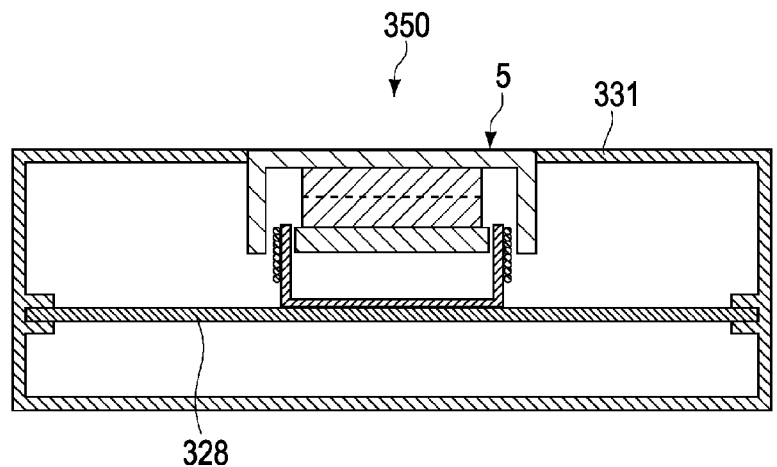
FIG. 70 is a cross-sectional view along line D-D in FIG. 69.

FIG. 69 is a cross-sectional view illustrating a jet flow generating device according to yet another embodiment. FIG. 70 is a cross-sectional view along line D-D in FIG. 69.

Figure 71:
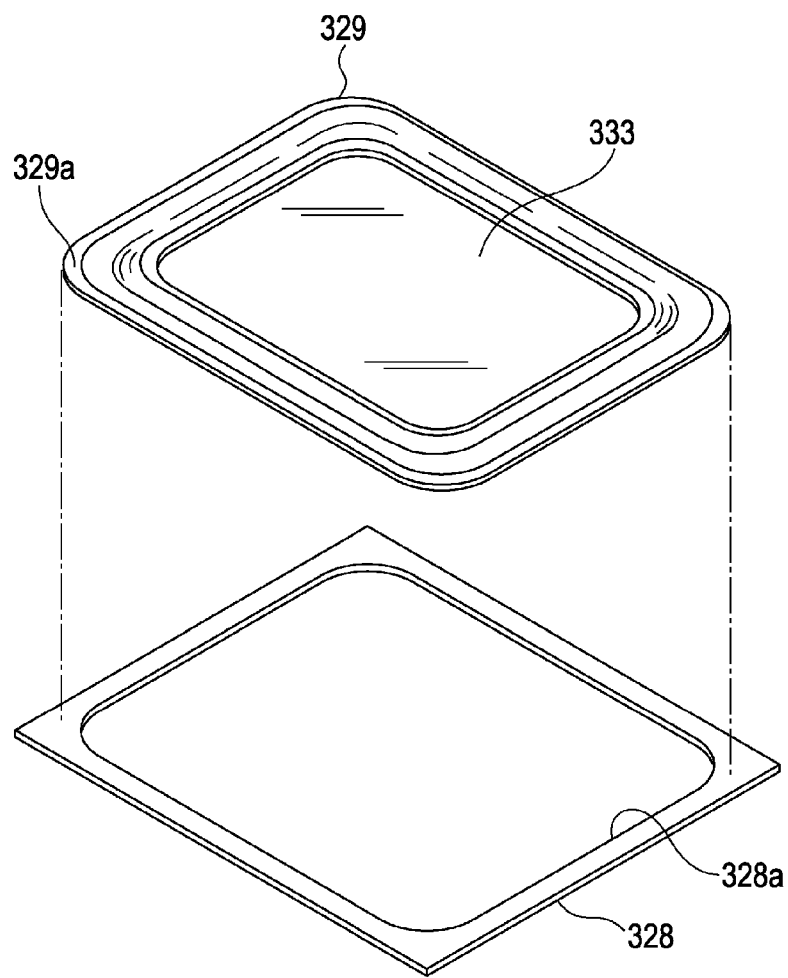
FIG. 71 is a perspective view illustrating a frame, elastic supporting member, and vibrating plate.

This jet flow generating device 350 is provided with a flat-plate-shaped frame 328 configured to support a vibrating member (vibrating plate) 333 and an elastic supporting member 329. Specifically, as shown in FIG. 71, the frame 328 includes a hole 328*a*, and has a flat-plate-shaped outward form. An elastic supporting member 329 is implemented with a vibrating plate 333. The elastic supporting member 329 is attached to the frame 328 at an attachment portion (peripheral portion) 329a provided at the outer circumference thereof. Thus, the frame 328 has a flat-plate shape, whereby assembling can be readily performed, i.e., manufacturing can be readily performed.

The frame 328 and the elastic supporting member 329 may be fabricated with integral molding. That is to say, for example, in a state in which the frame 328 prepared beforehand is disposed in a model for molding of the elastic supporting member 329, the elastic supporting member 329 made up of rubber or resin or the like is molded. As for an integral molding method, for example, a compression method, transfer method, injection method, or another known method is employed. According to integral molding, not only the manufacturing process is reduced, but also the position accuracy between the elastic supporting member 334 and the frame 335, i.e., the position accuracy between the elastic supporting member 334 and the housing is markedly improved.

The elastic supporting member 334 and the vibrating plate 333 may be integrally molded. In this case, as with the case of the frame 328, in a state in which the vibrating plate 333 prepared beforehand is disposed in a model for molding of the elastic supporting member 329, the elastic supporting member 329 is molded.

For example, in the event that the housing 331 is a resin or the like, the frame 328 is a member of which the rigidity is higher than the resin thereof. Examples of the material thereof include aluminum, stainless still, copper, iron, SPCC (Cold-rolling steel plate), and so forth. The material of the frame 328 is not restricted to metal, and rather may be any material as long as it is high in rigidity. Alternatively, in the event that the housing 331 is metal, the material of the frame 328 may be the type of metal as the material of the housing 331, or may be a different type of metal.

For example, as shown in FIG. 65, in the event that the housing 321 including the partition member 324 is an integral molded article, upon the partition member 324 being formed too thin, it becomes difficult to maintain the flatness thereof. In the event that the thickness of the partition member 324 is set to 1 mm or so, the implemented face of the elastic supporting member 6 as to the partition member 324 is not a flat face, the movement of the vibrating plate does not become linear movement, and there is a possibility that excessive movement may be included. Also, thus, there is a possibility that noise may increase. However, in the event that the frame 328 shown in FIG. 70 and the like is made up of a material of which the rigidity is high, even if the thickness thereof is 0.5 through 1 mm or so, sufficient rigidity can be maintained. Thus, reduction in thickness regarding the jet flow generating device 350 can be realized.

Note that the shape viewed at the plane of the frame 328 (the shape within the plane generally perpendicular to the vibrating direction of the vibrating plate 333) is not restricted to the shape shown in FIG. 71, and rather various types of shape can be conceived.

Figure 72:
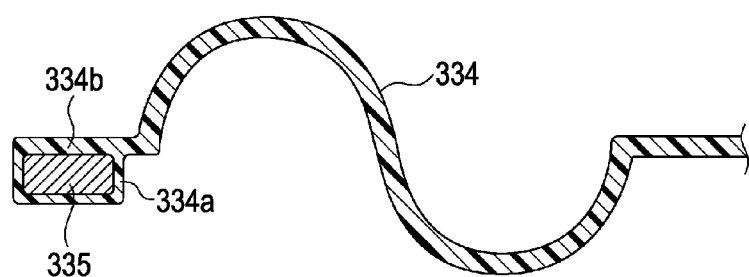
FIG. 72 is a cross-sectional view illustrating another example wherein the frame and elastic supporting member have been molded integrally, illustrating a part of the frame and elastic supporting member.

FIG. 72 is a cross-sectional view illustrating another example of an arrangement wherein a frame and an elastic supporting member are integrally molded, and illustrates part of a frame and part of an elastic supporting member. In FIG. 70, FIG. 71, and so forth, an arrangement has been made wherein the frame 328 is jointed to the attachment portion 329a of the elastic supporting member 329, and the frame 328 is exposed. In FIG. 72, a covering portion 334a provided on an outer circumferential portion 334b of an elastic supporting member 334 covers a frame 335. Even with the embodiment shown in FIG. 72, the elastic supporting member 334 and the frame 335 are fabricated with integral molding. The overall shape of the frame 335 and the elastic supporting member 334 may be the shape shown in FIG. 71, but is not restricted to that shape, and rather may be any shape such as a circle, an ellipse, a polygon, or the like as long as within the plane generally perpendicular to the vibrating direction of the vibrating plate.

Following being thus integrally molded, the covering portion 334a or outer circumferential portion 334b is jointed to the housing of an unshown jet flow generating device, whereby the elastic supporting member 334 is implemented in the housing thereof. With the present embodiment, according to integral molding, not only the manufacturing process is reduced, but also the position accuracy between the elastic supporting member 334 and the frame 335, i.e., the position accuracy between the elastic supporting member 334 and the housing is markedly improved.

Figure 73:
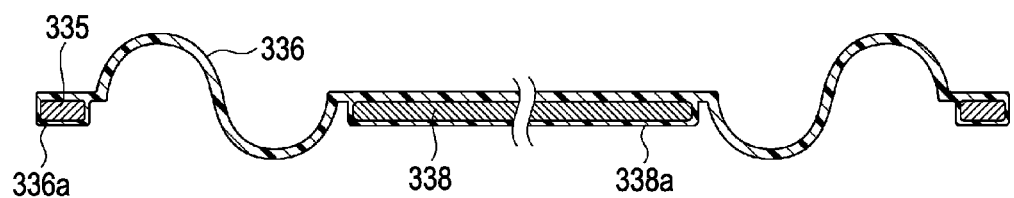
FIG. 73 is a cross-sectional view of a state wherein the elastic supporting member covers the frame with a frame covering portion thereof, and covers the vibrating plate with a vibrating plate covering portion thereof.

In FIG. 73, an elastic supporting member 336 covers a frame 335 with the frame covering portion 336a thereof, and also a vibrating plate 338 is covered with a vibrating plate covering portion 338a. Such an elastic supporting member 336 is also formed with integral molding. Specifically, in a state in which the frame 335 and the vibrating plate 338 are disposed in a model for molding of the elastic supporting member 336, the elastic supporting member 336 is molded. In the event that the vibrating plate 338 is metal, this contributes to reduction in thickness. Of course, the vibrating plate 338 is not restricted to metal, and rather may be a resin, a rubber, or the like. Thus, the attachment process of the elastic supporting member 336, frame 335, and vibrating plate 338 will be omitted, and also, the position accuracy of each of the elastic supporting member 336, frame 335, and vibrating plate 338 is markedly improved.

Figure 74:
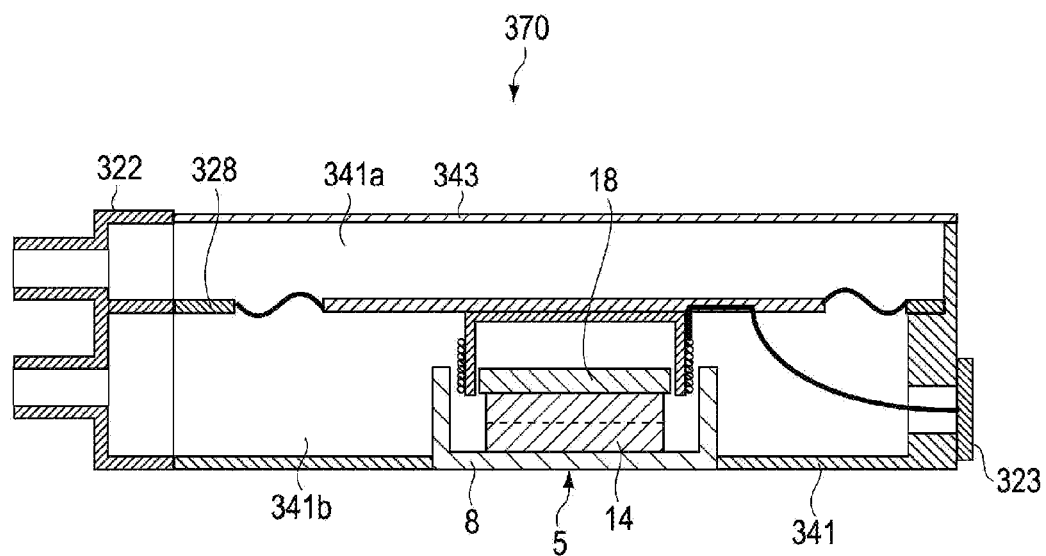
FIG. 74 is a cross-sectional view of a jet flow generating device according to yet another form.

FIG. 74 is a cross-sectional view illustrating a jet flow generating device according to yet another embodiment.

A jet flow generating device 370 is illustrated upside down as compared with the jet flow generating devices described so far. The reason why the jet flow generating device 370 is illustrated upside down is, for example, to indicate that in the event that the jet flow generating device 370 is built in the housing of an unshown electronic device such as a PC or the like, there is a case wherein the jet flow generating device 370 is disposed such that a chamber 341b which is the side where an actuator 5 is disposed becomes downward, and a chamber 341a becomes upward. However, in the event that the electronic device is built in the jet flow generating device 370, the jet flow generating device 370 is not necessarily thus disposed upside down.

A top plate of a housing 341 of the jet flow generating device 370 may be made up of metal, for example. Thus, the strength thereof increases as compared with a resin and so forth, and the metal plate 343 can be reduced in thickness for the worth equivalent to the increase of the strength, whereby reduction in thickness regarding the jet flow generating device 370 can be realized. For example, in this case, even if the metal plate 343 is thickness of 0.5 mm or so, sufficient rigidity can be obtained. In the event of a resin, the resin of which the thickness is 0.5 mm or so is readily curved, and folded, and accordingly, the shape thereof cannot be maintained.

Figure 75A:
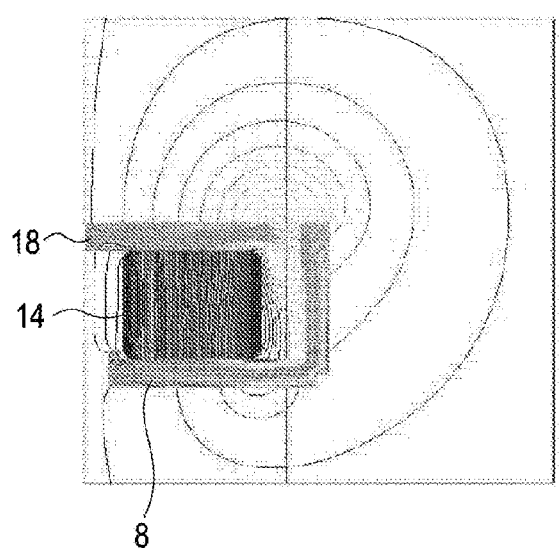
FIG. 75A is a diagram illustrating a simulation of a magnetic field generated by a magnetic circuit in a case wherein a metal plate is not present.
Figure 75B:
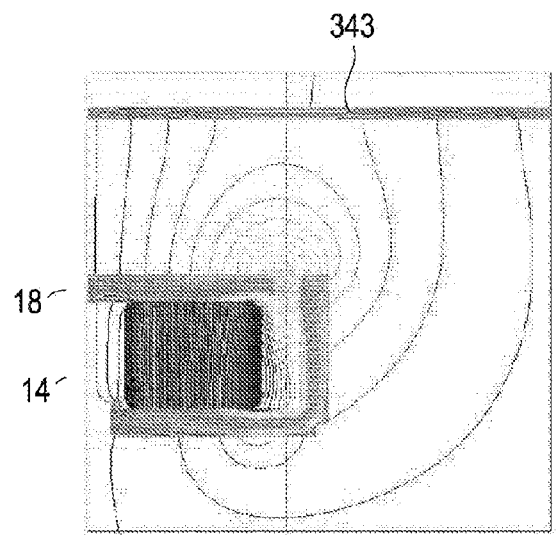
FIG. 75B is a diagram illustrating a simulation of a magnetic field generated by a magnetic circuit in a case wherein a metal plate is present.

Further, in the event that the metal plate 343 is a magnetic member, the magnetic field of a magnetic circuit made up of a magnet 14 of an actuator 5, and yokes 8 and 18 can be prevented from being leaked upward from the metal plate 343. Examples of a magnetic material include iron, a perm alloy, a silicon steel board, and SPCC (cold-rolling steel plate). FIG. 75A is a diagram illustrating a simulation of a magnetic field formed by the magnet 14, and the yokes 8 and 18 in the event that there is no metal plate 343, and FIG. 75B is a diagram illustrating a simulation of a magnetic field formed by the magnet 14, and the yokes 8 and 18 in the event that there is the metal plate 343. As can be understood from these drawings, the magnetic filed can be prevented from being leaked upward from the metal plate 343. Note that with this simulation, the material of the metal plate 343 is iron.

For example, in the event that this jet flow generating device 370 is built in the housing of an unshown electronic device such as a PC or the like, there is a case conceived wherein unshown various types of electronic parts are disposed on the metal plate 343. In this case, according to the magnetic shield effect of the metal plate 343, concern regarding the bad influence to the electronic parts decreases.

Also, there is provided the metal plate 343, whereby this metal plate 343 can be employed as a heat insulating board configured to release heat filled within the housing 341.

Note that in FIG. 74, an arrangement has been made wherein the metal plate 343 is provided only at the chamber 341a side, but an arrangement may be made wherein the metal plate 343 is further provided at the chamber 341b side. In this case, in order to prevent the magnetism of the yoke 8 from being leaked outside the housing 341, an arrangement needs to be made wherein the yoke 8 is not exposed outside the housing 341, and is accommodated within the housing 341. Alternatively, in the event that there is the need to reduce the thickness of the jet flow generating device without exhibiting such magnetic field effect, as shown in FIG. 74, it is desirable to configure part of the housing so as to expose the yoke 8, and to configure the metal plate provided at the chamber 341b side with a nonmagnetic substance. This is because the magnetic flux from the yoke 8 is prevented from being flowed in the metal plate thereof.

Figure 76:
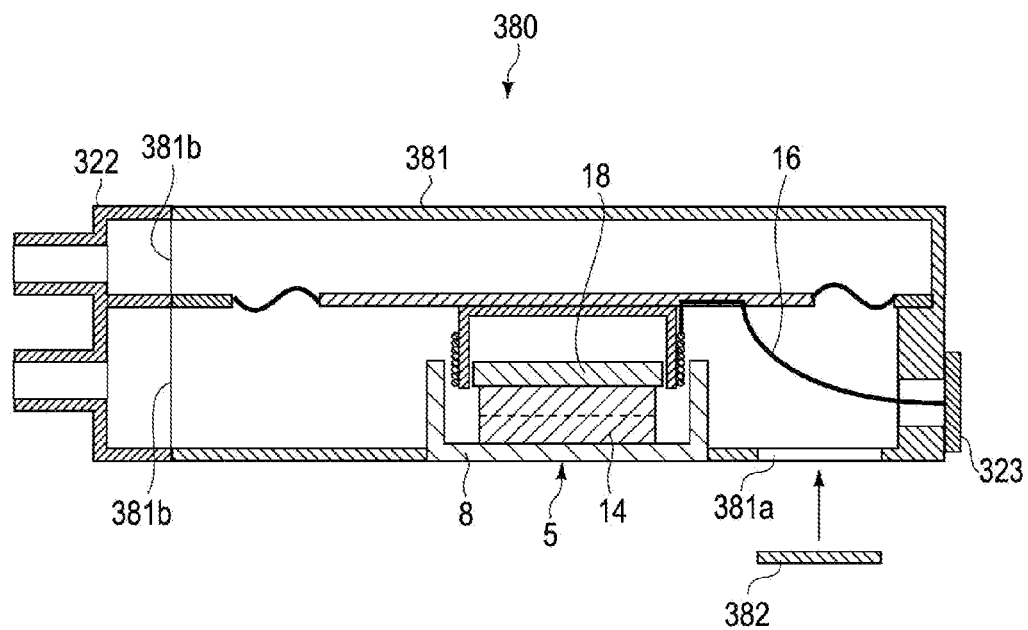
FIG. 76 is a cross-sectional view of a jet flow generating device according to yet another embodiment.

FIG. 76 is a cross-sectional view illustrating a jet flow generating device according to yet another embodiment.

With a jet flow generating device 380, the housing 381 thereof is provided with an opening 381a for work, a lid 382 is mounted on the housing 381 so as to close the opening 381a thereof. According to such a configuration, with the manufacturing process (or including inspection process) of the jet flow generating device 380, a worker can readily work via the opening 381a. Specifically, in the event that there is no opening 381a, before the nozzle member 322 is attached to the housing 381, the worker needs to perform wiring or the like of the feeder line 16 using tweezers or the like from the opening 381b of the housing 381 of the portion where the nozzle member 322 thereof is attached, which is a hard task. However, due to the fact that there is the opening 381a, in the event that the opening 381a is disposed near the feeder line 16, wiring work becomes easy. Following the wiring work being completed, the opening 381a is closed with the lid 382. The lid 382 can be fixed to the housing 381 later by adhesive agent, fusing, or another method. The lid 382, as with the meaning described with reference to FIG. 50, may be glass or resin such as transmitting visible light. Thus, the worker can observe the situation within the housing 381, or the like.

Figure 77:
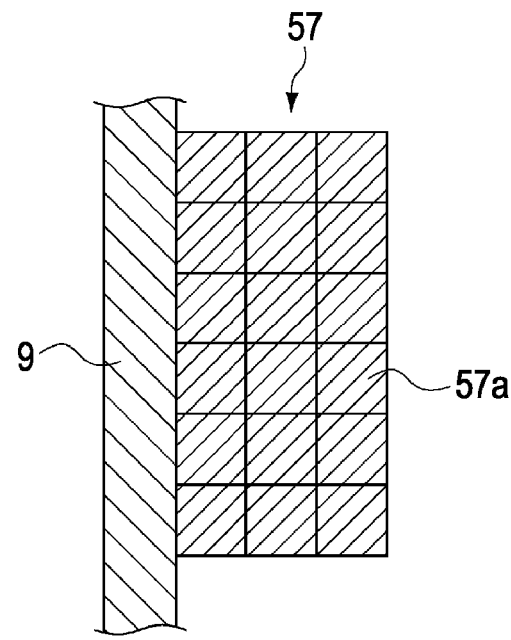
FIG. 77 is a cross-sectional view illustrating another embodiment of a coil wound on a coil bobbin, shown in FIG. 4 and other drawings.
Figure 78:
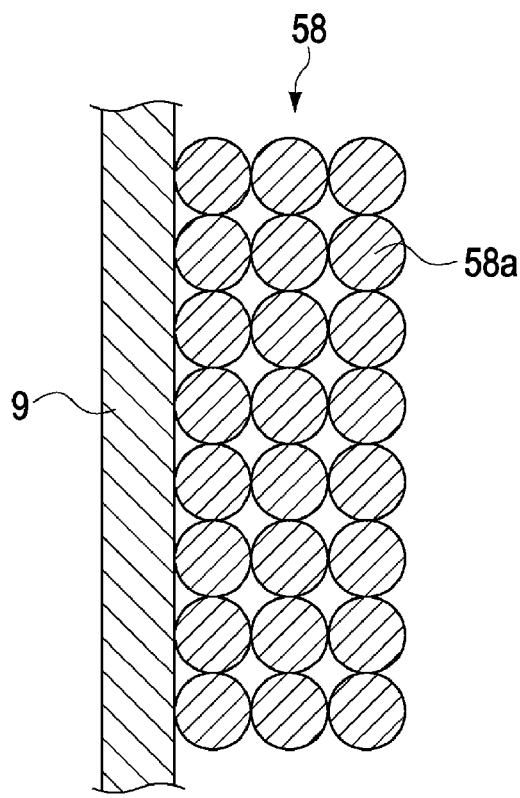
FIG. 78 is a cross-sectional view illustrating a coil wherein the conductor wire has a circular cross-sectional shape.

FIG. 77 is a cross-sectional view illustrating another embodiment of the coil 17 wound on the coil bobbin 9 shown in FIG. 4 and so forth, for example. With this embodiment, a coil 57 wound on the coil bobbin 9 is made up of conductor wires 57a each of which the cross section is a rectangle. This "cross section" means a cross section generally perpendicular to the longitudinal direction of the conductor wires 57a thereof. The coil 57 is wound by three layers, but this is but an example, and may be any number of layers. According to such a configuration, compared with a coil 58 shown in FIG. 78 made up of conductor wires each of which the cross section is a circle, the density of the coil 57 per unit of the cross section thereof can be increased. That is to say, many conductor wires can be wound with the same volume. Also, even with the density by which a conductor occupies is the same, and with the same number of windings, the winding height (thickness of overall coil) thereof decreases, whereby reduction in thickness regarding the coil 57 can be realized. In FIG. 77, the cross sections of the conductor wires 57a are squares, but may be triangles, or may be pentagons.

Figure 79:
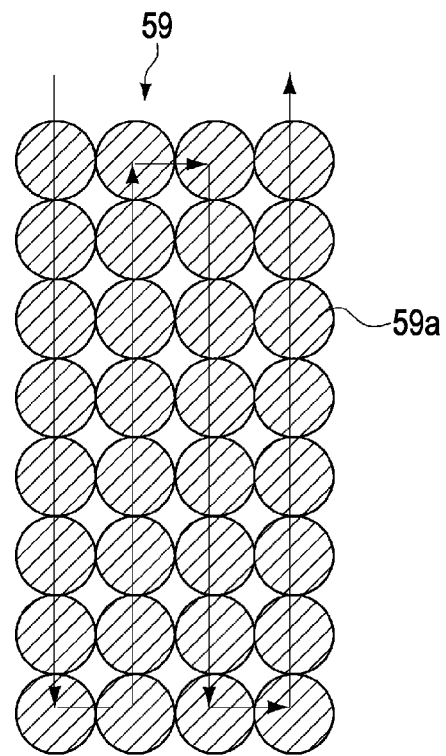
FIG. 79 is a cross-sectional view illustrating another embodiment of a coil wound on a coil bobbin.
Figure 80:
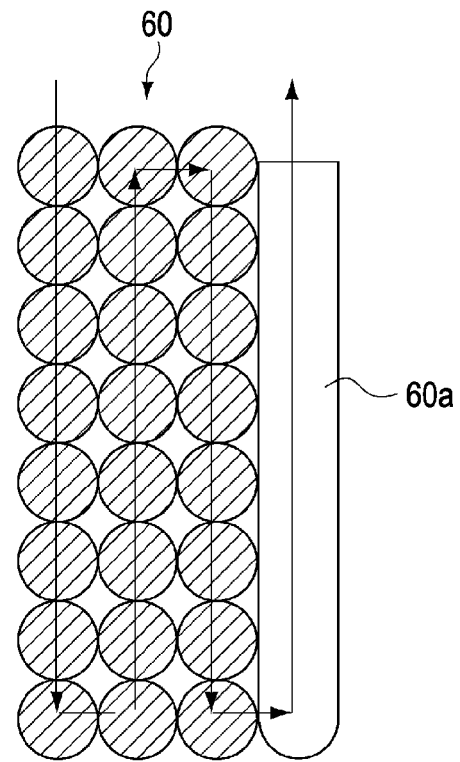
FIG. 80 is a cross-sectional view illustrating an odd-layered coil.

FIG. 79 is a cross-sectional view illustrating another embodiment of a coil wound on an unshown coil bobbin. A coil 59 shown in FIG. 79 is configured such that conductor wires 59a are wound by even layers, e.g., four layers. The conductor wires 59a being wound by even layers, as shown in an arrow, is effective in a case wherein the winding start and the winding end of the conductor wires 59a are set to the same side (upper side in FIG. 79). That is to say, in this case, as shown in FIG. 80, in the event of a coil 60 of odd layers, the thickness equivalent to one wire worth (the thickness equivalent to one layer worth) of conductor wires 60a shown in the right side in FIG. 80 becomes useless. However, in the event of even layers, the uselessness of that space is eliminated, thereby contributing to reduction in size.

Note that in FIG. 79 the coil 59 is made up of four layers, but may be two layers, or even layers equal to or greater than six layers. The cross sections of the conductor wires 59a are circles, but are not restricted to circles, may be rectangles such as shown in FIG. 77.

Figure 81:
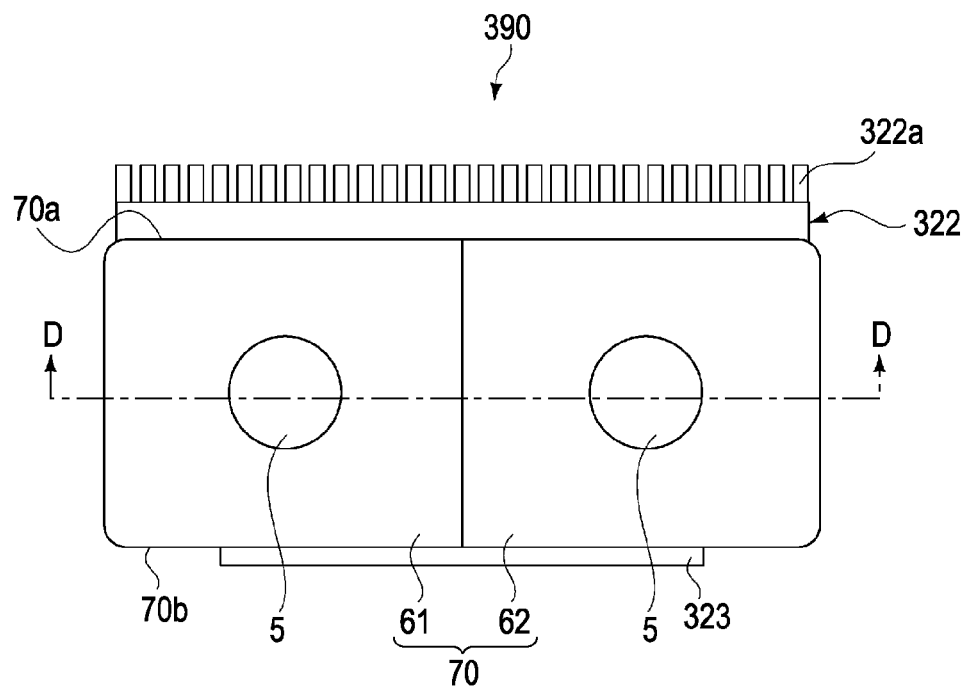
FIG. 81 is a plane view illustrating a jet flow generating device according to yet another embodiment of the present invention.
Figure 82:
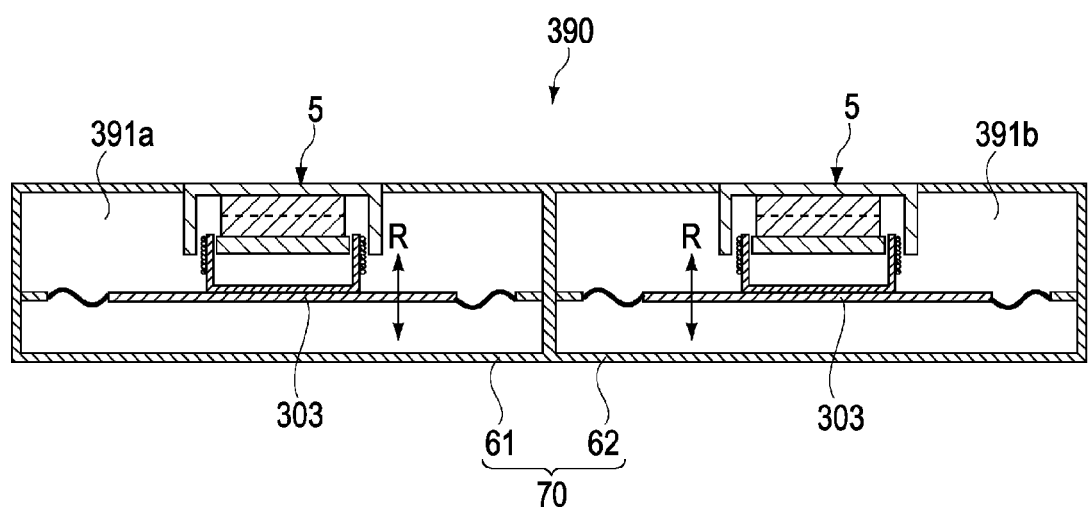
FIG. 82 is a cross-sectional view of the jet flow generating device shown in FIG. 81.

FIG. 81 is a plane view illustrating a jet flow generating device according to yet another embodiment of the present invention. FIG. 82 is a cross-sectional view along line D-D in FIG. 81.

A jet flow generating device 390 includes tandem-type jet flow generators 40 wherein two housings 61 and 62 are integrated. Hereafter, one housing including all of the housings 61 and 62 which are integrated is referred to as a "housing 70". The housing 70 can be integrally molded with a model or the like for example. The housing 70 includes chambers 391a and 391b, and an actuator 5, a vibrating plate 303, and so forth are provided for each of the chambers 391a and 391b. The chambers 391a and 391b are disposed so as to array within the plane perpendicular to a vibrating direction R of the vibrating plate 303 (horizontal direction in FIG. 82). A nozzle member 322 including multiple nozzles 322a are mounted in the front face of the housing 70, the conduit within each nozzle 322a communicates with the chamber 391a or 391b. This nozzle member 322 has the same configuration as the nozzle member 322 shown in FIG. 65. The rear face 70b of the housing 70 is fixed with the circuit board 323. This is not restricted to the circuit board 323, and rather may be a terminal block. The circuit board 323 may be configured of part of the housing 341 such as shown in FIG. 68.

Thus, a vibrating plate 303 is provided for each of the chambers 391a and 391b which are arrayed in a plane, and air is jetted from the nozzle member 322, whereby the jet flow generating device 390 can be reduced in size, and also the discharge amount of air can be increased. Also, the two vibrating plates 303 are vibrated such that at timing wherein one of the vibrating plates 303 moves in one direction, the other of vibrating plates 303 moves in the direction opposite thereof, whereby the moment of the overall of device is generated, but the vibrations of the two vibrating plates 303 thereof are cancelled. Thus, the vibration applied to the electronic device in which the jet flow generating device 390 is implemented can be suppressed.

Figure 83:
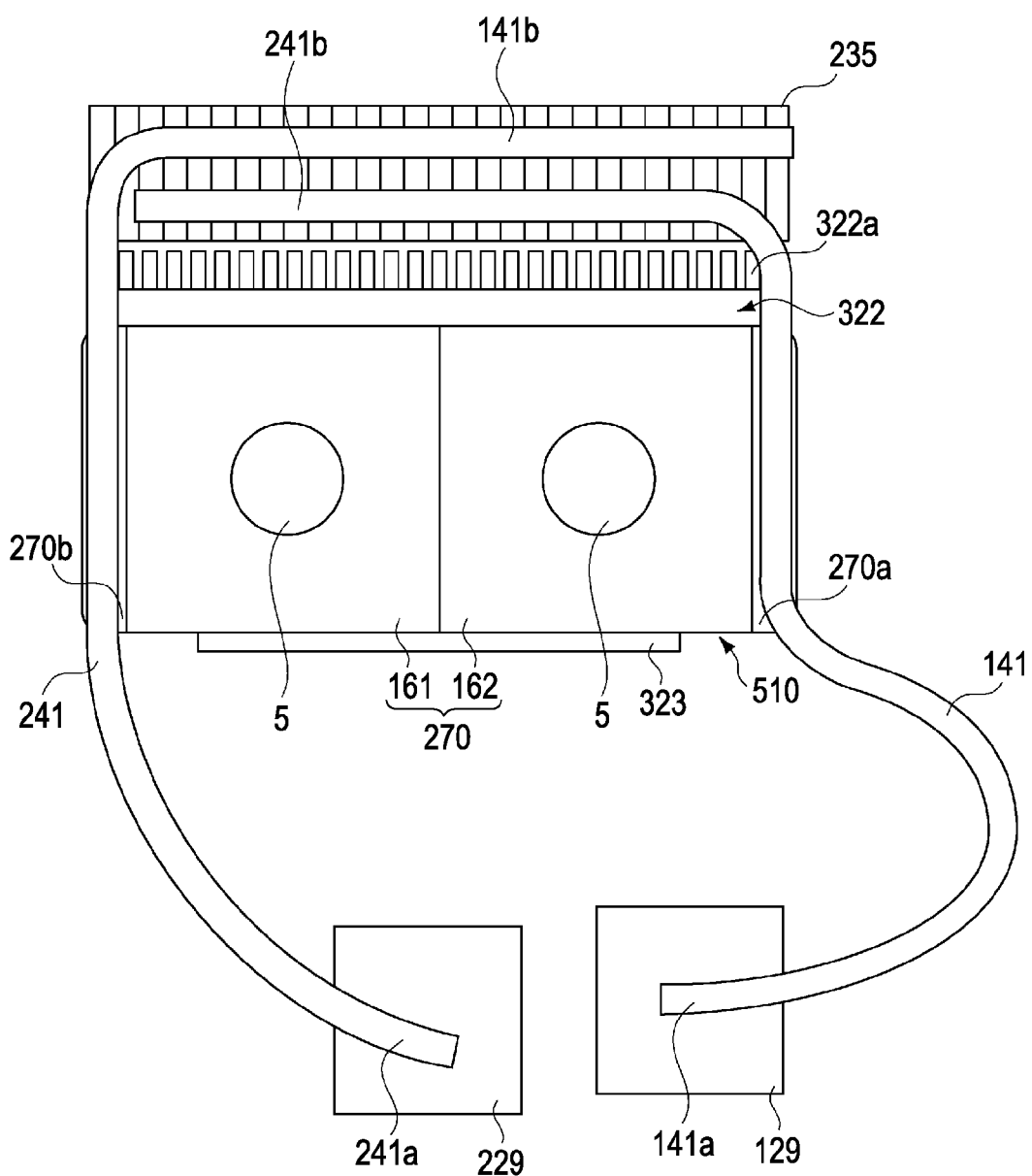
FIG. 83 is a plane view illustrating a state wherein a heat transport device, which transports by phase change of a working fluid using capillary action, is installed in the two-stage jet flow generating device shown in FIG. 81.
Figure 84:
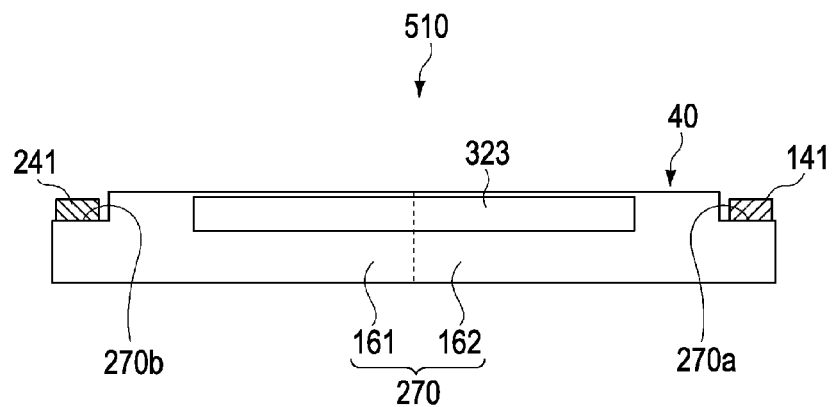
FIG. 84 is a rear view of the jet flow generating device shown in FIG. 83.

FIG. 83 is a plane view illustrating a state in which the tandem-type jet flow generating devices shown in FIG. 81 are installed with a heat transport device configured to transport heat according to the phase change of a working fluid using a capillary action. FIG. 84 is a rear view of the jet flow generating device thereof.

The heat transport device is made up of two heat pipes 141 and 241, for example. As shown in FIG. 84, both side portions of a housing 270 configured of two housings 161 and 162 which are integrally provided, of the jet flow generating device 510, are provided with steps 270a and 270b, respectively. Heat pipes 141 and 241 which are thermally connected to heat spreaders 129 and 229 are passed through these steps 270a and 270b, respectively. Thus, there is no problem structurally even if there are the steps 270a and 270b at both ends of the housing 202. The portion which is restricted in the thickness direction (vertical direction in FIG. 84) is the portion where the actuator 5 is disposed, and there is no problem even if a step is provided as long as the step is provided on a portion other than that restricted portion. Note that a recessed portion or a groove may be provided instead of steps. Also, holes may be provided in the housing 270 such that the heat pipe 141 and so forth can pass through the holes.

The heat spreaders 129 and 229 are thermally connected with unshown heating sources. In this case, the heating source is a CPU, a graphic chip, or the like, but is not restricted to these. Let us say that "thermally connected" means directly connected, or connected via a thermally conductive member or thermally conductive sheet-shaped member, but does not include a case wherein heat-conducting is performed by fluid, such as gas, a fluid, or the like. The endothermic sides 141a and 241a of the heat pipes 141 and 241 are thermally connected to the heat spreaders 129 and 229 respectively, and the heat radiation sides 141b and 241b are thermally connected to each of the heat sinks 235. Thus, the heat from the unshown two heating sources is propagated to the heat sinks 235, and according to the synthesis jet flow generated from the jet flow generating device 510, heat is emitted from the heat sinks 235.

With the present embodiment, the steps 270a and 270b of the housing 270 are provided with the heat pipes 141 and 241 respectively, whereby the thickness of the jet flow generating device 510 including the heat pipes 141 and 241 can be reduced.

Figure 85:
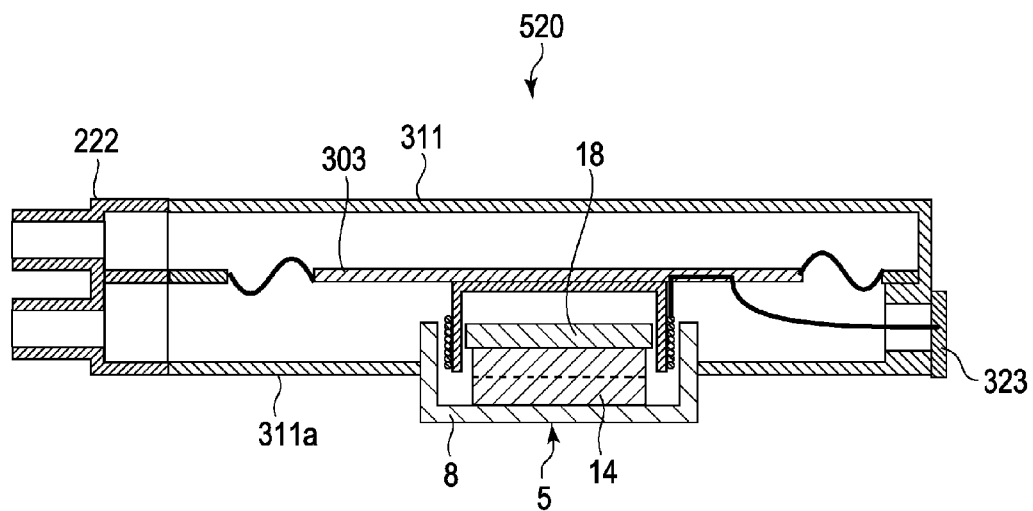
FIG. 85 is a cross-sectional view of a jet flow generating device according to yet another embodiment.

FIG. 85 is a cross-sectional view illustrating a jet flow generating device according to yet another embodiment.

The actuator 5 of a jet flow generating device 520 is provided so as to protrude from a housing 311. Specifically, the yoke 8 which is a part of the actuator 5 protrudes from the under surface 311a of the housing 311. That is to say, for example, in the event that the thickness of the actuator 5 (the thickness in the vertical direction in FIG. 85) is the same thickness as the actuator 5 described so far, the thickness of the housing 311 is configured thinly. With a nozzle member 222, the thickness thereof is designed so as to match the thickness of the housing 311 thereof.

That is to say, according to such a configuration, the housing 311 is reduced as small as possible, whereby useless space can be eliminated. For example, the heat pipe 141 or the like is installed at the undersurface 311a of the housing 311, which is around the yoke 8. Also, as well as the heat pipe 141 or the like, for example, in the event that the jet flow generating device 520 is implemented in an electronic device, the parts of the electronic device and so forth can be disposed on the undersurface 311a or near the undersurface 311a. Thus, reduction in thickness regarding the electronic device can be realized.

Figure 86:
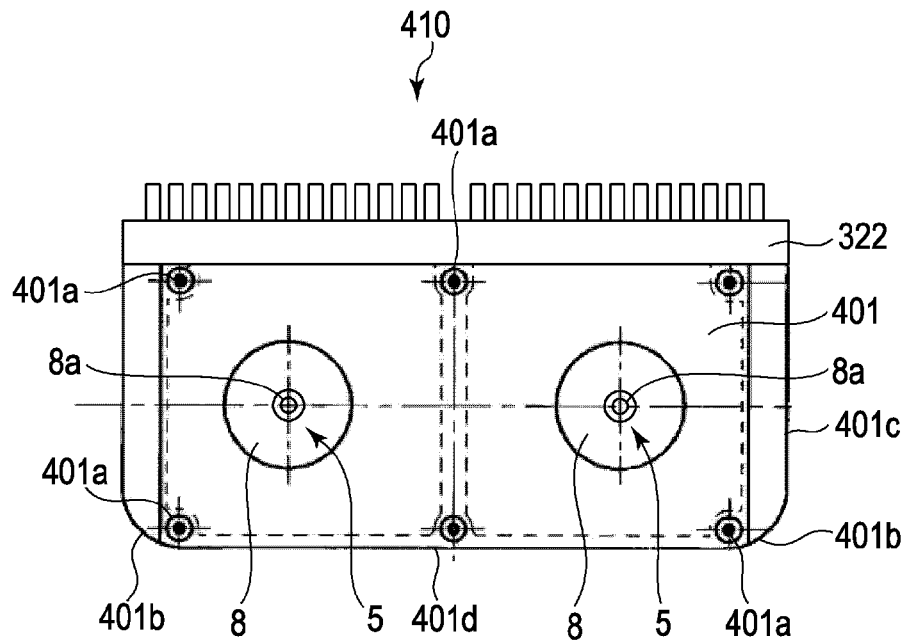
FIG. 86 is a plane view of a jet flow generating device according to yet another embodiment.

FIG. 86 is a plane view illustrating a jet flow generating device according to yet another embodiment.

A jet flow generating device 410 is, for example, tandem-type jet flow generating devices, the housing 401 thereof is provided with screw holes 401a for screw stops as fixing mechanisms. Also, the yokes 8 of the actuators 5 are also provided with screw holes 8a. For example, in the event that the jet flow generating device 410 is built in an electronic device, screw holes (not shown) are also formed in the housing of the electronic device, and screw stops can be performed by correlating the screw holes thereof with the screw holes 401a of the housing 401 of the jet flow generating device 410. Thus, work when the jet flow generating device 410 is built in the electronic device can be readily performed.

As for the fixing mechanism, as well as a screw stop mechanism, for example, an engaging mechanism made up of an engaging protrusion and an engaged groove may be employed. In this case, the engaging protrusion (or engaged groove) may be provided in the housing 401, or may be provided at the electronic device side. Also, as for the shapes of these engaging protrusion and engaged groove, various types of shape can be conceived, for example, such as a hook shape, or rail shape may be employed.

The screw holes 401a and 8a are not restricted to an embodiment wherein such tandem-type jet flow generating devices 410 are provided, and of course may be provided in the housings of all of the jet flow generating devices described above.

Also, the housing 401 includes a curved face 401b which connects the side face 401c and the rear face 401d thereof. That is to say, R is applied to the housing 401 from the side face 401c to the rear face 401d. The footprint of the housing 401 can be reduced by the worth equivalent to the amount of R. Thus, in the event that the jet flow generating device 410 is implemented in an electronic device, useless space can be eliminated, and many parts of the electronic device can be mounted, which are advantageous. Incidentally, the housing 1 of the jet flow generating device 10 shown in FIG. 1 and so forth is also applied with R at the rear side.

Figure 87:
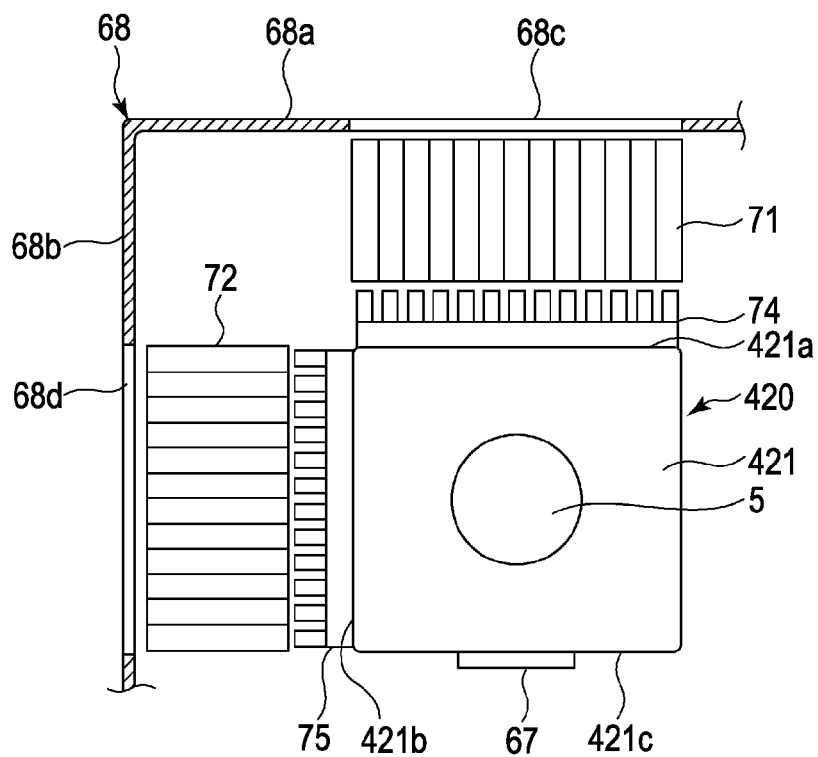
FIG. 87 is a plane view of a jet flow generating device according to yet another embodiment, and a part of housing of an electronic device.

FIG. 87 is a plane view illustrating a jet flow generating device according to yet another embodiment, and part of the housing of an electronic device.

Figure 88:
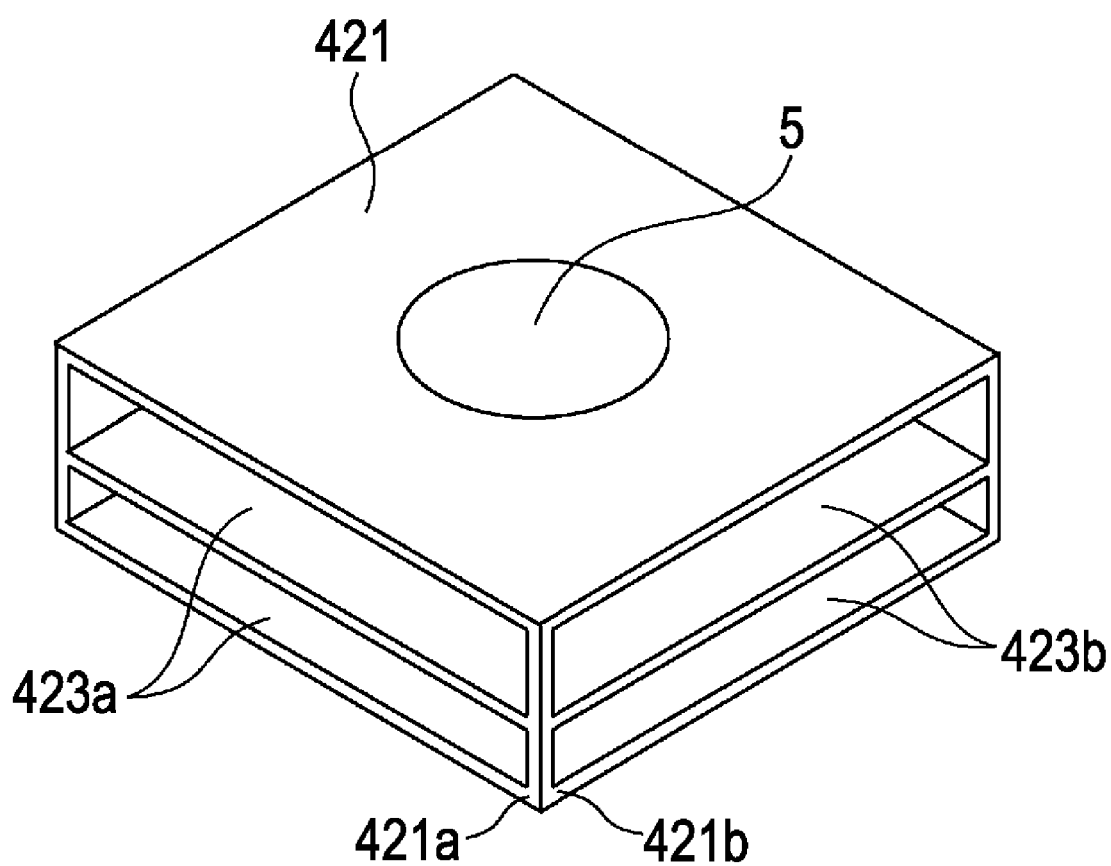
FIG. 88 is a perspective view of the housing shown in FIG. 87.

A jet flow generating device 420 includes a rectangular-parallelepiped housing 421, for example. FIG. 88 is a perspective view illustrating the housing 421 thereof. A first opening 423a and a second opening 423b are formed on a first side face 421a and a second side face 421b of the housing 421, respectively. The housing 421 is formed in a rectangular-parallelepiped shape, so the opening faces of the openings 423a and 423b have a different angle, i.e., differ generally by 90 degrees. As shown in FIG. 87, a nozzle member 74 is mounted on the first side face 421a of the housing 421. Also, a nozzle member 75 is mounted on the second side face 421b. The nozzle members 74 and 75 have generally the same configuration, and have generally the same configuration as the nozzle member 322 shown in FIG. 65. A circuit board 67 configured to drive the actuator 5 is installed on another side face 421c of the housing 421.

The air discharged from the nozzle members 74 and 75 becomes a synthesis jet flow, and is supplied to each of the heat sinks 71 and 72 serving as a first heat-generating member and a second heat-generating member. The present embodiment is effective particularly in a case wherein the jet flow generating device 421, and the heat sinks 71 and 72 are disposed around the corner of the housing 68 of an electronic device. Specifically, the heat sink 71 is disposed near a first air outlet 68c formed in the first side face 68a of the housing 68, and the heat sink 72 is disposed near a second air outlet 68d formed in the second side face 68b. According to such a configuration, the air having heat flowed out from the heat sinks 71 and 72 is discharged from both the air outlets 68c and 69d, whereby heat can be radiated effectively.

Note that each of the first and second heat-generating members is not restricted to a heat sink, and rather may be anything such as a motor, an integrated circuit, or another electronic part as long as it generates heat.

Figure 89:
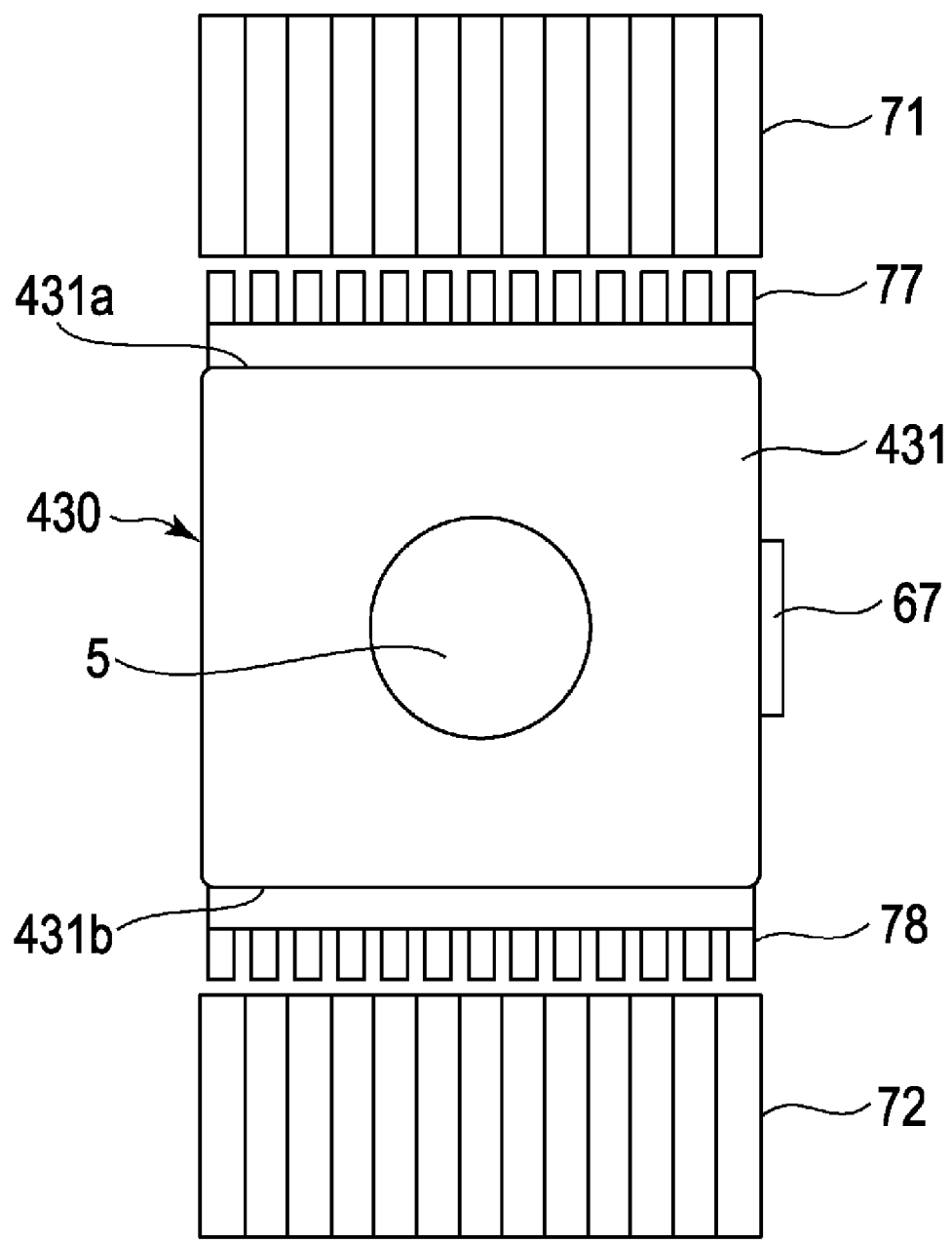
FIG. 89 is a diagram illustrating a modification of the form shown in FIG. 87.

FIG. 89 illustrates a modification of the embodiment shown in FIG. 87. With this jet flow generating device 430, a first side face 431a and a second side face 431b of the housing 431 thereof are mounted with nozzle members 77 and 78, respectively. The housing 431, as with the embodiment shown in FIG. 87, a first unshown opening face is provided in the first side face 431a, and a second opening face is provided in the second side face 431b. Thus, the first and second opening faces may be generally in parallel.

Note that the housing 421 of the jet flow generating device and so forth shown in FIG. 87 and FIG. 89 are rectangular-parallelepiped shapes, but they may be a pillar, an elliptic cylinder, a polygon pillar, or a combined shape of at least the two of these. In this case, nozzle members may be mounted on the multiple side faces of which the angles differ, of the housing.

Figure 90:
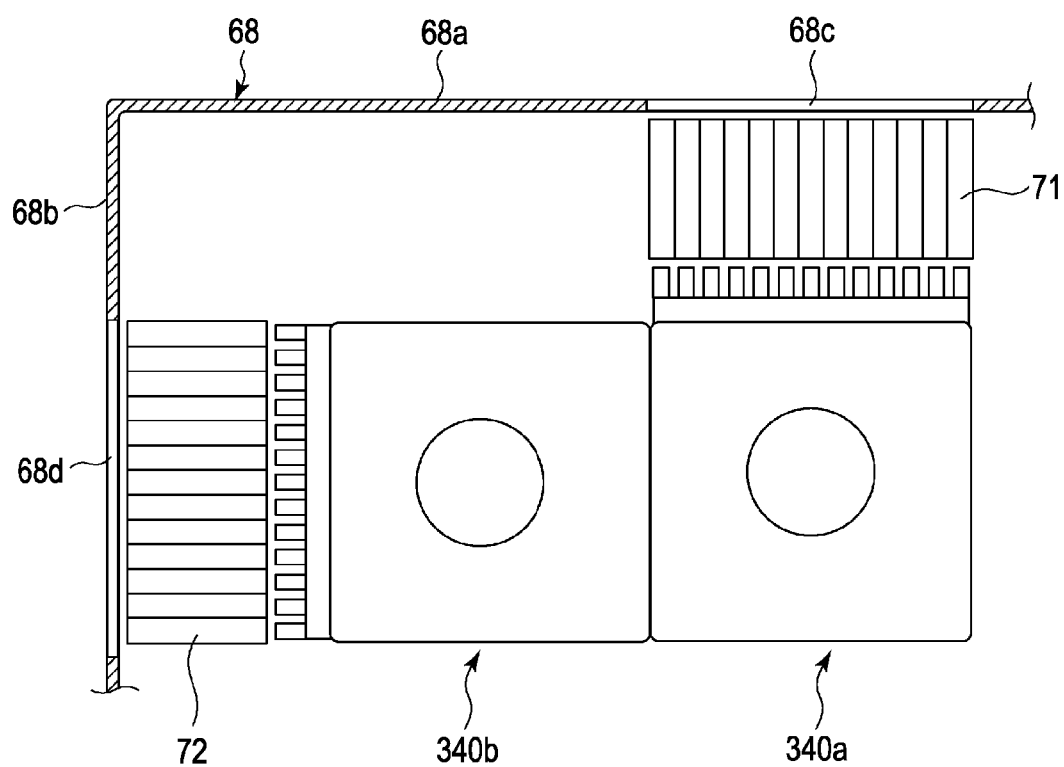

FIG. 90 is a plane view illustrating part of the inside of an electronic device in which multiple jet flow generating devices are built in.

With this example, jet flow generating devices 340a and 340b having the same configuration are disposed in a different direction within the housing 68 of an electronic device. The synthesis jet flow generated by the jet flow generating device 340a is supplied to a heat sink 71, and the air having heat is discharged via the air outlet 68e. Also, the synthesis jet flow generated by the jet flow generating device 340b is supplied to a heat sink 72, and the air having heat is discharged via the air outlet 68d. Thus, the multiple jet flow generating devices are disposed such that air is discharged in a different direction in accordance with the shape of the housing 68 of the electronic device, and the layout of unshown electronic parts and so forth within the housing 68.

Figure 91:
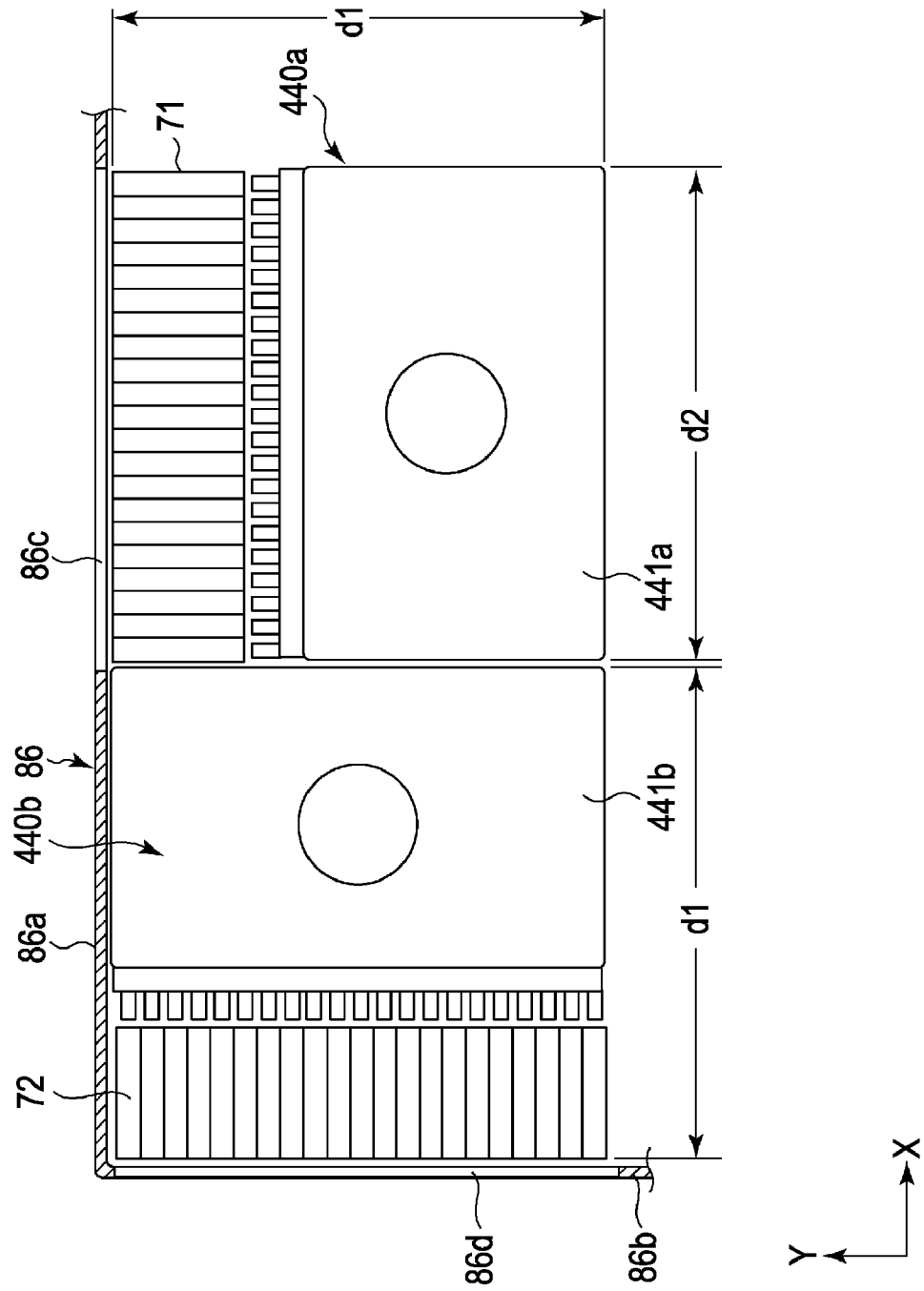
FIG. 91 is a diagram illustrating a modification of the form shown in FIG. 90.

FIG. 91 illustrates a modification of the embodiment shown in FIG. 90.

Jet flow generating devices 440a and 440b have the same configuration, and the plane shapes of the housings 441a and 441b thereof are rectangles. Heat sinks 71 and 72 are each disposed around air outlets 86c and 86d of the housing 86 of an electronic device. The heat sinks 71 and 72 have the same configuration. A length d1 obtained by adding the length of the y direction of the heat sink 71, to the length of the y direction of the jet flow generating device 440a, and a length d2 obtained by adding the length of the Y direction of the heat sink 72, to the length of the X direction of the jet flow generating device 440b are designed so as to become generally equal. Thus, the plane shape of the overall of both the heat sink 71 and the jet flow generating device 440a is generally a square, whereby useless space present at the corner of the housing 68 of the electronic device can be eliminated, as shown in FIG. 90.

Figure 92:
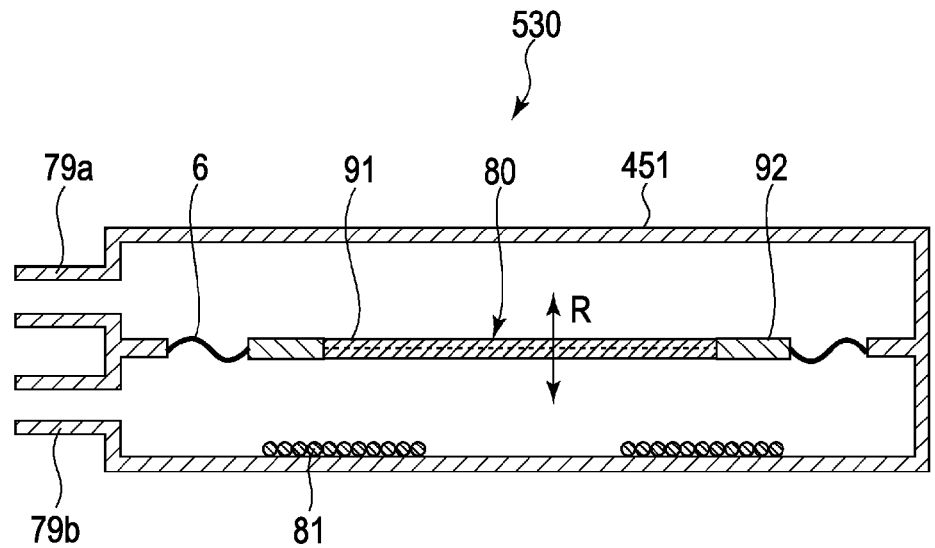
FIG. 92 is a cross-sectional view of a jet flow generating device according to yet another form.

FIG. 92 is a cross-sectional view illustrating a jet flow generating device according to yet another embodiment.

A jet flow generating device 530 includes a vibrating plate 80 having a magnet 91. The vibrating plate 80 is supported by an elastic supporting member 6 as to a housing 451, and a coil 81 is disposed at the bottom within the housing 451. The vibrating plate 80 is configured by the plate-shaped magnet 91 being implemented in an annular member 92 made up of metal or resin, for example. In this case, the metal is preferably a nonmagnetic substance, but is not restricted to a nonmagnetic substance, and rather may be a magnetic substance. The magnet 91 is magnetized in an R direction which is a vibrating direction, for example. Also, the housing 451 is provided with nozzles 79a and 79b which discharge air. The coil 81 is configured, for example, by one conductor wire being wound, and as for the coil 81, the plane coil 29 such as shown in FIG. 37 is employed, for example.

The direction of the magnetic field generated by the coil 81 is changed by changing the direction of an electric current to flow into the coil 81. The vibrating plate 80 is vibrated by repeating repulsion and suction as to the magnetic field of the magnet 91, as the magnetic field generated by the coil 81 changes in direction. According to such a configuration, the portion moved due to the vibration is the vibrating plate 80 alone, i.e., the thickness of the actuator can be reduced, whereby reduction in thickness regarding the jet flow generating device 530 can be realized.

Though only the one coil 81 is provided in FIG. 92, the multiple coils 81 may be provided. Also, in this case, multiple magnets may be provided so as to correspond to the multiple coils 81.

Figure 93:
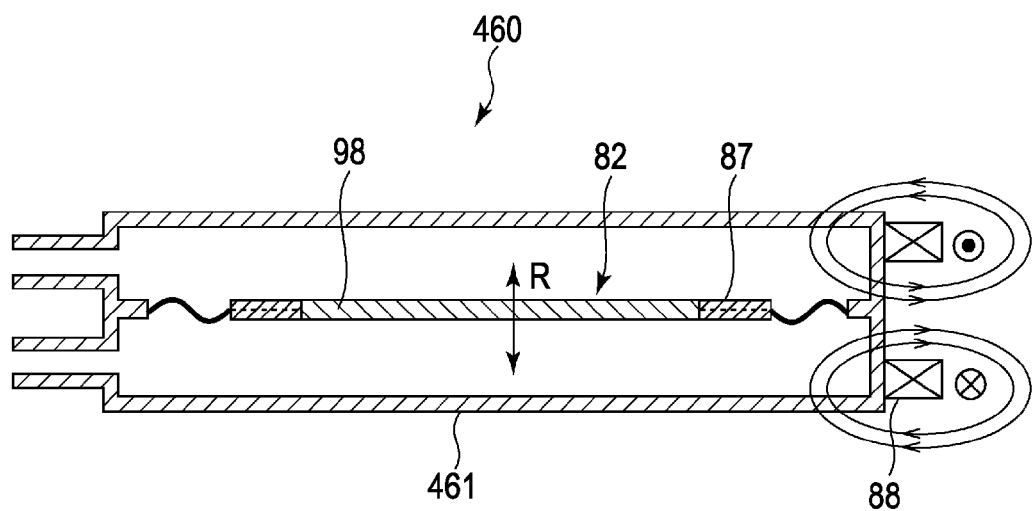
FIG. 93 is a cross-sectional view illustrating a part of a jet flow generating device according to yet another embodiment.

FIG. 93 is a cross-sectional view illustrating a part of a jet flow generating device according to yet another embodiment.

A jet flow generating device 460 includes a vibrating plate 82 including a magnet 87. With the vibrating plate 82, for example, the magnet 87 is implemented around a plate 98 made up of metal or resin at the center. The magnet 87 is, for example, an annular shape, and is magnetized in the vibrating direction R.

Figure 94:
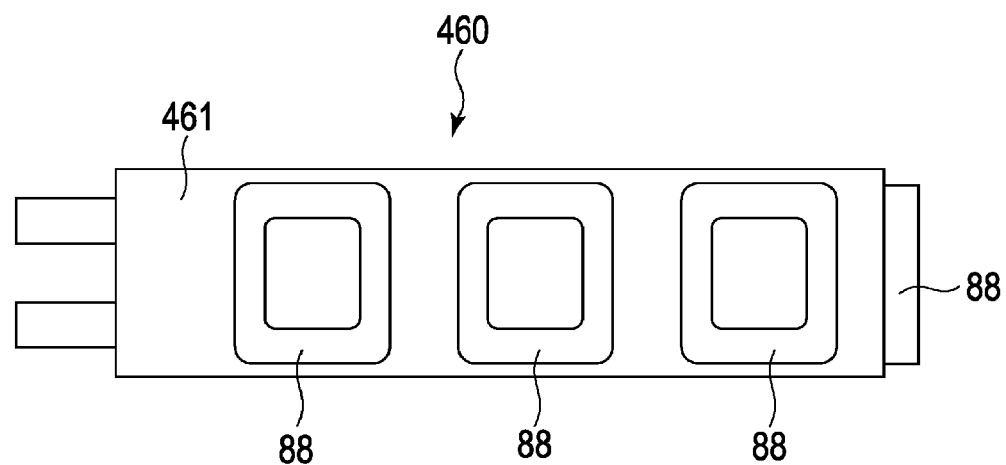
FIG. 94 is a side view of the jet flow generating device shown in FIG. 93.

As shown in FIG. 93, coils 88 are mounted on the outer circumference of the housing 461. Specifically, for example, as shown in FIG. 94, the multiple coils 88 are mounted on the side face of the outer circumference of the housing 461. The number of coils 88 can be set arbitrarily as appropriate. The coils 88 are not restricted to such an embodiment, and rather one coil may be configured by one conductor wire being wound around the outer circumference of the housing 461 with the vibrating direction R of the vibrating plate 82 as an axis. With the present embodiment, for example, an alternating current which flows into the coils 88 is rectified, whereby the vibrating plate 82 is vibrated by being absorbed cyclically in one direction of upward or downward directions, or repulsed.

Thus, the coils 88 are disposed outside the housing 461, whereby the amplitude of the vibrating plate 82 can be increased without interference between the vibrating plate 82 and the coils 88. Accordingly, the discharge amount of gas can be increased. Also, the portion which is moved due to vibration is not the coils but the magnet, which eliminates the necessity of a feeder line in the case of the coils moving, and also eliminates concern of line breakage after the jet flow generating device is used for years. Further, the resistance of an air flow generated within the housing 461 decreases, and also noise is suppressed.

Figure 95:
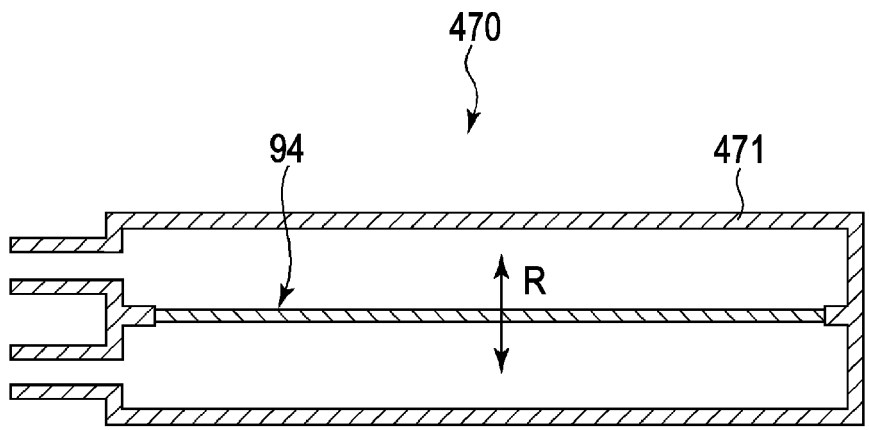
FIG. 95 is a cross-sectional view of a jet flow generating device according to yet another form.

FIG. 95 is a cross-sectional view illustrating a jet flow generating device according to yet another embodiment.

A jet flow generating device 470 is configured such that a vibrating plate 94 including a piezoelectric member is disposed within a housing 471. The vibrating plate 94 is namely a piezoelectric element. Examples of a piezoelectric element include a layered type configured by an electrode plate and a piezoelectric member being layered, a bimorph type, and a uni-morph type. The vibrating plate 94 is vibrated by AC voltage being applied to the piezoelectric element. Thus, reduction in thickness regarding the jet flow generating device 470 can be realized.

Figure 96:
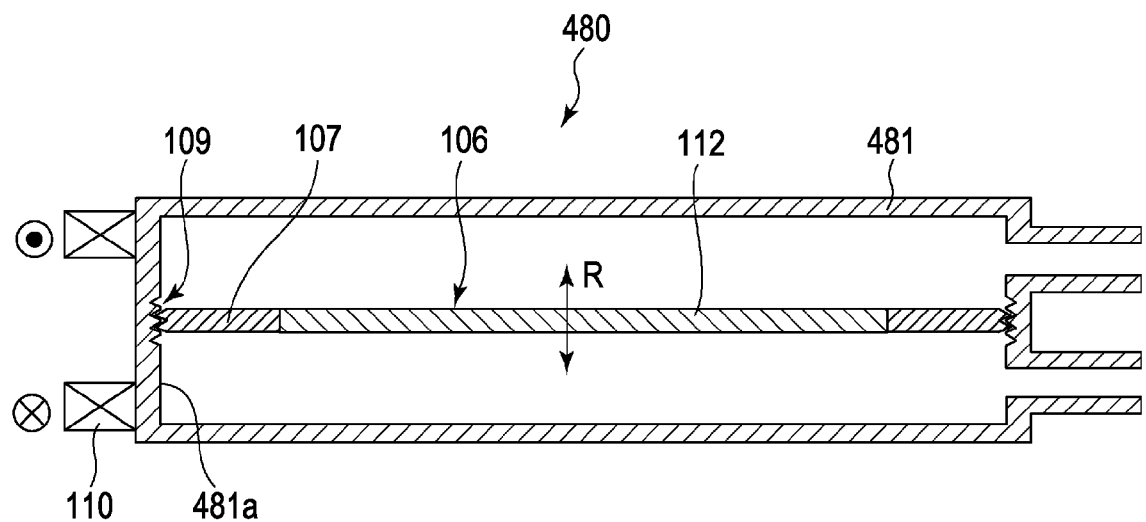
FIG. 96 is a cross-sectional view illustrating a part of a jet flow generating device according to yet another embodiment.

FIG. 96 is a cross-sectional view illustrating a part of a jet flow generating device according to yet another embodiment.

Figure 97:
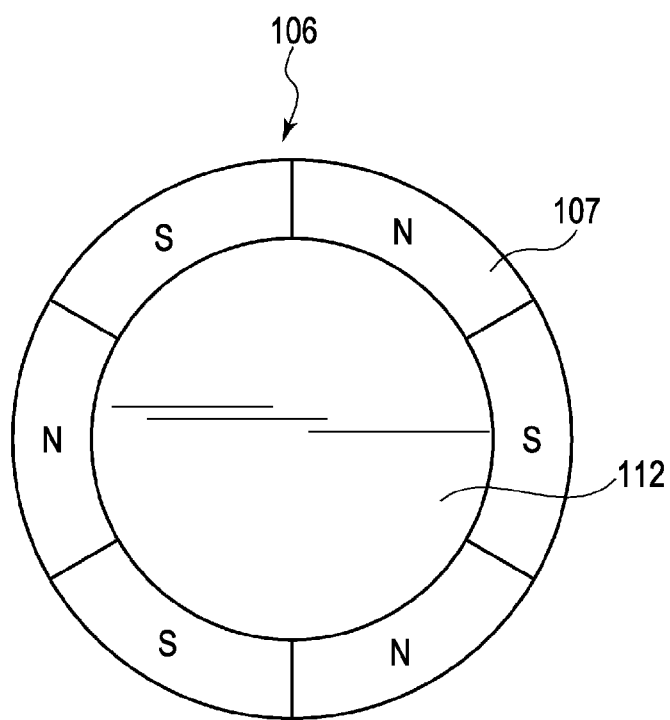
FIG. 97 is a plane view of the vibrating plate shown in FIG. 96.

A jet flow generating device 480 includes a vibrating plate 106 having a magnet 107. Coils 110 are mounted at the outer circumference of a housing 481. FIG. 97 is a plane view illustrating the vibrating plate 106. The vibrating plate 106 is configured by the annular magnet 107 being implemented at the outer circumference of a plate 112 made up of metal or resin or the like. The magnetizing direction of the magnet 107 is the circumferential direction. The shape of the vibrating plate 106 is, as described above, not restricted to a circle.

A screw mechanism 109 is provided between the outer circumference of the vibrating plate 106 and the inner wall 481a of the housing 481. The screw mechanism 109 is configured, for example, by a screw thread (or a thread groove) being formed at the outer circumference of the magnet 107, and a thread groove (or a screw thread) being formed at the inner wall 481a of the housing 481.

Note that an arrangement may be conceived wherein the screw mechanism is formed neither at the magnet 107 nor at the inner wall 481a, and is configured of a ring-shaped member where a screw thread is formed, and a ring-shaped member where a thread groove is formed, and these members are fixed with the outer circumference of the magnet 107 and the inner wall 481a.

An AC electric current is applied to the coils 110, whereby torque is applied to the magnet 107 so as to rotate within the plane thereof due to electromagnetic induction. Upon torque being applied to the magnet 107, the screw mechanism 109 transforms the torque thereof into force in the vertical direction, and thus, the vibrating plate 106 is vibrated in the vibrating direction R. Even with such a configuration, reduction in thickness regarding the jet flow generating device 480 can be realized.

Figure 98:
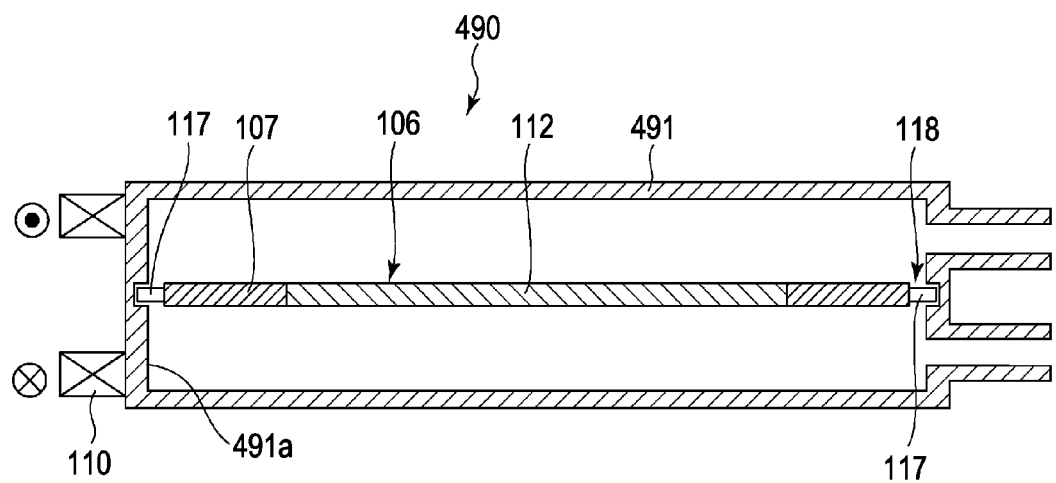
FIG. 98 is a cross-sectional view illustrating a part of a jet flow generating device according to yet another form.

FIG. 98 is a cross-sectional view illustrating a part of a jet flow generating device according to yet another embodiment.

Figure 99:
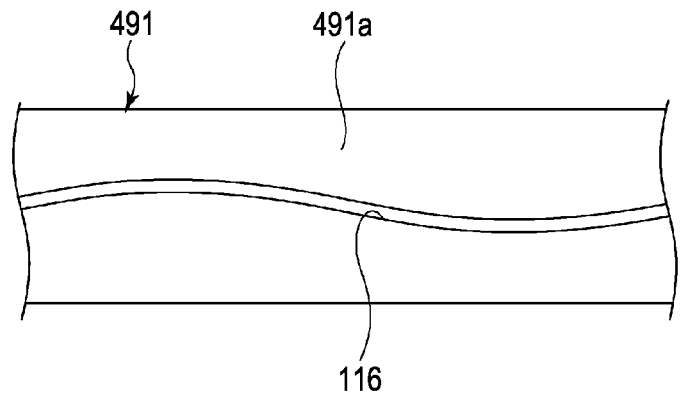
FIG. 99 is a diagram illustrating a part of the inner wall of the housing of the jet flow generating device shown in FIG. 98.
Figure 100:
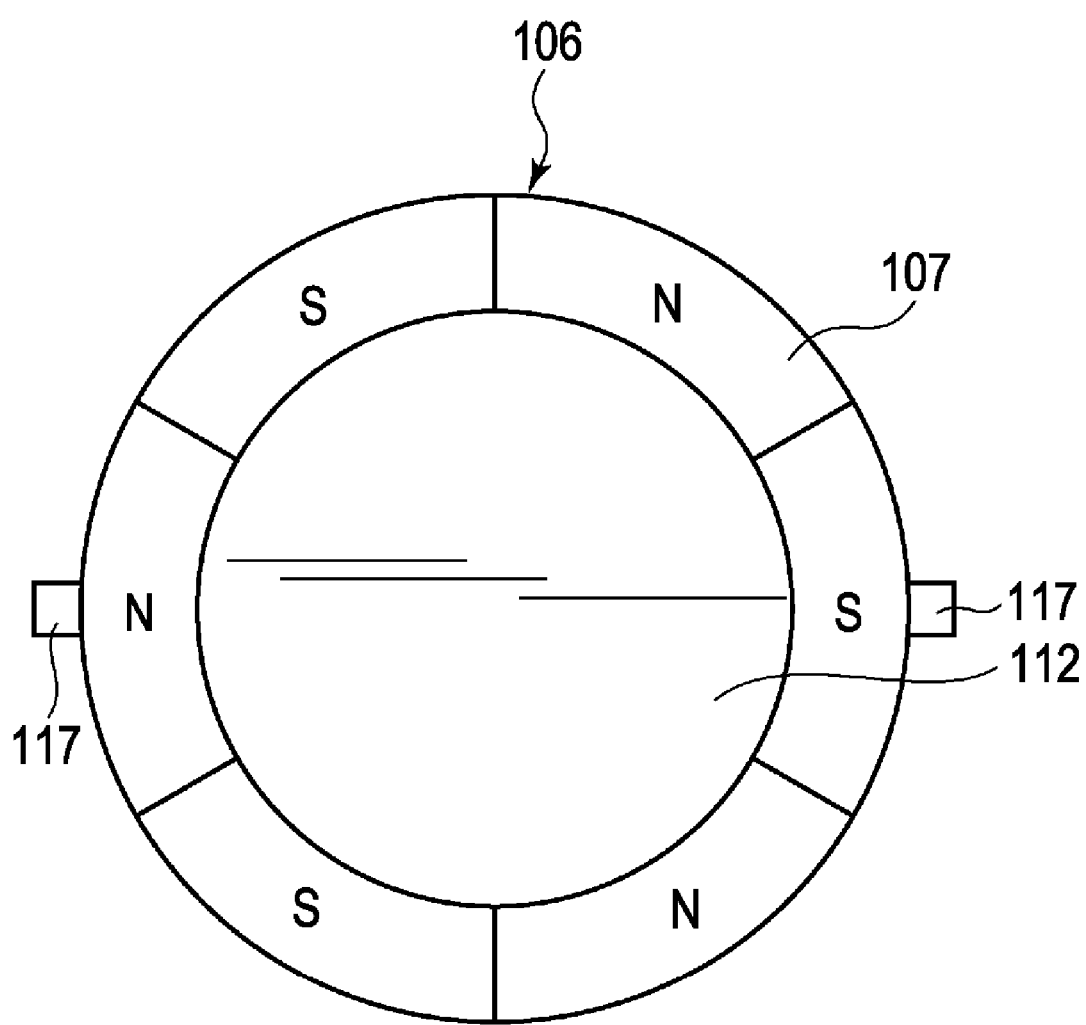
FIG. 100 is a pane view illustrating the vibrating plate of the jet flow generating device shown in FIG. 98.

A jet flow generating device 490 according to the present embodiment is provided with a cam mechanism 118 instead of the screw mechanism 109 shown in FIG. 96. FIG. 99 is a diagram illustrating part of the inner wall of the housing 491 of the jet flow generating device 490, and FIG. 100 is a plane view illustrating the vibrating plate 106. A cam groove 116 is formed on generally the overall of circumference of the inner wall 491a of the housing 491. The cam groove 116 is, for example, formed in a wave shape. The outer circumference of the vibrating plate 106 is provided with multiple protrusions 117 which are engaged with the cam groove 116. The number, shape, and size regarding the protrusions 117 are not restricted to the two shown in FIG. 100, and rather any number, shape, and size may be employed so as to vibrate the vibrating plate 106 smoothly.

According to the cam mechanism 118, the rotation movement of the magnet 107 is transformed into vibration movement in the R direction of the vibrating plate 106. Even with such a configuration, reduction in thickness regarding the jet flow generating device 490 can be realized.

Figure 101:
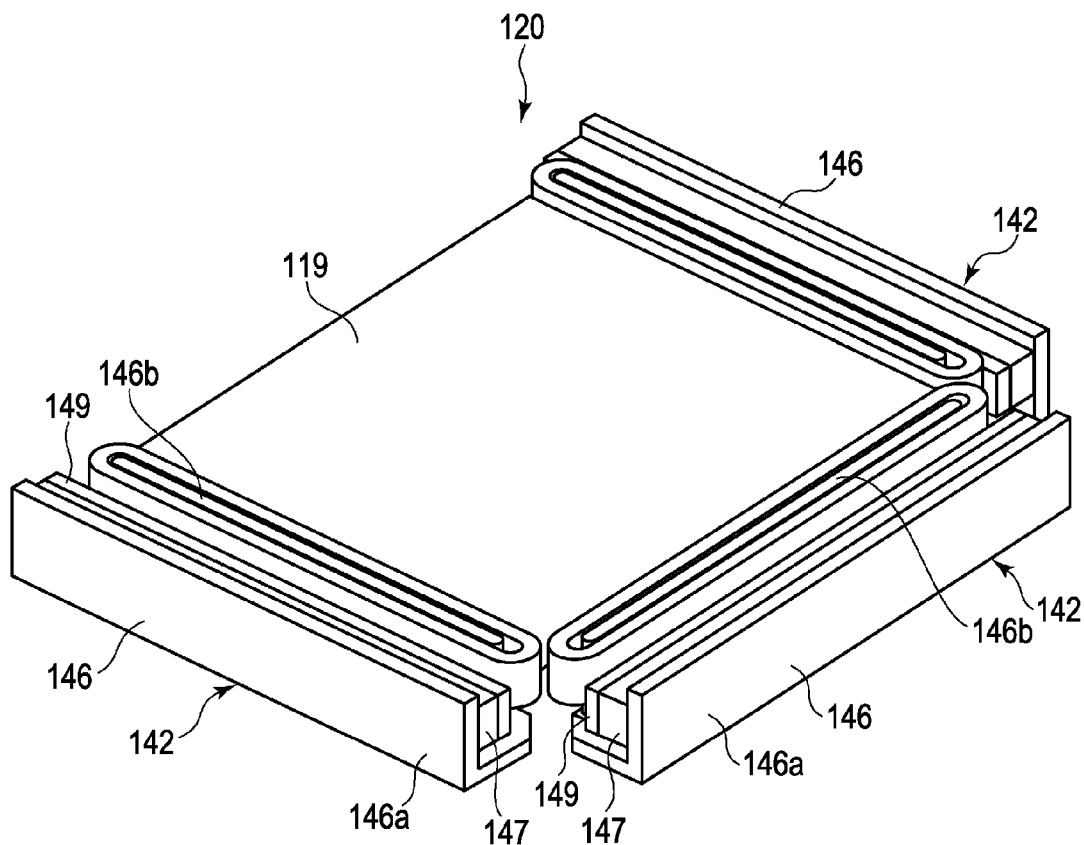
FIG. 101 is a perspective view illustrating a vibrating plate according to yet another form.

FIG. 101 is a perspective view illustrating a vibrating device according to yet another embodiment.

Figure 102:
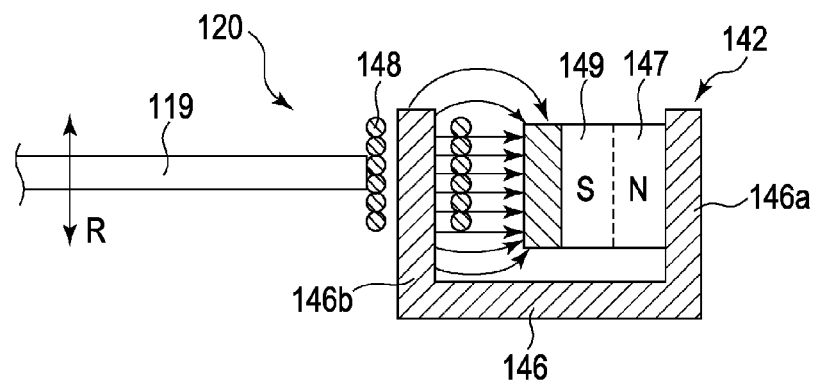
FIG. 102 is a cross-sectional view illustrating the configuration of the actuator shown in FIG. 101.

With this vibrating device 120, actuators 142 are disposed around a vibrating plate 119. The plane shape of the vibrating plate 119 is, for example, a rectangle, and the three actuators 142 are provided for example, which are provided at the three sides of the four sides of the vibrating plate 119. FIG. 102 is a cross-sectional view illustrating the configuration of the actuator 142. The actuator 142 includes a long picture-like outer yoke 146 having a groove, a long picture-like and plate-shaped inner yoke 149 disposed within the groove of the outer yoke 146, and a coil 148 mounted at the circumference of the magnet 147 and the vibrating plate 119 disposed between the outer yoke 146 and the inner yoke 149. The magnet 147 is disposed on the outside wall 146a of the outer yoke 146, and the coil 148 is disposed at the inside wall 146b side facing the outside wall 146a thereof. The magnet 147 is magnetized in the direction from the center to the outer circumferential side of the vibrating plate 119 along the face generally perpendicular to the vibrating direction R of the vibrating plate 119.

Note that with the present embodiment, the three actuators 142 are provided, but the outside wall 146a of the outer yoke 146, and the inner yoke 147 may be configured so as to be consecutively provided over all the circumferences of the vibrating plate 119 without a break. The number of the actuators 142 is not restricted to three, and may be two or four or more. The number of the sides of the vibrating plate is also changed depending on the plane shape of the vibrating plate, whereby the number of the actuators 142 can be changed depending on the number of the sides thereof as appropriate.

With such a configuration, the magnetic field is generated from the inner yoke 149 to the outer yoke 146. AC electric current is applied to the coil 148, whereby the vibrating plate 119 is vibrated in the R direction. With the present embodiment, the actuators 146 are disposed around the vibrating plate 119, whereby reduction in thickness regarding the vibrating device 120 can be realized.

Figure 103:
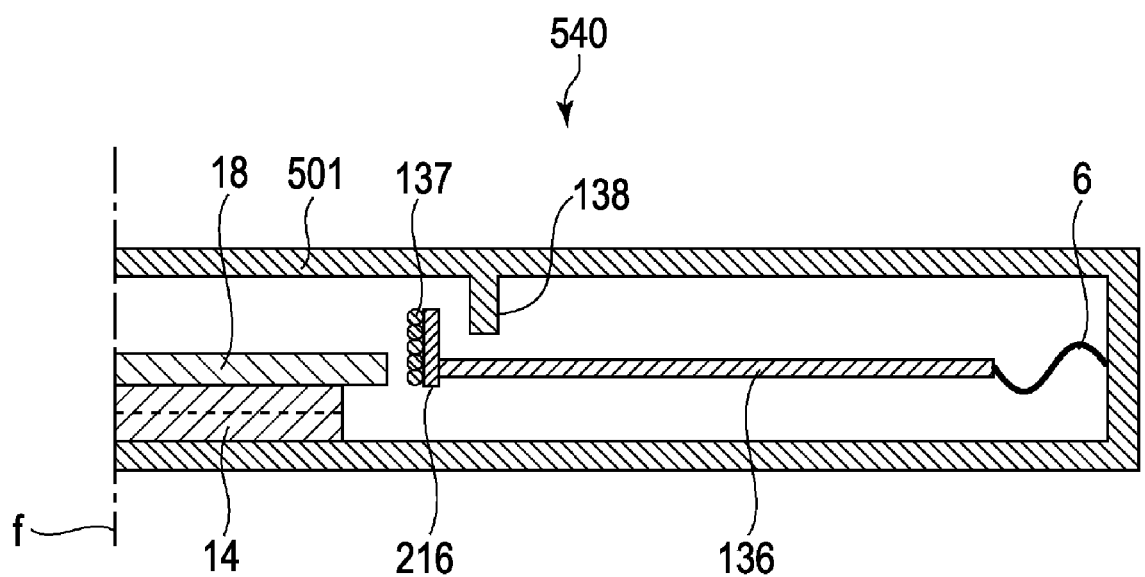
FIG. 103 is a cross-sectional view illustrating a part of a jet flow generating device according to yet another form.

FIG. 103 is a cross-sectional view illustrating a part of a jet flow generating device according to yet another embodiment. This FIG. 103 illustrates only the right side from a center line f.

The housing 501 of the jet flow generating device 540 is made up of a magnetic substance. A magnet 14 is installed at the bottom within the housing 501, and a plate-shaped yoke 18 is fixed with the magnet 14. A wall 138 made up of a magnetic substance is erected on the top of the housing 501, and this wall 138 is part of a yoke. A coil disposed so as to across the magnetic field formed from the plate-shaped yoke 18 to the wall 138 is wound around a barrel-shaped coil bobbin 216. A vibrating plate 136 is implemented in the coil bobbin 216, and the vibrating plate is supported by the elastic supporting member 6. Thus, a yoke is configured by the plate-shaped yoke 18, wall 138, and housing 501, whereby reduction in thickness regarding an actuator and the jet flow generating device 540 can be realized.

The present invention is not restricted to the above-mentioned embodiments, and various modifications can be applied thereto.

For example, the jet flow generating devices shown in each of the above-mentioned drawings, or the jet flow generating device in which each of the vibrating devices shown in each of the above-mentioned drawings is implemented, can be employed as means configured to supply the fuel of a fuel cell. Specifically, it is necessary to dispose the oxygen (air) suction inlet of a fuel cell itself, and the nozzles of the jet flow generating device so as to face both. According to such a configuration, a jet flow air discharged from the jet flow generating device is inhaled from the suction inlet as an oxygen fuel.

Also, of the vibrating devices shown in the above-mentioned embodiments, the feature portions of at least two vibrating devices can be combined as appropriate. This can be applied to jet flow generating devices.

The invention claimed is:

1. A vibrating device configured to vibrate gas included in a housing so as to discharge said gas via an opening included in said housing as a pulsating flow, comprising:
   a frame;
   a vibrating member including a vibrating plate having a face generally perpendicular to a vibrating direction, the vibrating member including a side plate extending from the vibrating plate, the side plate being in sliding contact with the frame during vibration to prevent sideways rocking of the vibrating member, the vibrating member being supported by said frame so as to displace relative to the frame; and
   a driving unit configured to drive said vibrating member, the driving unit surrounding the vibrating member such that the vibrating device is reduced in thickness.

2. The vibrating device according to claim 1, wherein the side plate and the frame are separated by a gap, the gap being sufficiently narrow to eliminate the communication of air between a front face and a rear face side of the vibrating member.

3. The vibrating device according to claim 2, wherein the vibrating member includes a rib member connected to between said vibrating plate and said side plate, the vibrating member including a hole in the rib member.

4. The vibrating device according to claim 2, wherein said side plate is installed upright at one side in said vibrating direction of said vibrating plate;
   and wherein said driving unit includes an actuator configured to vibrate said vibrating member, which is disposed at said one side.

5. The vibrating device according to claim 1, wherein said vibrating member includes a hole in said side plate.

6. The vibrating device according to claim 1, wherein the vibrating device further includes (a) a first elastic supporting member configured to support the vibrating member, the first elastic supporting member being disposed between the frame and the side plate so as not to circulate the gas from one side of the vibrating direction of the vibrating plate to an opposite side thereof, and (b) a second elastic supporting member configured to support the vibrating member, the second elastic supporting member being disposed between said frame and said side plate so as to be arrayed in a line with said first elastic supporting member generally in said vibrating direction.

7. The vibrating device according to claim 1, wherein said vibrating member is made up of a resin, paper, or metal.

8. The vibrating device according to claim 1, wherein said face is made up of a circle, an ellipse, a polygon, or an angle round shape.

9. A jet flow generating device comprising:
   a frame;
   a vibrating member including a vibrating plate having a face generally perpendicular to a vibrating direction, the vibrating member including a side plate extending from the vibrating plate, the side plate being in sliding contact with the frame during vibration to prevent sideways rocking of the vibrating member, the vibrating member being supported by said frame so as to displace relative to the frame;
   a housing including an opening, configured to support said frame, and also in which gas is included; and
   a driving unit configured to discharge said gas via said opening as a pulsating flow by driving said vibrating member to apply vibration to said gas, the driving unit surrounding the vibrating member such that the vibrating device is reduced in thickness.

10. The vibrating device according to claim 9, wherein the side plate and the frame are separated by a gap, the gap being sufficiently narrow to eliminate the communication of air between a front face and a rear face side of the vibrating member.

11. The jet flow generating device according to claim 9, wherein part of said housing is configured of said frame, and the frame is made up of metal.

12. The jet flow generating device according to claim 11, wherein the vibrating device further includes (a) a first elastic supporting member configured to support the vibrating member, the first elastic supporting member being disposed between the frame and the side plate so as not to circulate the gas from one side of the vibrating direction of the vibrating plate to an opposite side thereof, and (b) a second elastic supporting member configured to support the vibrating member, the second elastic supporting member being disposed between said frame and said side plate so as to be arrayed in a line with said first elastic supporting member generally in said vibrating direction.

13. The jet flow generating device according to claim 9, wherein said housing is made up of a resin, rubber, metal, a magnetic material, or ceramics.

14. The jet flow generating device according to claim 9, wherein said housing is generally in parallel with said face of said vibrating plate, and includes a face of which the shape is similar to said face.

15. The jet flow generating device according to claim 9, wherein said frame includes an air communication opening configured to circulate said gas, which faces said opening.

16. The jet flow generating device according to claim 9, further comprising:
   a nozzle member including a conduit of said gas to be communicated to said opening, mounted on said housing.

17. The jet flow generating device according to claim 9, wherein said housing includes an outer face including a first face, a second face, a curved face configured to connect between said first face and said second face.

18. A jet flow generating device comprising:
   a vibrating member including a vibrating plate having a face generally perpendicular to a vibrating direction, the vibrating member including a side plate extending from the vibrating plate, the side plate being in sliding contact with the frame during vibration to prevent sideways rocking of the vibrating member;
   a housing including an opening, the housing configured to support said vibrating member therein;
   gas within said housing; and
   a driving unit configured to discharge said gas via said opening as a pulsating flow by driving said vibrating member to apply vibration to said gas, the driving unit surrounding the vibrating member such that the vibrating device is reduced in thickness.

19. The jet flow generating device according to claim 18, wherein the side plate and the frame are separated by a gap, the gap being sufficiently narrow to eliminate the communication of air between a front face and a rear face side of the vibrating member.

* * * * *